US008629389B2

(12) United States Patent
Barrows

(10) Patent No.: US 8,629,389 B2
(45) Date of Patent: Jan. 14, 2014

(54) LOW PROFILE CAMERA AND VISION SENSOR

(76) Inventor: Geoffrey Louis Barrows, Washington, DC (US)

(*) Notice: Subject to any disclaimer, the term of this patent is extended or adjusted under 35 U.S.C. 154(b) by 164 days.

(21) Appl. No.: 13/048,379

(22) Filed: Mar. 15, 2011

(65) Prior Publication Data

US 2011/0204209 A1 Aug. 25, 2011

Related U.S. Application Data

(63) Continuation-in-part of application No. 12/710,073, filed on Feb. 22, 2010.

(60) Provisional application No. 61/229,312, filed on Jul. 29, 2009, provisional application No. 61/314,685, filed on Mar. 17, 2010, provisional application No. 61/407,318, filed on Oct. 27, 2010.

(51) Int. Cl.
| | |
|---|---|
| H01L 27/00 | (2006.01) |
| H01L 31/00 | (2006.01) |
| G02B 13/16 | (2006.01) |
| H04N 5/225 | (2006.01) |
| H01L 27/146 | (2006.01) |

(52) U.S. Cl.
CPC ................ *H01L 27/14643* (2013.01)
USPC ............. 250/208.1; 250/214.1; 348/335; 348/340

(58) Field of Classification Search
USPC ............ 250/208.1, 214.1; 348/335, 340
See application file for complete search history.

(56) References Cited

U.S. PATENT DOCUMENTS

| 6,571,466 B1 | 6/2003 | Glenn et al. |
| 2008/0122966 A1 | 5/2008 | Feng et al. |

FOREIGN PATENT DOCUMENTS

| WO | WO-02-069618 | 9/2002 |
| WO | WO-2007-124014 | 11/2007 |
| WO | WO-2009-127907 | 10/2009 |
| WO | WO-2011-014472 | 2/2011 |
| WO | WO-2011-103603 | 8/2011 |
| WO | WO-2011-123758 | 10/2011 |

OTHER PUBLICATIONS

International Search Report for PCT/US2011/028489, mailed Sep. 27, 2011.
Written Opinion for PCT/US2011/028489, mailed Sep. 27, 2011.
International Preliminary Report on Patentability for PCT/US2011/028489, mailed Aug. 28, 2012.
International Search Report for PCT/US2010/043302, mailed Mar. 16, 2011.
Written Opinion for PCT/US2010/043302, mailed Mar. 16, 2011.

(Continued)

*Primary Examiner* — Jack Dinh
(74) *Attorney, Agent, or Firm* — White & Case LLP

(57) ABSTRACT

A monolithic camera configured for a predetermined environment can be made in the following manner. The camera is formed from an integrated circuit that has a light sensitive portion that can sense light from the predetermined environment. Two or more opaque masks are disposed within the oxide layer above the light sensitive pixel array of the image sensor. These opaque masks may be formed from the "metal" layers typically used for signal routing in image sensor integrated circuits. The opaque masks contain arrays of holes arranged so that for each pixel there is a clear path for light to reach the pixel from a corresponding part of the visual field. Each pixel is associated with a different set of holes that allows a different region of the predetermined environment to be observed.

61 Claims, 46 Drawing Sheets

(56) References Cited

OTHER PUBLICATIONS

International Preliminary Report on Patentability for PCT/US2010/043302, issued Jan. 31, 2012.
International Search Report for PCT/US2011/030900, mailed Jul. 20, 2011.
Written Opinion for PCT/US2011/030900, mailed Jul. 20, 2011.
Kerdels et al., Oceans 2008—MTS/IEEE Kobe Techno-Ocean, Apr. 8, 2008, pp. 1-7.
Kendoul et al., Robotics and Autonomous Systems, vol. 57, No. 6-7, Jun. 30, 2009, pp. 591-602.
Barrows, DIY Drones, http://diydrones.com/profiles/blogs/micro-helicopter-hovering-on, Jan. 27, 2010.
Campoy et al., Journal of Intelligent and Robotic Systems; Theory and Applications—(Incorporating Mechatronic Systems Engineering), vol. 54, No. 1-3, Aug. 7, 2008, pp. 105-135.
Corke, Journal of Robotic Systems vol. 21, No. 2, Feb. 1, 2004, pp. 43-51.
Ruffier et al., Robotics and Autonomous Systems, vol. 50, No. 4, Mar. 31, 2005, pp. 177-194.

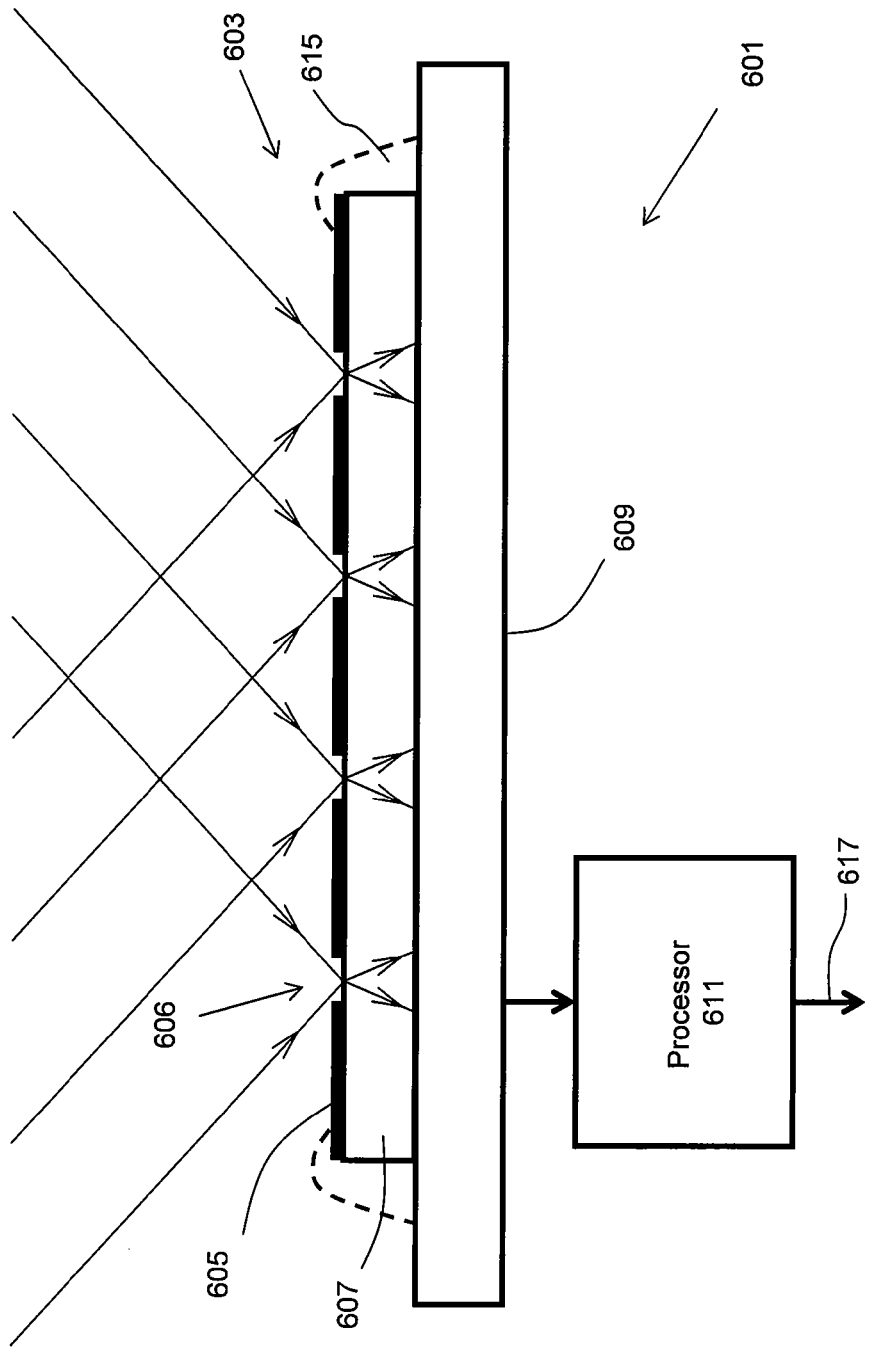

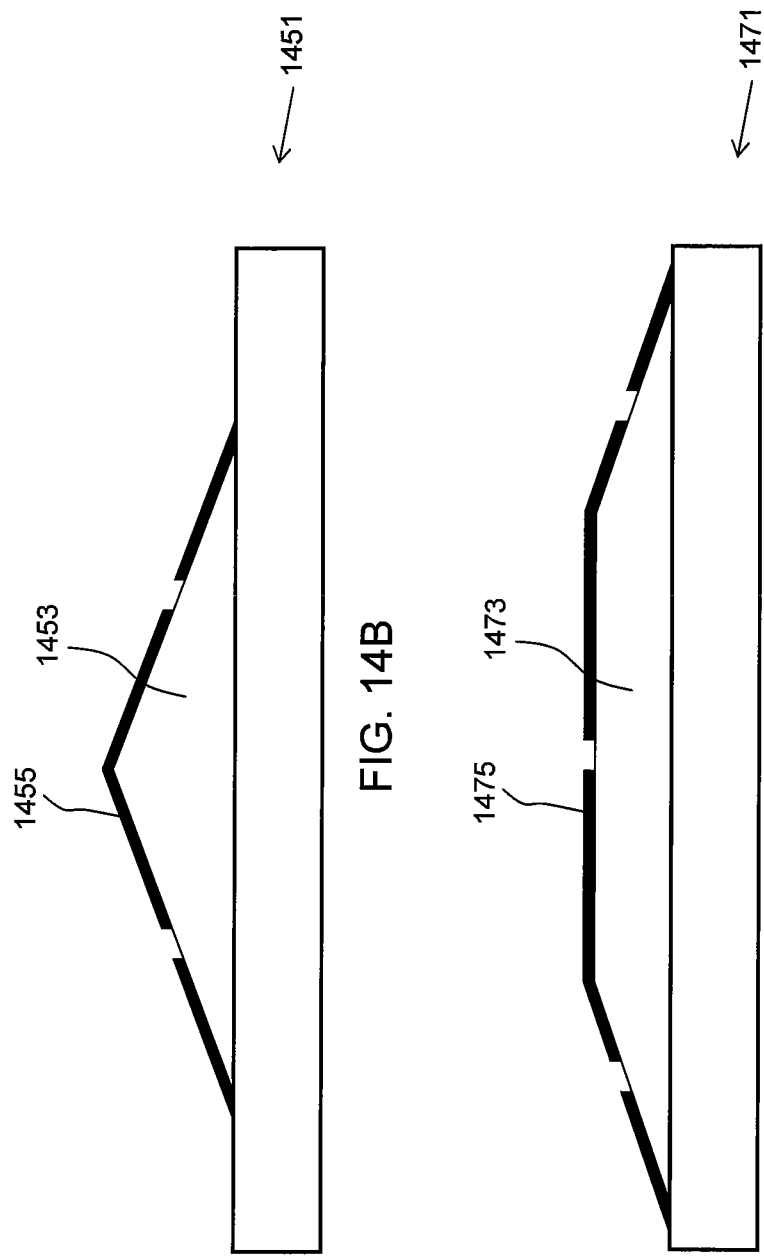

LOW PROFILE CAMERA AND VISION SENSOR

CROSS-REFERENCE TO RELATED APPLICATIONS

This application is a continuation-in-part of U.S. patent application Ser. No. 12/710,073, Feb. 22, 2010, that claims benefit to U.S. provisional patent application No. 61/229,312, filed Jul. 29, 2009. This application further claims the benefit of provisional application Nos. 61/314,685, filed Mar. 17, 2010, and 61/407,318, filed Oct. 27, 2010.

FEDERALLY SPONSORED RESEARCH

This invention was made with Government support under Contract No. W31P4Q-06-C-0290 awarded by the United States Army. The Government has certain rights in this invention.

TECHNICAL FIELD

The teachings presented herein relate to electronic cameras and electronic visual sensors.

BACKGROUND

Throughout most of the 20th century, cameras captured images on film by a photochemical process to produce pictures that represent the original scene observed by the camera. Towards the latter part of the 20th Century, solid state image sensors in the form of CCDs (charge coupled devices) and CMOS (complementary metal-oxide-semiconductor) image sensors took the place of film to enable today the ubiquitous digital camera. Digital cameras do not require film to capture images, and have the advantage of capturing images electronically that take the form of digital data which may be stored easily for later editing, processing, and printing. In some applications, the digital imagery may be sent to a computer for real-time processing in order to generate an output. These latter configurations may also be referred to as cameras as well as machine vision systems or vision sensors.

FIG. 1 depicts an exemplary generic digital camera 101. A lens 103 focuses light 105 from the environment 116 surrounding the camera 101 onto the focal plane 107 of an image sensor 109. The lens 103 is shown in the figure as a single element lens, but alternatively it may be a pinhole or it may comprise a set of lens elements and/or reflective elements, e.g. mirrors. In all such design configurations, the lens 103 (or other optics) is positioned a distance above the focal plane 107, forming cavity 117, so that light 105 is focused to form an image onto the focal plane 107. The lens 103 may be fixed to one location and a predetermined distance above the focal plane 107, or the lens 103 may be configured so that it may be moved closer or further from the focal plane 107 to bring the image into focus. An opaque enclosure 111 supports the lens 103 and ensures that the only light striking the image sensor 109 is light coming through the lens 103. The image sensor 109 may be electronically interfaced with the rest of the camera electronics via wire bonds 113 or another connection method. A processor 115, typically a microcontroller, a DSP (digital signal processor) chip, or other digital circuit extracts a digital image from the image sensor 109 based on the image formed on the focal plane 107. The digital image may be processed, stored, and/or transmitted on as an output, depending on the configuration of the camera 101 and its application.

In earlier cameras the image sensor 109 would be replaced by film, which as described above captures images photochemically. The photochemical process of "developing the film" may thus conceptually replace the function performed by the image sensor 109 and the processor 115.

While the exemplary generic digital camera 101 shown in FIG. 1 has the advantage of relative simplicity and maturity, it has several significant disadvantages. First, the enclosure 111 and mechanism for mounting the lens 103 needs to be rigid and constructed to hold the lens 103 at the desired location as well as form cavity 117. This potentially results in a bulky and heavy structure. Second, there are significant trade-offs between camera specifications such as F-stop, focal length, and field of view. These trade-offs are such that constructing a camera to have both a small F-stop (to gather large amounts of light) and a large resolution requires a lens design having multiple large lens elements disposed in a vertically stacked configuration and a heavy structure to support them, making the camera bulky and expensive to manufacture. Additional requirements that the camera have a field of view approaching 180 degrees further increases the complexity of the lens design.

FIG. 2 depicts a prior art camera 201 optimized for sensing visual motion or optical flow in one direction. This camera 201 is described at length in U.S. Pat. No. 6,194,695 incorporated herein by reference in its entirety. This camera 201 comprises an iris 203, an optional lens 205, cavity 219, a focal plane chip 207, an analog to digital converter (ADC) 209, and a digital computer 211 which generates an output 217. The iris 203 and lens 205 focus light onto the focal plane 207 in a manner that preserves visual information along one axis. The lens 205, at a predetermined distance from the focal plane 207 forming cavity 219, may be placed "out of focus" with respect to the focal plane chip 207 to optically smooth the image formed on the focal plane chip 207. The focal plane chip 207 generates photoreceptor signals 213, and the digital computer 211 contains an algorithm 215 that acquires these photoreceptor signals 213 and processes them to compute a linear optical flow measurement. This measurement forms the output 217.

The camera 201 of FIG. 2 may be simplified by removing the lens 205. In this manner, the iris 203 is effectively an elongated pinhole, which causes individual photoreceptor circuits on the focal plane chip 207 to have a rectangular response to the visual field. This causes the image focused on the focal plane chip 207 to be smoothed along the long dimension of the iris 203, which preserves information in the perpendicular direction. The photoreceptor circuits may also be shaped as elongated rectangles oriented in the same direction as the iris to increase light sensitivity, as shown in FIGS. 4A and 4B of the aforementioned U.S. Pat. No. 6,194,695.

The computer 211 generates an optical flow measurement based on the photoreceptor signals 213 and sends the optical flow measurement to the output 217. Optical flow represents the relative motion between a camera and other objects in the environment. Algorithms for measuring optical flow between two successive images are well known in the art. The output of such algorithms may be a measurement of, for example, how many pixels or fractions of a pixel the texture appeared to move between two sequential images. Sample optical flow algorithms include Srinivasan's Image Interpolation Algorithm and the Lucas Kanade algorithm, both of which are referenced below.

The camera of FIG. 2 has the same disadvantages as does the camera of FIG. 1 described above.

It is desirable to implement cameras and vision sensors that overcome some of the aforementioned disadvantages and limitations. In particular, it is desirable to have a camera structure that is able to acquire a high resolution image over a large field of view but have a shape that has a low profile and is effectively flat. FIG. 3 depicts a prior art "TOMBO" camera 301 described in U.S. Pat. No. 7,009,652 which is incorporated herein by reference in its entirety. The acronym TOMBO stands for "Thin Observation Module by Bound Optics". The camera 301 comprises a lens array 303, a restricting structure 311, and an image sensor 305. The image sensor 305 contains a pixel array 313 located at the focal plane of the lenses of lens array 303. Instead of using a single lens as shown in FIG. 1, the camera 301 of FIG. 3 utilizes lens array 303 to form an array of images on the pixel array 313. A single aperture unit 307 comprises a single lens and its corresponding set of pixels (which may be referred to as its subimage 309) on the image sensor 305, and is similar to the camera 101 of FIG. 1. Restricting structure 311 isolates adjacent aperture units and prevents light from crossing over between adjacent single aperture units. The restricting structure 311 has a predetermined thickness and forms a cavity between each individual lens element and corresponding portion of the pixel array 313 that captures a subimage. The image sensor 305 grabs the resulting subimages, which will appear as a tiling of low resolution images generated from the visual field. This tiling of images obtained by the image sensor 305 may be referred to as a "raw image" for purposes of discussion.

A processor, not shown, contains an algorithm that extracts the subimages from the pixel array 313 and reconstructs a high resolution image of the visual field. The algorithm exploits the fact that the individual subimages generated by each aperture unit are similar but not exactly the same, since each lens may be laterally offset from the pixel array 313 on the focal plane by a different sub-pixel amount. The algorithm proposed by Tanida et al. models the camera 301 as $$y = Hx \quad (1)$$

where x is a vector that represents the visual field, y is a vector that represents the raw image captured by the pixel array, and H is a matrix that models the transfer function implemented by the camera 301. The vector x may be an ideal high resolution image that would be captured by the conventional camera structure shown in FIG. 1. The purpose of the algorithm is thus to reconstruct x from raw image y. H may be determined through a combination of analytical and empirical analysis, obtaining a pseudoinverse matrix H* of the transfer function H, and computing $$x = H^* y \quad (2)$$

to reconstruct the high resolution image x representing the visual field from y.

The camera 301 shown in FIG. 3 has the advantage of being able to acquire higher resolution images from a thinner optical structure relative to that described above for FIGS. 1 and 2. For example, the light gathering ability of a single low F-stop lens is obtained instead through the distributed light gathering ability of the lens array 303. However in spite of a perceived elegance of this apparatus, it suffers from two particular disadvantages. First, the lens array 303 and restricting structure 311 are complex and may be difficult to manufacture inexpensively. It also suffers from a bulky structure. Second, the proposed method of reconstructing the high resolution image x from y requires both an accurate knowledge of the transfer function H and a significant number of computations to compute Equation (2). These weaknesses may limit the utility of the camera 301 in many practical applications.

FIG. 4 illustrates Snell's Law, a fundamental law of optics that dictates how a ray of light 401 will travel when it passes between two different transparent mediums. In FIG. 4, the ray of light 401 originates in a first medium 403, passes through a second medium 405, and exits back into the first medium 403 on the other side. Let the index of refraction of the first medium 403 be $n_1$ and the index of refraction of the second medium 405 be $n_2$. Let $\theta_1$ and $\theta_2$ be the respective angles of incidence of the ray 401 as it passes across the boundary 407 between the two mediums, as shown in the figure. The angle of incidence of a ray is defined as the angle between that ray and normal 408, with normal 408 being perpendicular to the boundary 407 between the two mediums. Snell's Law dictates that:

$$n_1 \sin\theta_1 = n_2 \sin\theta_2 \quad (3)$$

or $$\sin\theta_2 = \frac{n_1}{n_2} \sin\theta_1. \quad (4)$$

In the case of FIG. 4, the index of refraction of the second medium 405 is higher than that of the surrounding first medium 403. For example, the first medium 403 may be air while the second medium 405 may be plastic or glass. As a result, the angle $\theta_2$ will be less than $\theta_1$. One important observation is that if the second medium 405 has a higher index of refraction than the first medium 403, the value $|\sin \theta_2|$ is bounded by the value $n_1/n_2$, since $\sin \theta_1$ cannot exceed one in magnitude. As a result, $\theta_2$ cannot be larger than an angle called a critical angle, which is denoted by $\theta_c$:

$$|\theta_2| < \theta_c = \sin^{-1} \frac{n_1}{n_2} \quad (5)$$

The phenomena of the critical angle will have application in the teachings that follow. From the point of view of an observer inside the second medium, the hemisphere of visual field on the first medium's side of the boundary 407 will be compressed to a cone having an angular diameter of $2\theta_c$. This cone is often referred to as "Snell's window". This phenomena can be observed, for example, from underwater in a swimming pool by looking outward at the world above.

BRIEF DESCRIPTION OF THE DRAWINGS

The inventions claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 6A depicts a cross section of an exemplary multiple opening low profile camera;

FIG. 14B illustrates a camera where the transparent material and opaque mask have a cross section in the shape of a triangle;

FIG. 14C illustrates a camera where the transparent material and opaque mask have a cross section in the shape of a trapezoid;

DESCRIPTIONS OF EXEMPLARY EMBODIMENTS

Figure 1:
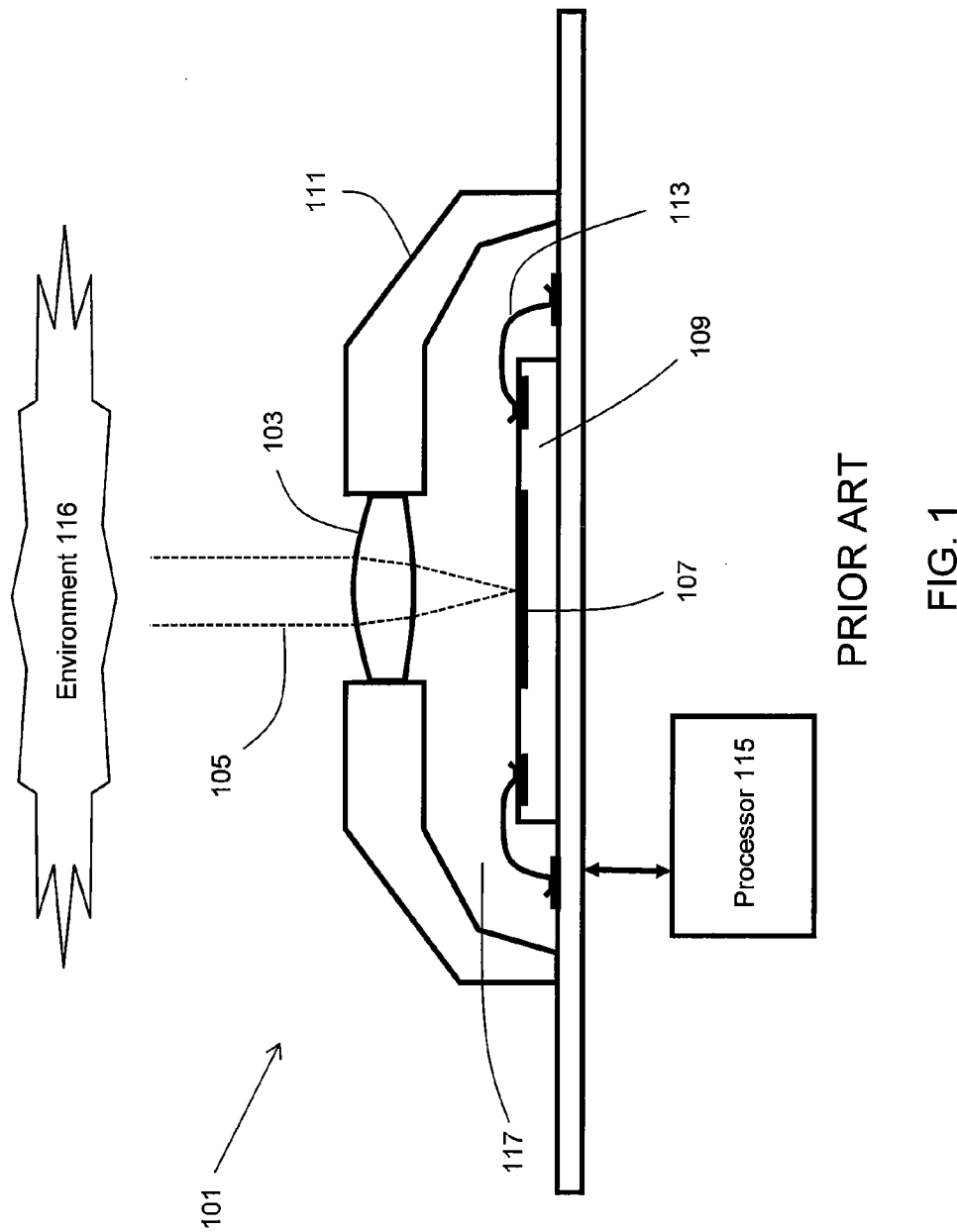
FIG. 1 depicts an exemplary generic digital camera.

The exemplary embodiments will now be described more fully hereinafter with reference to the accompanying drawings. It will be understood that when a layer is referred to as being "on" another layer or substrate, it may be directly on the other layer or substrate, or intervening layers may also be present. Further, it will be understood that when a layer is referred to as being "under" another layer, it may be directly under, or one or more intervening layers may also be present. In addition, it will also be understood that when a layer is referred to as being "between" two layers, it may be the only layer between the two layers, or one or more intervening layers may also be present. Like numbers refer to like elements throughout.

Image sensors may be implemented as semiconductor devices, for example using CCD or CMOS technology, or by other means of generating a plurality of pixel values based on a spatial pattern of light. In the following teachings, an "image sensor" may be any device or circuit from which one or more pixel values based on a pattern of light may be generated, and includes devices that respond to visible light as well as devices that respond to electromagnetic radiation other than visible light for example ultraviolet, infrared, and other electromagnetic radiation. An image sensor may be implemented using semiconductor or any other technology. An image sensor may be a separate discrete component or collection of circuits, or it may be a circuit or device embedded or integrated within a component. Similarly, "light" may refer to any electromagnetic radiation, including but not limited to visible, infrared, or ultraviolet light.

"Cameras", and the equivalent term "vision sensors", are devices that utilize image sensors and acquire information about a scene observable from the device. Generally a camera may comprise an optical structure and an image sensor, in which the optical structure is capable of forming an image on the image sensor based on the environment and the image sensor is capable of generating a plurality of signals based on the image. These signals may be "pixel values" or other signals. The term "camera" is not meant to be limited to the typical consumer or industrial picture-taking device that is typically associated with this word. For the purpose of the teachings below, a camera optionally may also include a processing circuit capable of processing the image sensor's output for any purpose. The output of a camera may be a collection of pixel values (e.g. a "picture"), or may be higher level information regarding the scene observed by the camera. Examples of such higher level information include, but are not limited to, one or more optical flow values, one or more computed range values, the presence or absence of a particular type of object as seen from the camera, and so forth. The term "camera" is not meant to be limited to the examples above but instead covers any type of device capable of sensing a scene utilizing an image sensor and optics. This includes cameras capable of observing both visual light as well as cameras capable of observing other electromagnetic radiation, including but not limited to ultraviolet and infrared radiation.

Figure 5A:
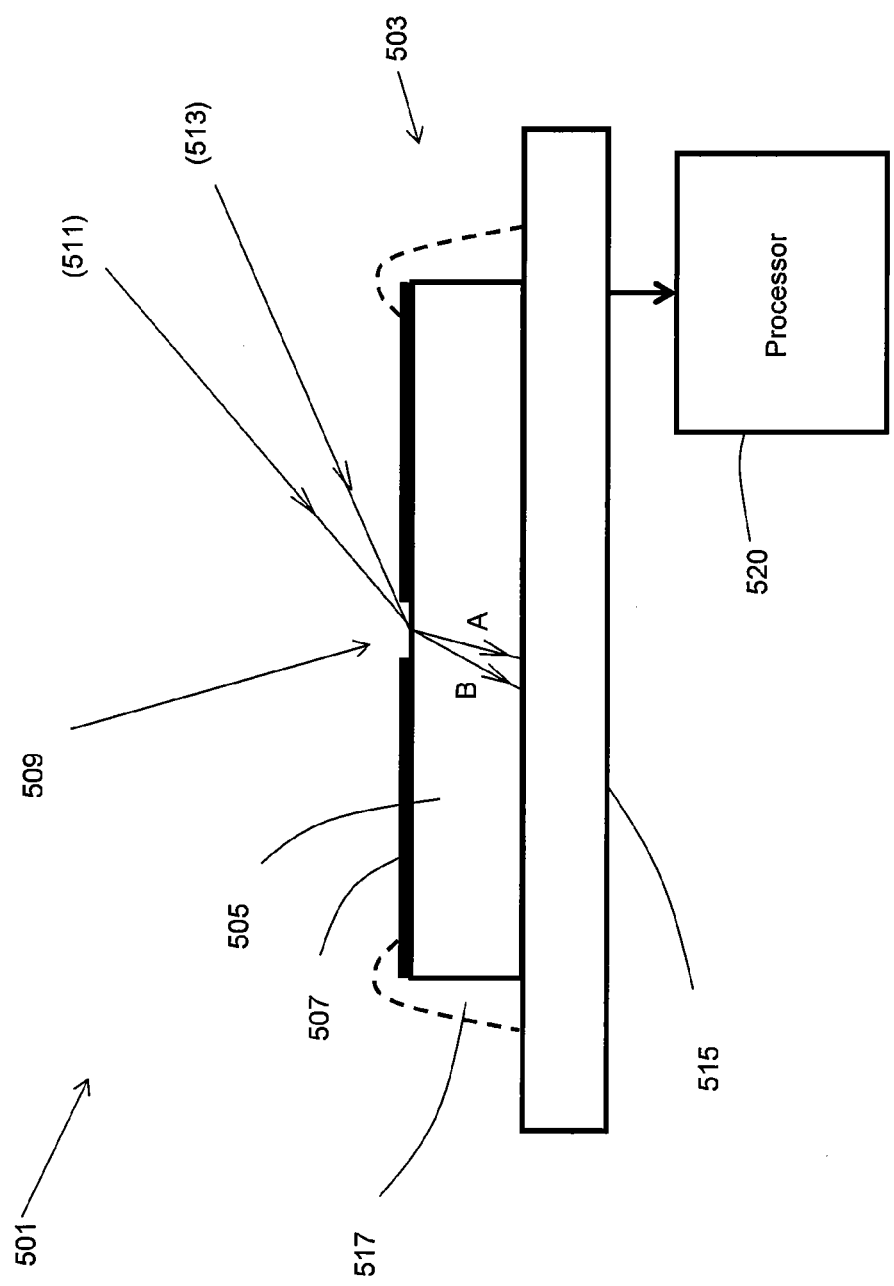
FIG. 5A depicts the cross section of an exemplary single aperture low profile camera.
Figure 5B:
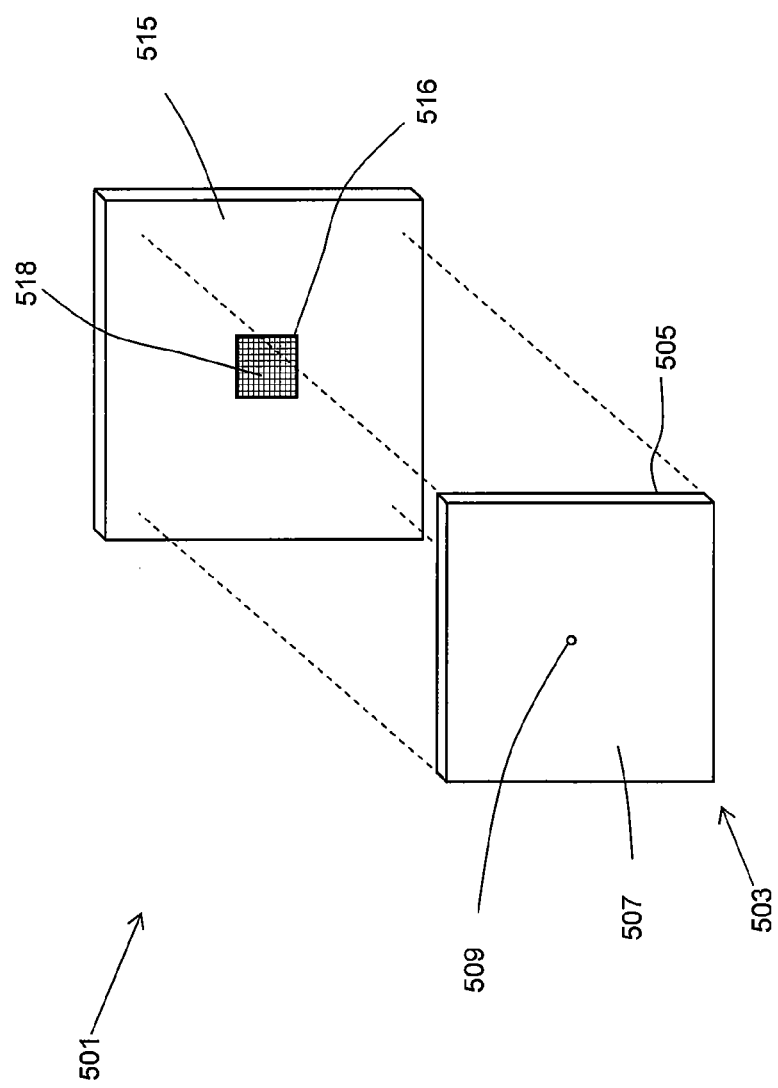
FIG. 5B shows an exploded view of the exemplary single aperture low profile camera of FIG. 5A.

FIG. 5A depicts a cross section of an exemplary single aperture low profile camera 501, and FIG. 5B shows an exploded view of the same. The exemplary single aperture low profile camera 501 comprises an optical structure 503 disposed on an image sensor 515 having a pixel array 516 of pixel elements 518 that are sensitive to light, i.e., the pixel array senses light. Processor 520 may be connected to the image sensor 515 in order to readout and process an image captured by it. The combination of the optical structure 503, image sensor 515 and processor 520 therefore forms a camera.

In the exemplary embodiment, the optical structure 503 comprises an opaque mask 507 disposed on one side of a piece of transparent material 505. The other side of the transparent material 505 is placed directly onto image sensor 515. The transparent material 505 has an index of refraction higher than that of the surrounding environment for the intended use of the image sensor 501. If the surrounding environment is free space (vacuum) or air, both of which have an index of refraction of about 1.0, then materials such as plastic or glass may be used. Glass typically has an index of refraction between about 1.5 and 1.9, depending on the specific type of glass, while many plastics have indices of refraction between about 1.4 and 1.6. Such glasses and plastics may therefore be used as transparent material 505 in an air or free space environment. If the surrounding environment is water, which has an index of refraction of about 1.33, then materials having an index of refraction higher than that of water may be used, for example flint glass (index of refraction 1.6) or sapphire (index of refraction 1.8). There are numerous other types of surrounding environments for which the camera 501 may be configured, and it is well within one of ordinary skill in the art to choose transparent material having a certain index of refraction for a given surrounding environment.

The opaque mask 507 is opaque everywhere except for a single opening 509 through which light may pass. The optical structure 503 is mounted on the image sensor 515 so that the opening 509 is over the pixel array 516 so that light entering the opening 509 strikes the pixel array 516. The opaque mask 507 need not be perfectly opaque, but opaque enough that the image formed through the opening 509 is distinguishable from any leaking or parasitic light. This may require an opaqueness of 99%, 99.9%, or more depending on the specific application. Similarly the opening 509 need not be perfectly transparent, but transparent enough that the image formed through the opening 509 is distinguishable from any leaking or parasitic light. In general, for a given thickness of the transparent material 505, decreasing the size of the opening will require a higher opaqueness in the surrounding mask. In this manner, light from the environment will pass through the opening 509, bend due to refraction as it crosses into the transparent material 505, and strike pixel array 516 on the image sensor 515. Rays A (511) and B (513) show two possible paths of light through the opening 509. In this manner, the opening 509 acts as a pinhole and causes an image of the visual field to be formed on the pixel array 516. Note that the size of the opening 509 is exaggerated in FIG. 5A for clarity and may be substantially smaller than that suggested in the figure. Processor 520 operates the pixel array 516 and associated circuitry (not shown) on the image sensor 515 and acquires the resulting image striking the pixel array 516.

It is generally beneficial to add additional opaque material 517 at the side edges of transparent material 505 in order to prevent light from entering the transparent material 505 from the side and ultimately striking the light sensing region of the image sensor 515. The opaque material 517 may double as an adhesive that attaches the optical structure 503 to the image sensor 515, and may be made with "glop" or with a substantially opaque epoxy such as JB Weld®. In specific applications where the camera 501 is mounted inside of an opaque housing that would prevent light from entering the sides of transparent material 505, opaque material 517 is not needed. Alternatively, one may place opaque structures within the transparent material 505 so that any light entering the transparent material 505 will not reach the light sensing region of the image sensor 515.

The optical structure 503 may be fabricated as follows: First, a plastic or glass plate or sheet may be used to form a base structure and corresponds to the transparent material 505. Next, the opaque mask 507 is formed by depositing, printing, or photocuring opaque material everywhere on the plastic or glass sheet except for where the opening 509 is to be formed. The opaque mask 503 may be formed by a printer or photoplotter of the type used to fabricate photomasks that may be used to fabricate printed circuit boards as well as to form optical encoders. Photoplotters are capable of producing opaque masks that are 99% or even 99.9% or more opaque and would be suitable for use in the exemplary embodiment. For example, the laser plotters manufactured (as of year 2009) by Ucamco of Gent, Belgium may be used.

The opaque mask 507 may be printed onto transparent sheets of plastic, for example Kodak Accumax ARD7 sheets, which are available in thicknesses such as 0.007 inches (7 mils). The opaque mask may be made from a material such as silver halide photographic emulsion that is cured by light to form the desired mask pattern. This method allows a large number of opaque masks to be inexpensively fabricated in bulk, by printing an array of opaque mask patterns on a single sheet of transparent material, and then cutting the sheet into individual optical structures.

The opening 509 may be approximately the same shape as the corresponding one or more pixel elements 518 in the pixel array 516 that senses the light through the opening 509. Moreover, the size of the opening 509 may be chosen based on the needs of a particular application. Making the opening 509 similar in size to the individual pixel elements 518 of the pixel array 516 would maximize the amount of light striking the pixel array 516 while keeping the resulting image sharp. Increasing the size of the opening 509 beyond the size of the individual pixel elements 518 would allow more light to be collected, but would blur the image. Decreasing the size of the opening would let through less light and reduce the ability of the camera 501 to operate in dim environments. The dimensions of the optical structure 503, including the thickness of the transparent material 505 and the size of the opening 509, may vary with the specific implementation and may differ from what is suggested in FIG. 5A. In this regard, the size of the opening 509 may need to be adjusted according to the thickness of the transparent material 505.

The resulting optical structures may then be attached to the image sensors by using an adhesive at the edges of the optical structure 503. The adhesive may be opaque to prevent light from seeping into the transparent material 505 from the side and thus serve as opaque material 517.

Alternatively, the mounting of the optical structure 503 onto the image sensor 515 may also be accomplished by using a clear adhesive between the transparent material 505 and the image sensor 515. This latter method allows for easy manufacturing: An array of opaque masks may be first printed in bulk on a sheet of transparent plastic. The sheet may be cut into individual optical structures. Clear adhesive may be deposited onto each image sensor. Lastly each optical structure may be pressed onto its image sensor with enough force to spread the adhesive thin across the whole area of contact. In this latter case, the adhesive could be transparent or, if a slight scattering of light is tolerable (or desired), the adhesive could be translucent. Depending on the specific implementation, additional opaque coating may be placed at the edges to block light from entering the optical structure 503 from the side.

Because the refractive index of the transparent material 505 is greater than the refractive index of the surrounding environment, the resulting camera can image over a wider field of view than what is practical using a single lens element as shown in FIG. 1. This is due to the critical angle $\theta_c$ that results from Snell's law, as discussed above. Light approaching the opening 509 from an angle of incidence of almost 90°, e.g. almost horizontal, will refract into the transparent material 505 with an angle of incidence less than $\theta_c$ in magnitude. The field of view of the camera having a substantially flat optical structure 503 can thus be almost 180° or hemispheric. The image may be distorted and dimmed at these larger angles, but this distortion may be corrected using standard image processing techniques well known in the art.

A single aperture low profile camera may be realized using other implementations. For example the transparent material 505 may be made from a material other than glass or plastic, and the opaque mask 507 may be made from a variety of materials. The transparent material 505 may alternatively be curved or have a shape other than a flat sheet. As another variation, the optical mask 507 may be fabricated from a separate piece or sheet of opaque material, and then mounted onto the transparent material 505. Furthermore, the opaque mask 507 may, in some variations, be placed inside the transparent material 505 but with some transparent material between the opaque mask and the pixel array 516. The opening 509 may be a shape other than a hole or a square, and there may be more than one opening in the opaque mask, as will be discussed below.

Figure 5C:
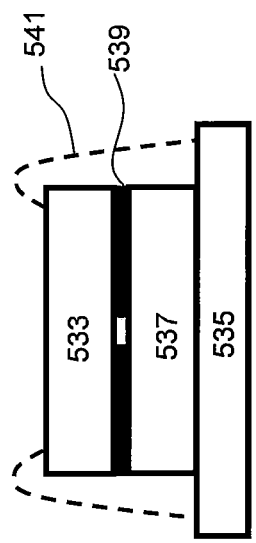
FIG. 5C depicts an exemplary single aperture low profile camera with protective transparent material.

Several variations of the exemplary single aperture low profile camera 501 will now be considered. In many applications it is desirable to protect the opaque mask 507 from the environment with a coating or covering. This may be achieved by placing another transparent material on top of the opaque mask 507. An example is shown in FIG. 5C, which depicts an exemplary single aperture low profile camera 531 with protective transparent material 533. The camera 531 is similar to camera 501 and has an image sensor 535, transparent material 537 mounted on the image sensor 535, and an opaque mask 539 disposed on the transparent material 537. However camera 531 includes additional transparent material 533 disposed on top of the opaque mask 539 to protect it. Additional opaque material 541 may be added at the edge of the two transparent materials 533 and 537 to prevent light from entering from the side. Accordingly, exemplary camera 531 may have the same wide field of view imaging properties of exemplary camera 501, but with additional protection for the opaque mask 539.

Figure 5D:
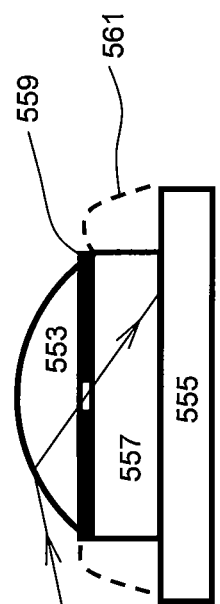
FIG. 5D shows an exemplary single aperture low profile camera with a lens on top of the opaque mask.

Another variation based on the camera 531 of FIG. 5C is to replace the second piece of transparent material 533 with a lens or form it as a lens. FIG. 5D shows an exemplary single aperture low profile camera 551 with a lens 553 on top of the opaque mask 559. Exemplary camera 551 comprises an image sensor 555, transparent material 557, an opaque mask 559, and optional opaque material 561 as discussed above. The lens 553 may additionally provide protection to the opaque mask 559. Advantageously, the lens 553 may be used to alter the field of view of the exemplary camera 551 including widening the field of view to more than 180 degrees. This is depicted by ray 563 which enters lens 553, passes through the opening in the opaque mask 559, and strikes the image sensor 555. In practice, the lens 553 may be a small lens on the order of one or several millimeters in diameter, or smaller or larger depending on the specific application. The lens 553 may be constructed of glass or plastic or another clear material. Alternatively, the lens 553 may be constructed using optically clear glue by depositing a small drop of glue onto the opaque mask 559 and then allowing the glue to harden.

Figure 5E:
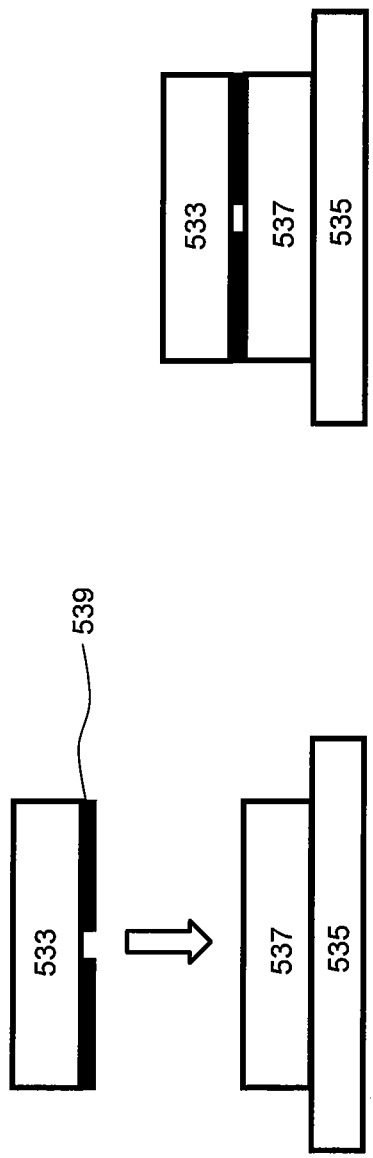
FIG. 5E depicts a variation of the single aperture low profile camera of FIG. 5C in which the opaque mask is attached to the protective transparent material.

The opaque mask 539 described above may be printed on or attached to the transparent material 537 in the same manner as described above with the optical structure 503 of FIG. 5A. Alternatively, the opaque mask 539 may be attached to transparent material 533 as is shown in FIG. 5E. The opaque mask 539 and the piece of transparent material 533 may then be placed onto the first piece of transparent material 537 as shown in FIG. 5E. This variation allows the protective piece of transparent material and an opaque mask to be easily mounted onto an image sensor and then later removed and replaced with a different mask that is appropriate for a specific application.

Figure 5F:
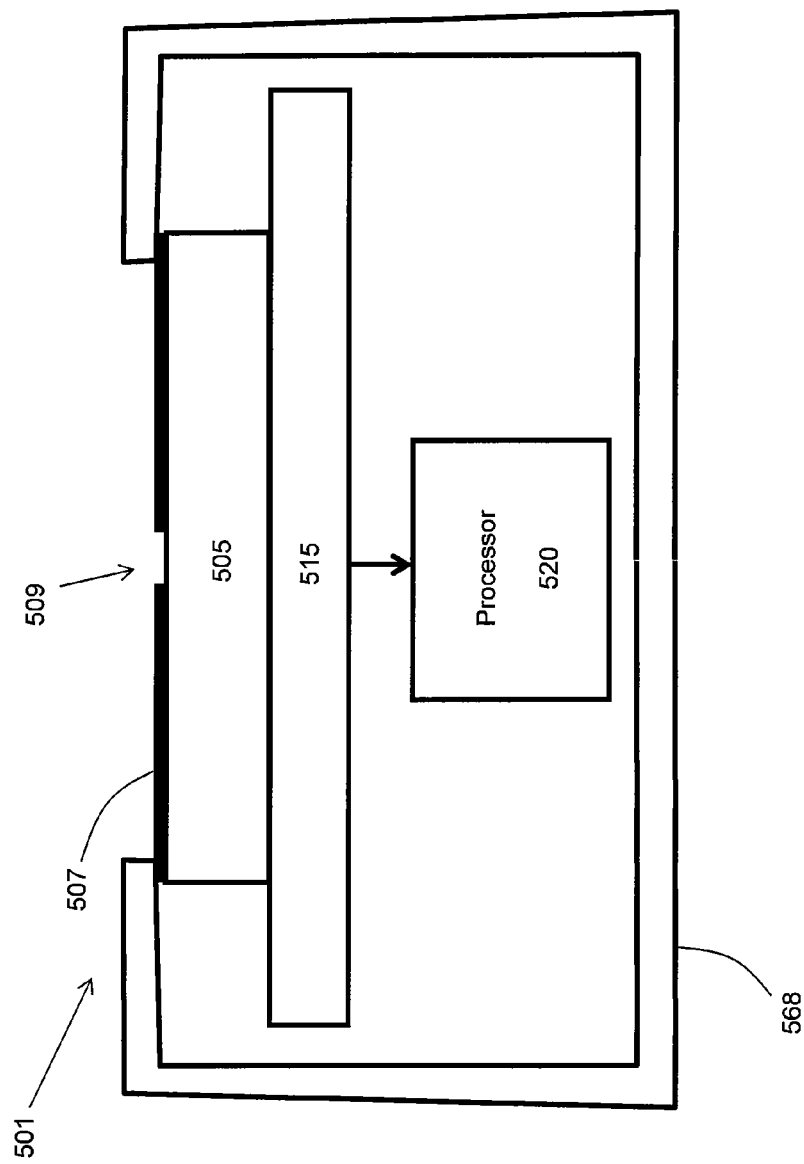
FIG. 5F shows an opaque enclosure surrounding the single aperture low profile camera of FIG. 5A.

Above it was described that it is beneficial for opaque material 517 to be placed at the edges of the transparent material 505 to prevent light from entering it from the side, but in some implementations opaque material 517 is not needed. FIG. 5F shows an opaque enclosure 568 surrounding the single aperture low profile camera 501 of FIG. 5A. As shown in FIG. 5F, the opaque enclosure 568 encloses the entire camera 501 except for the opaque mask 507 and the opening 509. Opaque material 517 is no longer needed if there is such an opaque enclosure since the enclosure 568 prevents light from entering the transparent material 505 except through opening 509. The opaque enclosure 568 may include other electronics, and for example be a case for an electronic product or consumer gadget incorporating the camera 501.

Figure 5G:
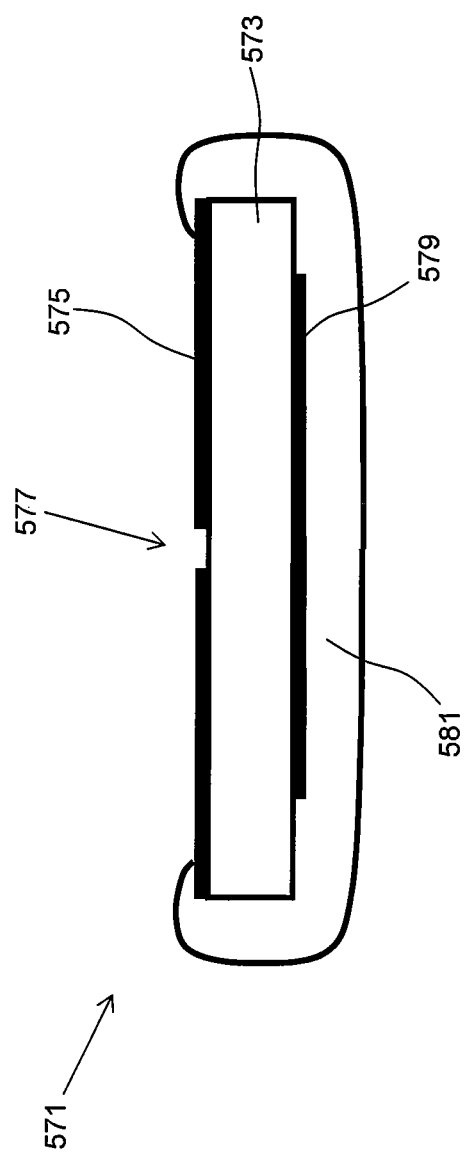
FIG. 5G shows an exemplary low profile camera having an integrated image sensor and transparent material.

Another variation of the exemplary camera 501 may be fabricated by forming the image sensor on the transparent material. FIG. 5G shows an exemplary low profile camera 571 having an integrated image sensor and transparent material. Camera 571 comprises a piece of transparent material 573, a substantially opaque mask 575 having an opening 577, an image sensor 579, and the opaque surround material 581. The opaque mask 575 may be disposed onto the transparent material 573 using any of the techniques already discussed above. In this exemplary embodiment, the image sensor 579 is integrated with transparent material 573 and may be placed on the surface of the transparent material 573 or even inside, as long as there is transparent material between the image sensor 579 and the opaque mask 575. For example, the transparent material 573 may be composed of sapphire or another transparent insulator, and the image sensor 579 may be a semiconductor circuit formed on or in the transparent material 573 using silicon-on-sapphire (SOS) or silicon-on-insulator (SOI) semiconductor fabrication techniques. Alternatively, the transparent material 573 may be a transparent flexible substrate and the image sensor 579 may be a circuit formed or printed on it. The opaque surrounding material 581 may serve the function of both protecting the image sensor 579 and ensuring that the only substantial light striking the image sensor 579 is light that has passed through the opening 577. The opaque surrounding material 581 may be formed with an opaque encapsulant, case, or coating.

The exemplary single aperture low profile camera 501 structure shown in FIG. 5A has adequate light sensitivity and resolution for many applications. The resolution of camera 501 may be increased by making the transparent material 505 thicker, or by decreasing the size of pixel elements 518 on pixel array 516 and decreasing the size of the opening 509. However performing either of these modifications would reduce the amount of light collected per pixel and hence reduce light sensitivity. An alternative approach will be discussed next.

Figure 6B:
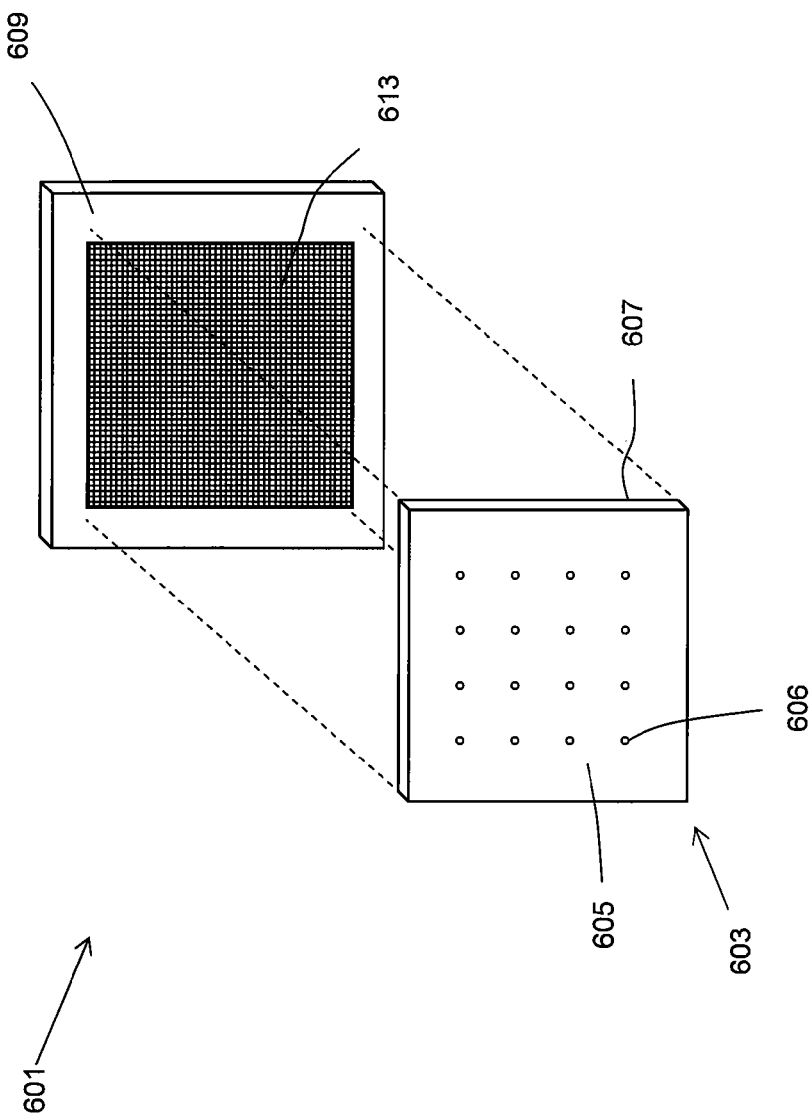
FIG. 6B shows an exploded view of the exemplary multiple opening low profile camera of FIG. 6A.

FIGS. 6A and 6B depict an exemplary multiple opening low profile camera 601. FIG. 6A shows a cross section view and FIG. 6B shows an exploded view of it. The exemplary multiple opening low profile camera 601 may be constructed in a similar manner as the exemplary single aperture low profile camera 501 discussed above. Such manufacturing steps need not be repeated.

The low profile camera 601 comprises an optical structure 603 and an image sensor 609 having a pixel array 613. The optical structure 603 comprises an opaque mask 605 placed on one side of transparent material 607 and thus may be similar to the optical structure 503 of FIG. 5A. Optional opaque material 615 may be used to prevent light from leaking into the sides of the transparent material 607, much like the opaque material 517 of FIG. 5A. The other side of transparent material 607 may rest on an image sensor 609. However the opaque mask 605 is different from the opaque mask 507 of FIG. 5A in that it has more than one opening. The opaque mask 605 may be fabricated in a manner similar as that of opaque mask 507 except for having a plurality of openings. In the exemplary embodiment shown in FIGS. 6A and 6B, the opaque mask 605 has a four-by-four array of openings. Other array sizes may be utilized as well. Opening 606, for example, may correspond to one of the openings in the opaque mask 605. Light enters through the openings in the opaque mask 605 and illuminates the pixel array 613 beneath it on the image sensor 609.

Processor 611 may be connected to the image sensor 609 in order to readout and process an image captured by it. The combination of the optical structure 603, the image sensor 609, and the processor 611 forms a camera. Processor 611 operates the image sensor 609, receives an image from the pixel array 613, processes the image, and generates an output 617. For purposes of discussion, the image obtained by the processor 611 from the pixel array 613 will be referred to as a "raw image."

Figure 3:
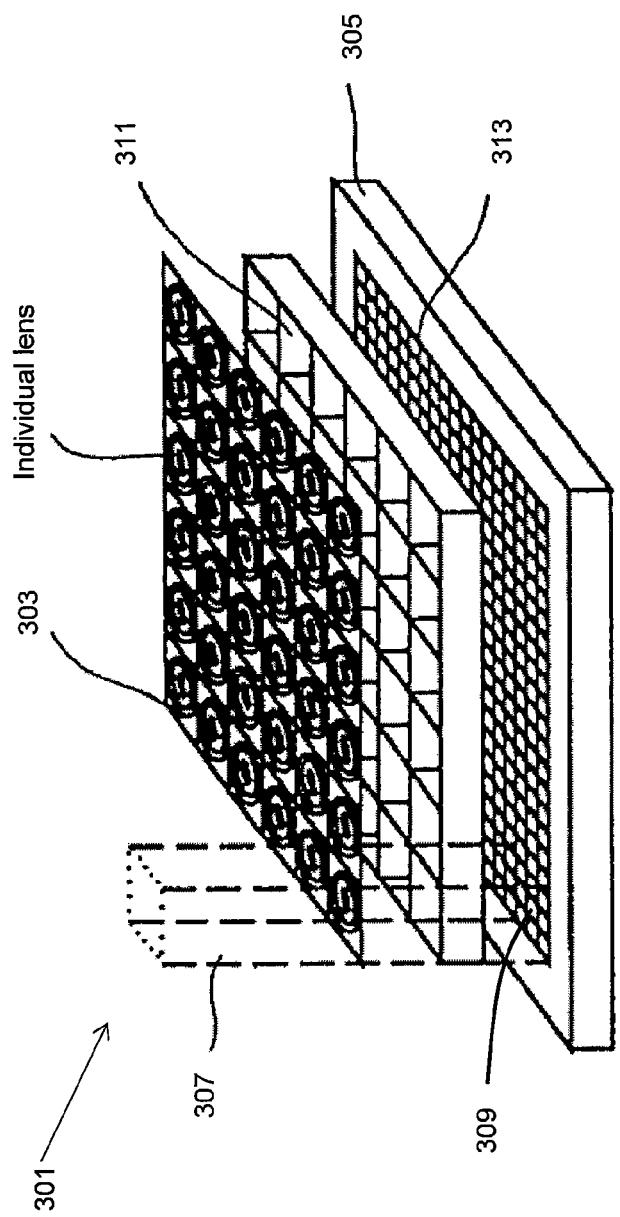
FIG. 3 depicts a prior art TOMBO camera.
Figure 6C:
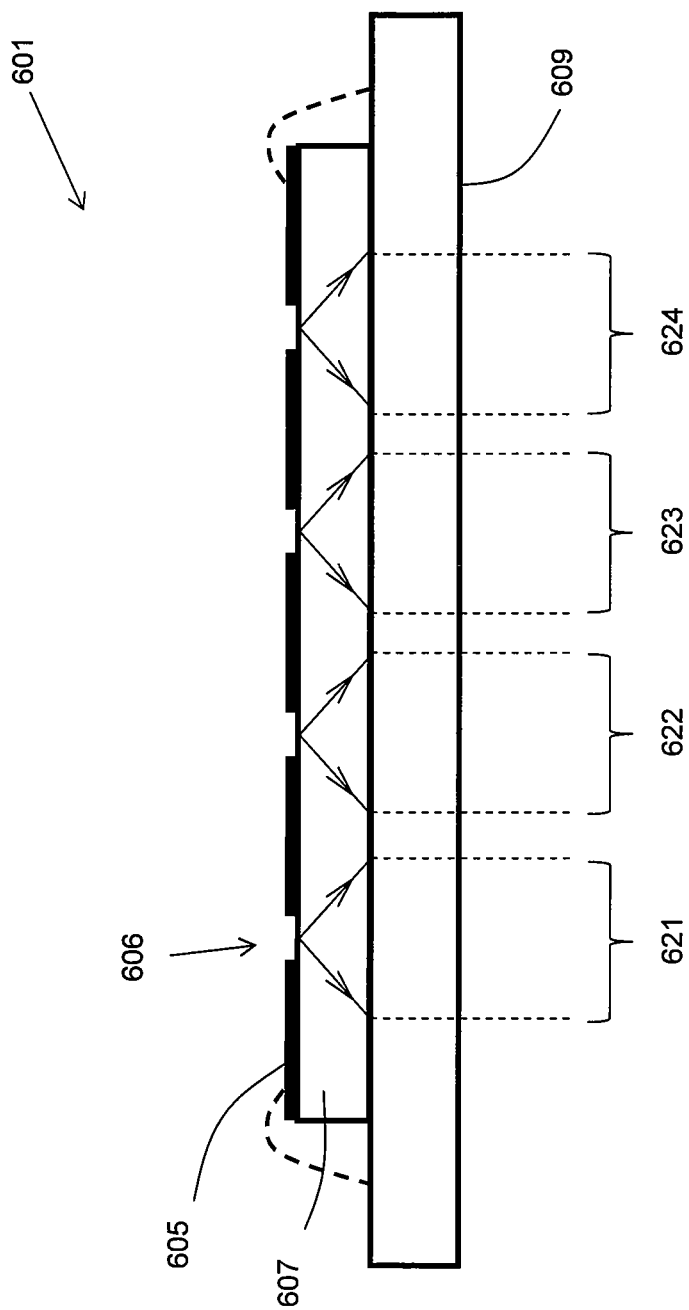
FIG. 6C depicts subimage regions on the pixel array caused by the openings in the opaque mask of the exemplary multiple opening low profile camera.

When camera 601 is exposed to a visual environment, the pixel array 613 will be illuminated with a plurality of subimages (e.g. subimages 621, 622, 623, and 624) where each subimage is formed by light illuminated through a respective opening. FIG. 6C depicts subimage regions on pixel array 613 caused by the openings in the opaque mask 605 of the camera 601. FIG. 6C shows the same cross section view of exemplary camera 601 as FIG. 6A. For example, light passing through opening 606 will illuminate subimage region 621. Subimage region 621 thus may be analogous to the region on pixel array 516 illuminated through opening 509 in the exemplary single aperture low profile camera 501 of FIG. 5A. In the exemplary embodiment, the openings in opaque mask 605 may be placed sufficiently far apart that the subimages caused by the openings will not overlap. This is possible due to the critical angle effect discussed above that results from Snell's law. If the transparent material 607 has a higher index of refraction than the surrounding environment, then light passing through an opening, once it passes into the transparent material 607, is confined to an angle of incidence less than $\theta_c$ as described above. The dimensions of the optical structure 603, including the size of the openings, the distance between openings, and the thickness of the piece of transparent material 607, may vary with the specific implementation. FIG. 6C therefore illustrates one significant advantage of the camera 601 of FIG. 6A over the prior art. The optical isolation between adjacent openings is provided by refraction, without the need for any restricting structure 311 as shown in FIG. 3.

The size and shape of openings in the opaque mask 605 may be selected using similar considerations as that of opaque mask 507. In the exemplary embodiment, the openings in opaque mask 605 may be square or circular shaped and similar in size to the pixel circuits in pixel array 613.

The non-overlapping subimage principle discussed above does not factor stray light that may result from diffraction, reflections off the edge of the opaque mask 605 at an opening, or imperfections inside or at the surface of the transparent material 607. However in practice, if the openings are sufficiently large and if the construction of the transparent material is of sufficient quality, then such stray light will have a negligible effect on the image data acquired by the image sensor 609.

Figure 7B:
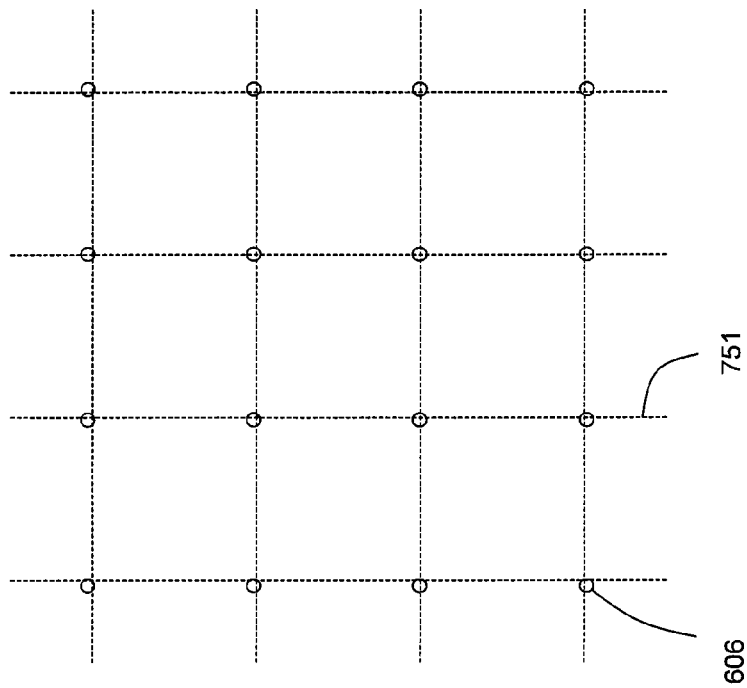
FIG. 7B illustrates exemplary spatial dither in the locations of openings in the opaque mask of FIG. 6A.
Figure 7A:
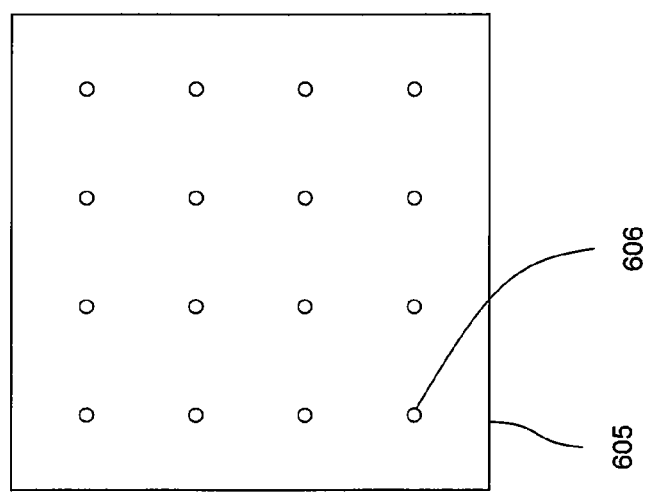
FIG. 7A illustrates the top view of the opaque mask of FIG. 6A.

FIGS. 7A and 7B depict spatial dithering in the locations of the openings in opaque mask 605. FIG. 7A illustrates the top view of the opaque mask 605 of FIG. 6A. FIG. 7B illustrates exemplary spatial dither in the locations of openings in the opaque mask 605 of FIG. 6A. The grid 751 indicates the alignment of the pixel array 613 on the image sensor 609. Each of the lines of grid 751 is separated by a distance equal to a multiple (e.g., integer multiple) of the pitch between pixels on the image sensor 609. This integer multiple may be a number such as 20 pixels, 32 pixels, or another integer depending on the specific implementation. For example, if the pixel pitch is 10 microns, the lines of grid 751 may be 200 microns, 320 microns, or another multiple of 10 microns apart.

It is possible to configure the opaque mask 605 so that each opening is located exactly at the intersection of a horizontal and a vertical line, e.g. with no dither. The grid lines would then be far enough apart to ensure that the resulting subimages are substantially nonoverlapping. In this case, with the openings perfectly aligned with the grid 751 the subimages would be identical.

However, in the exemplary embodiment the openings may instead be displaced from grid 751 by fractional pixel amounts. This is shown in FIG. 7B. For purposes of discussion, this displacement of openings from the grid 751 will be referred to as spatial dithering. This will cause the subimages associated with different openings to be similar but displaced by a fractional pixel amount. The advantages of spatial dithering in the openings will be discussed below. The actual spatial dithering may be systematic, e.g. so that the first, second, third, and fourth rows of openings are shifted up by 0.5, 0.25, 0, and −0.25 pixels respectively. For example, if the pitch between pixels is 10 microns, the respective spatial dithering applied to the rows of openings may be 5 microns, 2.5 microns, 0 microns, and −2.5 microns. Columns of openings may likewise be similarly shifted left and right. The spatial dithering may also be random, where each opening is displaced horizontally and vertically by a random fractional pixel amount. For example, if the pixel pitch is 10 microns, each opening may be randomly displaced to any location within a ten by ten micron square centered about the original location. Alternatively, the openings may simply be randomly placed throughout the mask area, provided that the openings are sufficiently far apart.

Another manner of obtaining spatial dither is to position the optical structure 603 so that it is rotated with respect to the image sensor 609. This method is discussed further below in FIG. 17. The above benefits of spatial dither may then be obtained using an array of openings that are themselves not spatially displaced with respect to the piece of transparent material 607. This approach may be combined with the other techniques above to produce spatial dither. As long as the locations of the openings in the opaque mask 605 are spatially dithered with respect to grid 751, the benefits of spatial dither may in many cases be obtained. Note that for mass assembly, the tolerances with which the optical structure 603 may be placed on the image sensor 609 may be such that such rotation is inevitable. In this case, such imprecision in manufacture may in fact be beneficial.

Figure 8A:
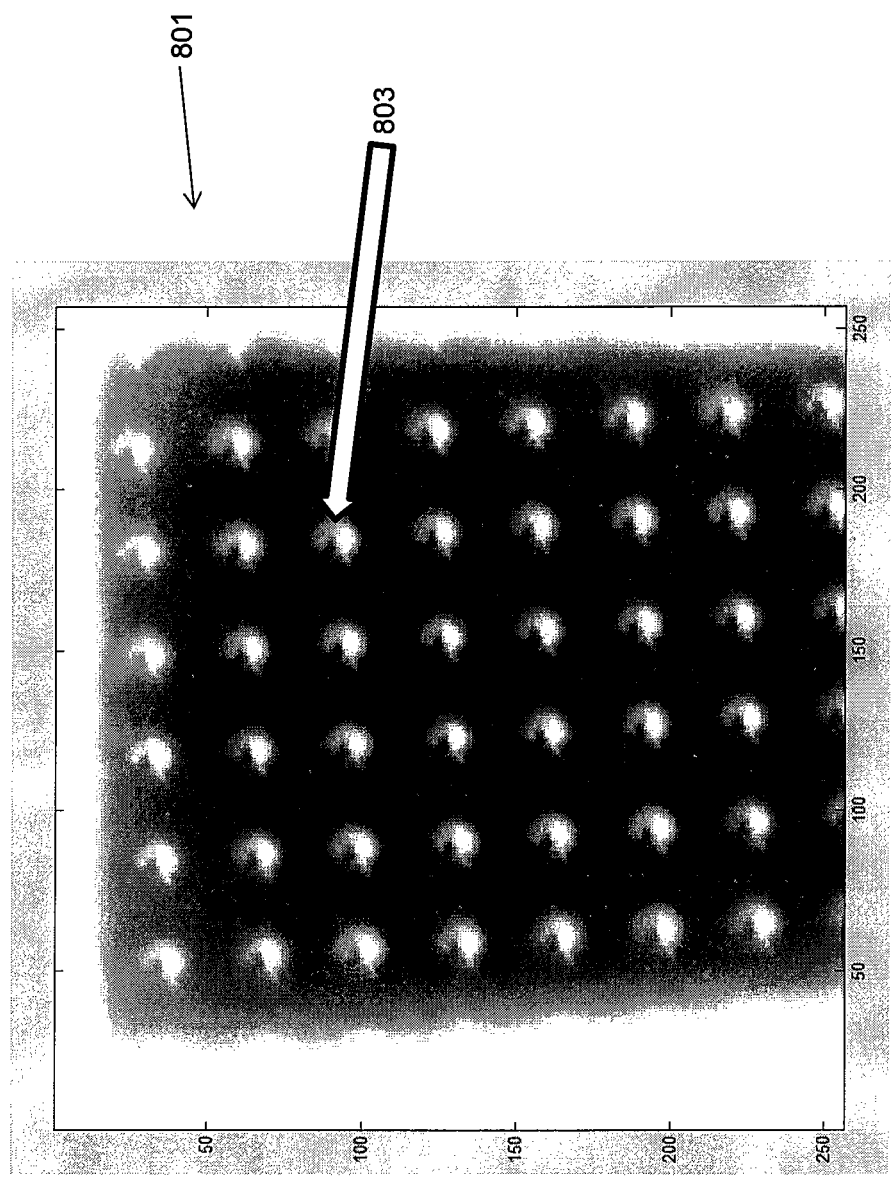
FIG. 8A depicts an exemplary raw image of the type that may be acquired by the image sensor of FIG. 6A.

FIG. 8A depicts an exemplary raw image 801 of the type that may be acquired by the pixel array 613 of FIG. 6A. The resulting image contains a plurality of subimages, one for each opening in the opaque mask 605. Subimage 803, for example, is one of the plurality of subimages. Note that in FIG. 8A, the area between subimages is dark. These dark areas are regions beyond the critical angle $\theta_c$ of all openings. Therefore, in raw image 801 the distances between openings in the opaque mask 605 are large enough, for the transparent material's thickness and refractive index, to cause the subimages to be substantially nonoverlapping. For the image sensor that produced raw image 801, the pixel pitch of the pixel array was 17.1 microns, the transparent material 607 was cut from a sheet of Kodak Accumax ARD7 sheet that is 178 microns (0.007 inches) thick, and the lines of grid 751 were about 32 pixels or about 547.2 microns apart, plus spatial dithering.

Figure 8B:
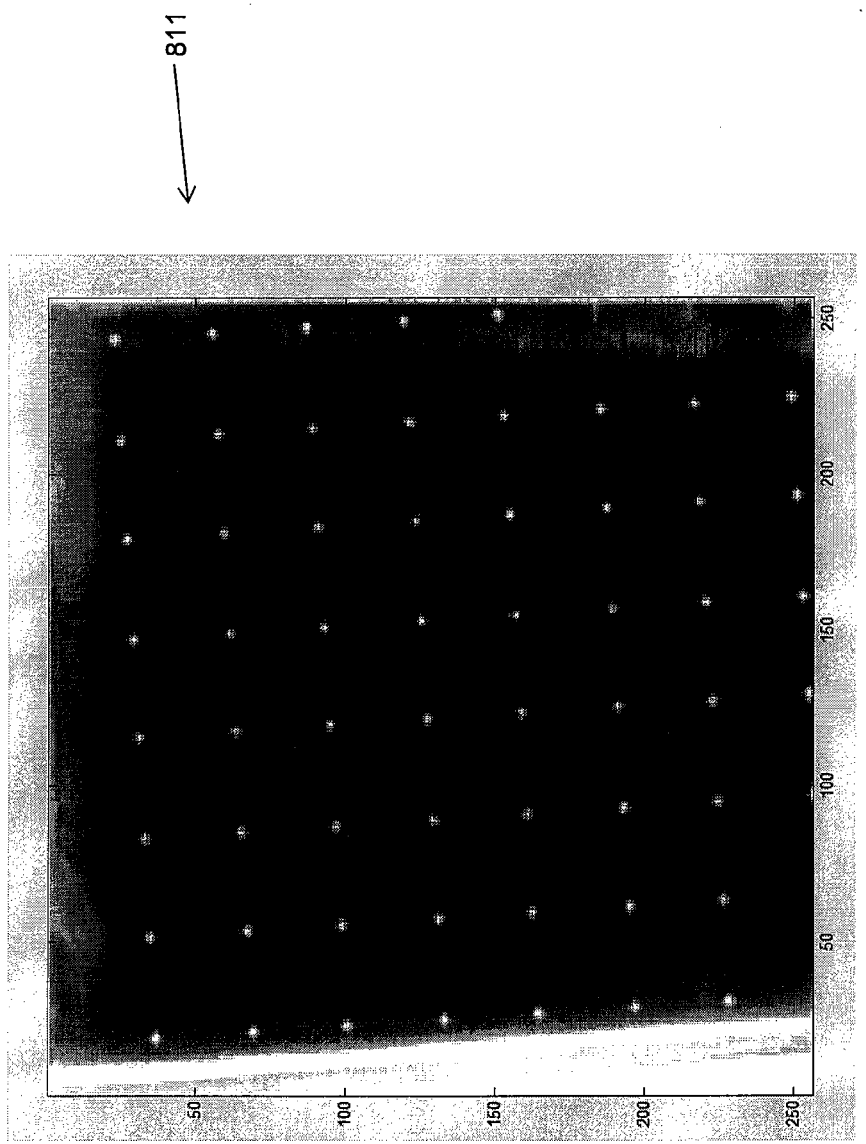
FIG. 8B illustrates an exemplary raw image of the type that may be acquired by the image sensor of FIG. 6A in response to a point source of light.

FIG. 8B illustrates an exemplary raw image 811 of the type that may be acquired by the image sensor 609 of FIG. 6A in response to a point source of light. Such an image may be obtained in a calibration step to determine the locations of openings in the opaque mask 605. The point source of light may be located perpendicularly above the opaque mask 605 and may be produced by a light emitting diode or other light source. It is beneficial for the distance between the point source of light and the opaque mask 605 to be adequately large such that stereo disparity in the subimages of different openings is negligible. The generated image would comprise an array of bright spots that correspond to the mask openings. The locations of these bright spots, which may be determined by the location of the brightest pixel of each spot, may be used to obtain initial estimates of the locations of the individual subimages and therefore the openings in the opaque mask 605.

Figures 9A, 9B:
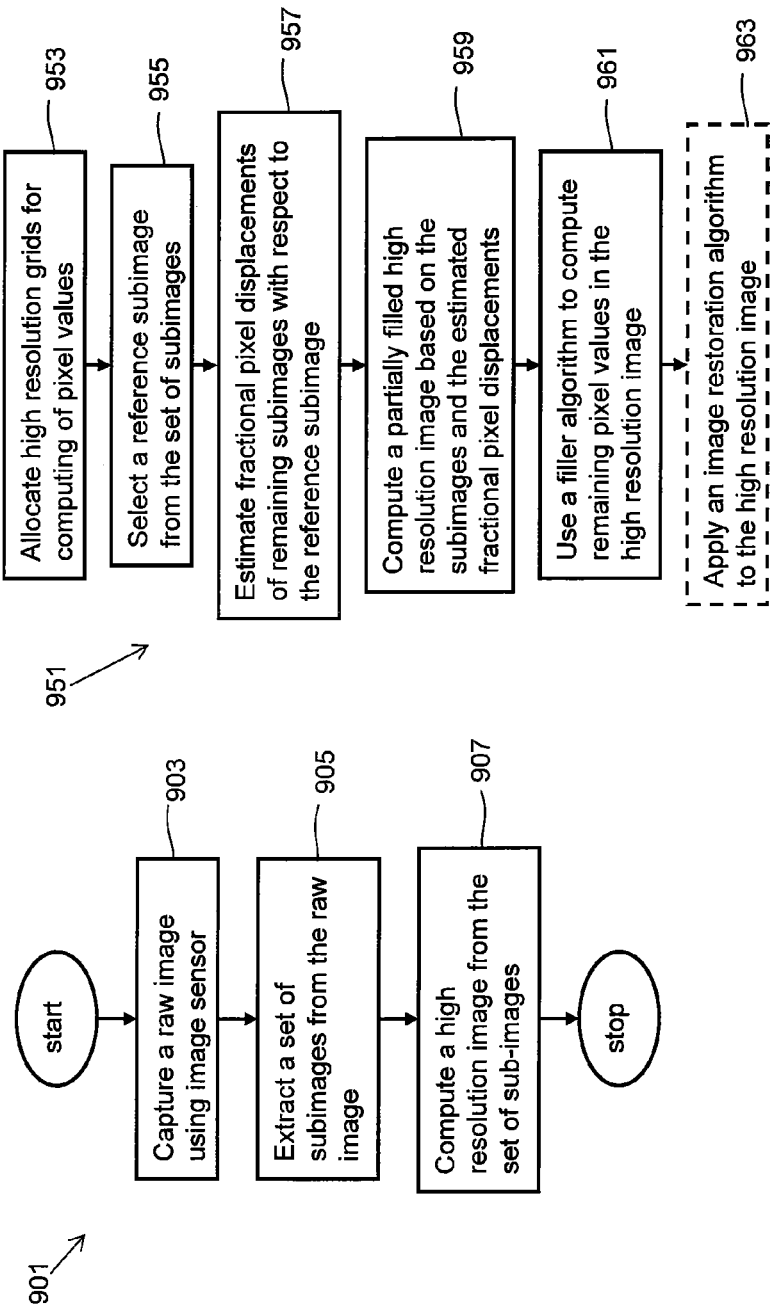
FIG. 9A depicts an exemplary process flow for reconstructing a high resolution image from a raw image.
FIG. 9B depicts an exemplary algorithm that may be used to implement the third step of FIG. 9A.

In the exemplary embodiment, a high resolution image may then be constructed from the raw image data acquired by the image sensor 609. FIG. 9A depicts an exemplary process flow 901 for reconstructing a high resolution image from a raw image such as that which might be obtained from image sensor 609. This process may run as an algorithm on processor 611. The first step 903 of this process is to collect light and generate the raw image seen by the pixel array 613 on image sensor 609. For example, this would produce an image that may be similar in nature to the image 801 of FIG. 8A.

The second step 905 of this process is to extract a set of subimages from the raw image. One subimage may be extracted from the area under each opening in the opaque mask 605. The size of the subimage may be large enough to capture all pixels illuminated through the subimage's opening, but small enough to not capture pixels illuminated through adjacent or other openings. The measured locations of openings obtained previously by a point source of light, for example as in the discussion of FIG. 8B above, may be used to assist with the extraction of these subimages from the raw image.

The third step 907 of this process is to compute a high resolution image from the set of subimages. This step may be performed using a superresolution algorithm that is capable of constructing a high resolution image from a set of lower resolution images all looking substantially at the same scene. The implementation of such superresolution algorithms is a well established art. U.S. Pat. No. 7,248,751 (incorporated herein by reference in its entirety), entitled "Algorithmic technique for increasing the spatial acuity of a focal plane array electro-optic imaging system" by Schuler et al., describes an exemplary algorithm that may be used for step 907. Such algorithms have found use in other image processing applications in which, for example, a video camera mounted on a moving platform observes a scene. The video camera would generate a video sequence of images that are all substantially the same except for subpixel displacements, also known as spatial dither, which result from the video camera being in a slightly different position each frame. Using a superresolution algorithms, it is possible to reconstruct a higher resolution image of the environment from the video sequence. In the exemplary process 901, instead of reconstructing a high resolution image from a sequence of lower resolution video frames, in which each frame was acquired at a different time, the high resolution image is reconstructed from the set of subimages that were acquired simultaneously in step 903.

FIG. 9B depicts an exemplary algorithm 951 that may be used to implement step 907 of process 901. This exemplary algorithm 951 is a variation of the resolution enhancement algorithm mentioned in the aforementioned U.S. Pat. No. 7,248,751.

The program listing below is the MATLAB® source code of an exemplary algorithm capable of reconstructing a high resolution image from a raw image of the type captured by the image sensor 609. In the exemplary embodiment, this algorithm runs on the processor 611 and generates the output 617. Although MATLAB® was chosen for illustrative purposes, the algorithm may be written in any other appropriate computer language. The program listing below includes both the source code and comments explaining the algorithm's function. Also listed is the MATLAB® source code of an optical flow function "ii2" capable of measuring subpixel displacements between two images. The function "ii2" is based on Mandyam Srinivasan's "Image Interpolation Algorithm (IIA)" which is disclosed in the publication "An image-interpolation technique for the computation of optical flow and egomotion", pages 401-415 of the September 1994 issue of Biological Cybernetics (Vol. 71, No. 5, and incorporated herein by reference in its entirety). Other optical flow algorithms may be used in place of function "ii2", for example the well known Lucas Kanade algorithm originally introduced in the conference publication "An iterative image registration technique with an application to stereo vision" by Bruce Lucas and Takeo Kanade, from the Proceedings of Image Understanding Workshop, pp. 121-130 (1981), and incorporated herein by reference in its entirety.

```
% ==========================================================
% MATLAB program to reconstruct a high resolution image from
% an image tiling produced by a camera such as that shown in
% FIG. 6A
% Start: The program begins with matrix A loaded. Matrix A
% is the raw image of pixels grabbed from the image sensor.
% We are assuming that all valid pixel values are positive
% e.g. one or greater.
% ==========================================================
% PART A: Set up locations of sub-images
% bases(j,1) and bases(j,2) are respectively the m and n
% locations of the center point of subimage j, quantized to
% integer values. The values shown below for bases is an
% actual set of values used in one prototype. Obviously for
% other prototypes the entries and the number of entries
% will be different.
bases = [
    65,85
    63,118
    97,87
    95,120
    61,149
    59,182
    93,151
    91,183
    129,89
    127,121
    161,91
    159,124
    125,153
    157,155
    123,185
    155,187
    193,93
    191,125
    223,128
    189,157
    221,159
    187,190
    218,191
    ];
% ==========================================================
% PART B: Extract subimages from raw image A
numframes=length(bases);   % number of sub-images to extract
% from raw image
% The variable "radius" defines the resolution of a
% sub-image. A sub-image will be one of the center points
% from "bases" plus a ring of pixels "radius" wide around
% the point. Thus the sub-image will be 2*radius+1 pixels
% wide and tall
radius = 5;
ws = 2*radius+1;
% The 3D matrix Y stores the sub-images extracted from the
% raw image
for f=1:numframes
    Y(1:ws,1:ws,f) = A((-radius:radius)+bases(f,1),...
        (-radius:radius)+bases(f,2));
end
% ==========================================================
% PART C: Initialize variables to prepare for reconstruction
% Variable "upsampleamount" is the factor by which we will
% upsample
upsampleamount = 10;
% ym, yn, and yf may be computed from above, but are
% computed here using the "size" function for simplicity.
% This is to emphasize that a variety of algorithms could be
% used to reconstruct the high resolution image. Practically
% any superresolution algorithm that takes as input the
% stack of low resolution images stored in Y and
% reconstructs a high resolution image is a candidate
% algorithm, though of course which algorithm is best
% depends on the specific application, etc.
[ym,yn,yf] = size(Y);
% Over the next steps we will be computing the matrix Z, a
% superresolution image constructed from the sub-images
% stored in Y. Variables zm and zn denote respectively the
% sizes of Z. Variables Zcount and Zsum are intermediate
% matrices that are used to accumulate pixel values
% deposited into the Z matrix based on displacements between
% sub-images. Here we are allocating these arrays.
zm = (ym+2)*upsampleamount+1;
zn = (yn+2)*upsampleamount+1;
Zcount = zeros( zm , zn );
Zsum = Zcount;
% ==========================================================
% PART D: Pixel displacements between sub-images: Let the
% first sub-image be the reference sub-image. Therefore its
% displacement is zero since it will have no displacement
% from itself. Function ii2 computes subpixel displacements
% between the reference sub-image and other sub-images.
for f=1:yf
    % ofn and ofm store respectively n- and m- direction
    % displacements
    [ofn(f),ofm(f)] = ii2(Y(:,:,1),Y(:,:,f),1);
end
% Note: ofn(1) and ofm(1) will respectively be zero, so we
% could just set these values to zero and save a few
% CPU cycles
% ==========================================================
% PART E: Place sub-images into matrices Zcount and Zsum
% accordingly. Essentially upsample these images, and then
% place them onto these matrices offset by an amount
% determined by the measured displacements
for f=1:yf
    % Optional step: if ofm or ofn are too large in
    % magnitude, then skip this sub-image. This fix prevents
    % out-of-bounds matrix indexing errors.
    if ofm(f)>0.9 || ofm(f)<-0.9 || ofn(f)>0.9 || ofn(f)<-0.9
        continue;
    end
    % Compute image offset amounts.
    zoffm = upsampleamount+1;
    zoffn = upsampleamount+1;
    if f>=2
        % add offset from optical flow
        zoffm = zoffm - ofm(f)*upsampleamount;
        zoffn = zoffn - ofn(f)*upsampleamount;
    end
    zoffm = round(zoffm);
    zoffn = round(zoffn);
    % By this point zoffm and zoffn are the offsets in the
    % m- and n- directions.
    % Now apply the sub-images to the Z matrices
    for mm=1:ym
        for nn=1:yn
            mmm = (mm-1)*upsampleamount+zoffm;
            nnn = (nn-1)*upsampleamount+zoffn;
            Zcount(mmm,nnn) = Zcount(mmm,nnn) + 1;
            Zsum(mmm,nnn) = Zsum(mmm,nnn) + Y(mm,nn,f);
        end
    end
end
% ==========================================================
% PART F: Compute matrix Zbase. This matrix will store a
% non-zero value for all pixels of the high resolution image
% that are known, and zero value for all pixels that are not
% known
Zbase = Zsum ./ (Zcount+eps);
% ==========================================================
% PART G: Fill in unknown pixels. From Zbase we will
% construct Z by estimating the unknown (e.g. zero) values
% of Zbase. This could be performed by interpolation
% algorithm, for example. Here we will just grow the image
% using a weighted sum of surrounding pixels. Note that the
% set of steps shown below is just one possible method to
% fill out Z.
Z = Zbase; % Zbase is an initial estimate of Z
G = [2 3 2; 3 0 3; 2 3 2]; % weight matrix for growing
% Here we perform several growing cycles to fill out Z
growits=20;   % number of growing cycles to perform-
              % optimized experimentally
Znew = Z;
for gi = 1:growits
    for mm=2:zm-1
        for nn=2:zn-1
            if Z(mm,nn)==0
                % Grow into this pixel
                Gwindow = Z(mm-1:mm+1,nn-1:nn+1);
                gsum = sum(sum( Gwindow .* G ));
                gcount = sum(sum( G .* (Gwindow>0) ));
```

-continued

```
            Znew(mm,nn) = gsum / (gcount + eps);
        end
    end
end
    Z = Znew;
end
% Now we will fill out pixels at the periphery.
Z(:,1) = Z(:,2);
Z(:,zn) = Z(:,zn-1);
Z(1,:) = Z(2,:);
Z(zm,:) = Z(zm-1,:);
% Next is an optional set of steps that smooths Z slightly
% to remove the "plateaus" that may appear due to the
% growing algorithm. Matrix Ks is the smoothing kernel,
% which may be determine experimentally. We may have to
% crop the image slightly to remove the roll -off effects
% of the convolution, in particular if the final deblurring
% step is performed next.
if 1
    kssize=4;
    Ks = conv2( ones(kssize) , ones(kssize) );
    Ks = Ks / sum(Ks(:));
    Z = conv2( Z, Ks );
    % crop image
    Z = Z(kssize+1:zm-kssize,kssize+1:zn-kssize);
end
% At this point we have computed Z, the reconstructed
% high resolution algorithm. We could stop here and output
% Z, or we could go on to the next step to perform a
% deblurring algorithm.
% =========================================================
% PART H: Optional restoration step. This optional step uses
% a deblurring algorithm to attempt to sharpen the image Z.
% For this example, we will use the MATLAB function
% "deconvlucy", an implementation of the Lucy-Richardson
% deblurring algorithm available in the MATLAB "image
% processing toolbox". This function takes as input the
% matrix Z and a second argument, an initial estimation of
% the point spread function. For the latter argument we will
% use a square matrix equal to the upsampling
% amount. Other estimations may be more appropriate
% depending on the specific implementation. The matrix Q
% is the output.
psfestimate = ones(10)/10^2;
Q = deconvlucy(Z,psfestimate);
% END
% =========================================================
% =========================================================
function [ofx,ofy] = ii2(X1,X2,delta)
% function [ofx,ofy] = ii2(X1,X2,delta)
% computes optical flow using 2D variant of Srinivasan's image
% interpolation algorithm
%
% X1, X2 = first and second image frame
% delta = delta shift for computation
% ofx,ofy = returned optical flow in pixels
%
[fm,fn] = size(X1);
ndxm = 1+delta:fm-delta;
ndxn = 1+delta:fn-delta;
f0 = X1(ndxm,ndxn);
fz = X2(ndxm,ndxn);
f1 = X1(ndxm,ndxn+delta);
f2 = X1(ndxm,ndxn-delta);
f3 = X1(ndxm+delta,ndxn);
f4 = X1(ndxm-delta,ndxn);
A = sum(sum( (f2-f1).^2 ));
B = sum(sum( (f4-f3).*(f2-f1) ));
C = 2*sum(sum( (fz-f0).*(f2-f1) ));
D = sum(sum( (f2-f1).*(f4-f3) ));
E = sum(sum( (f4-f3).^2 ));
F = 2*sum(sum( (fz-f0).*(f4-f3) ));
mat = [A B; D E] ;
invmat = inv(mat);
xyhat = invmat * [C;F];
ofx = delta*xyhat(1);
ofy = delta*xyhat(2);
% =========================================================
```

The programming of the foregoing exemplary algorithm assumes that when it starts the matrix "A" already contains the two dimensional raw image captured by the image sensor 609. Matrix "A" may thus contain an image similar to that depicted in image 801. In other words, this exemplary algorithm assumes that step 903 has already been performed. Step 903 may be performed using any method of extracting a raw image from the image sensor 609. For purposes of explanation, assume that the image sensor 609 is monochromatic, and therefore pixel values may be encoded as real or integer valued intensities. However, these principles can be expanded to color or hyperspectral images. Also assume, without loss of generality, that the intensity values are denoted as positive values greater than zero.

The exemplary algorithm is divided into Parts A through H for purposes of discussion. The exemplary algorithm also requires a second matrix, "bases," which stores the locations of the openings of the opaque mask 605 and hence the center locations of the subimages generated by the corresponding openings. The values in "bases" may be computed from an initial calibration step using a point light source, as discussed above in conjunction with FIG. 8B. For example, the location of each hole may be estimated as the pixel location of the local maximum of the corresponding subimage in response to the point light source. Part A of the algorithm initializes the matrix "bases" in processor's memory.

Part B of the algorithm implements step 905 and extracts subimages from the raw image "A." In this exemplary algorithm, a group of pixels surrounding each subimage center point, stored in "bases", and the pixel(s) corresponding to the center point form a subimage. The plurality of subimages are stored in the three dimensional matrix "Y".

Parts C through H implement step 907, which as described may be split up into the sequence of steps 951 shown in FIG. 9B. Part C of the algorithm performs step 953 and defines the size of the output high resolution image, including the upsampling amount, and allocates matrices "Zcount" and "Zsum" that will be later used to construct the high resolution image.

Part D of the algorithm performs steps 955 and 957 and computes the fractional pixel displacements between subimages using the optical flow algorithm in the function "ii2." For step 955 the first subimage serves as the reference image while for step 957 displacement measurements are taken between the first subimage and other subimages and stored in vectors "ofm" and "ofn." The displacements correspond to estimations of the spatial dither in the locations of openings in the opaque mask 605, plus any additional dither that may result if the opaque mask 605 is not perfectly aligned with the image sensor 609. The contents of the "bases" matrix, plus these subpixel values, denote the estimated locations of the openings with respect to the grid 751 to a subpixel precision.

Displacement values do not need to be computed every time a new high resolution image is reconstructed since the displacements are a function of the physical camera and not the visual scene. If the camera is adequately rigid through its lifetime, the values in "ofm" and "ofn" may be computed during calibration, stored, and recalled from memory whenever needed. However, calibration may need to be repeated again if the camera deforms or changes shape due to factors such as warping, flexing, or thermal expansion. In such a variation to the exemplary embodiment, the calibration step may be performed with natural scenery or with a calibration pattern designed to help accurately measure the subpixel displacements that make up "ofm" and "ofn." In yet other variations, the values of "ofm" and "ofn" may be based on multiple raw images, to reduce the effects of any corrupting noise in the pixel values.

In order to enable the subpixel displacements to be accurately measured, it is beneficial to perform optical smoothing prior to acquiring the raw image with the pixel array 613. Such optical smoothing allows the effective receptive fields of adjacent pixels in the pixel array 613 to overlap, and thus increase the accuracy of the computations performed in function "ii2." This may be achieved by ensuring that the openings in the opaque mask 605 are approximately equal to the pitch between pixels in pixel array 613. For example, if the pixel pitch is 10 microns, then the openings in the opaque mask 605 may be approximately 10 microns square or larger or smaller. Moreover, the optimal opening size may depend on the nature of the texture in the visual field and may be empirically determined.

Parts E and F of the algorithm implement step 959 and generate a partially filled image "Zbase." Part E upsamples the subimages and deposits them into the matrices "Zsum" and "Zcount" along a lattice displaced by the displacements stored in "ofm" and "ofn." Part F computes an element-wise division of "Zsum" by "Zcount" and stores the result in "Zbase." The variable "Zbase" will have a non-zero value everywhere a subimage pixel was placed, and a zero value for all other pixels. The value "eps" is a small positive constant used to prevent division by zero and instead return a zero when the numerator is zero. Some of the non-zero values may result from one subimage, while others may result from more than one subimage. In the latter case, the resulting pixel is a mean of all contributing values.

In some cases where there is an adequate number of subimages and depending on the contents of "ofm" and "ofn", the subimage Zbase may be filled with non-zero values, either entirely or at least everywhere except near the edges.

Figure 10:
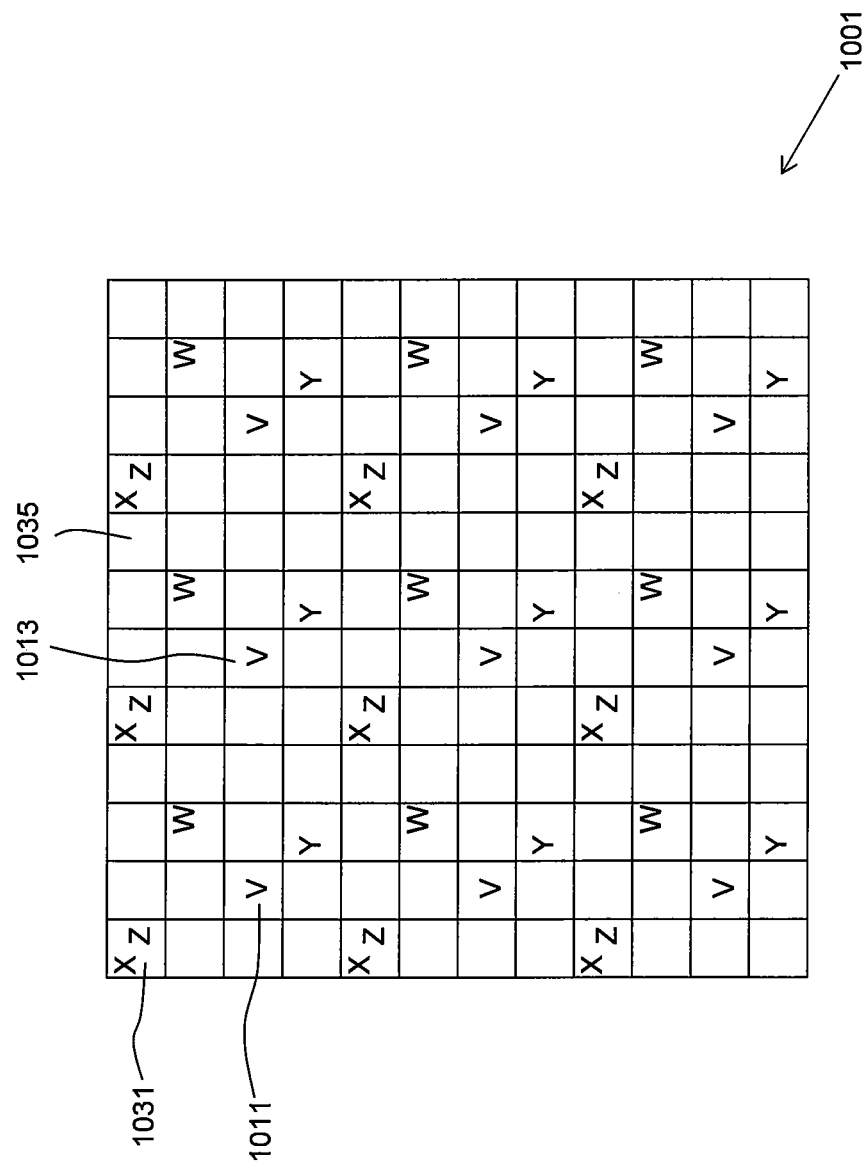
FIG. 10 depicts an exemplary array that may be used to explain the computation of matrices "Zsum", "Zcount", and "Zbase"

FIG. 10 depicts an exemplary array 1001 that may be used for discussion purposes to explain the computation of matrices "Zsum," "Zcount," and "Zbase." This array 1001 shows a hypothetical upsampling by a factor of four (e.g. variable "upsampleamount" equals 4) from subimages having a resolution of 3 by 3 pixels. In this example, the "upsampleamount" value and subimage size are different from those used in the above exemplary algorithm, but are suitable for illustrative purposes in FIG. 10. The letters V, W, X, Y, and Z denote five different subimages as they might be deposited into the array 1001. Array 1001 represents a subset of the entire size of arrays "Zsum," "Zcount," and "Zbase." Let subimage V be the reference image. Take note of location 1011 of subimage V's upper left pixel (e.g. row 1 column 1 of subimage V), which is deposited into location 1011 (row 3, column 2) of array 1001. The location in the array 1001 into which row 1 column 1 of subimage V is deposited may be arbitrarily chosen because subimage V is the reference subimage. Also take note of row 1 column 2 of subimage V, which is deposited into location 1013 (row 3 column 6) of array 1001, as well as the other locations into which pixels of subimage V are deposited. Adjacent pixels of each subimage are deposited into locations of the array 1001 four apart, which corresponds to the value of "upsampleamount" in this example. Wherever a pixel from subimage V is deposited in the array 1001, the corresponding element of "Zsum" is increased by the respective pixel value and the corresponding element of "Zcount" is incremented by one. The other subimages are deposited into array 1001 in the same manner, but shifted according to their displacement with respect to the reference subimage V. Suppose the measured displacement of subimage W with respect to subimage V, as stored in "ofm" and "ofn," is one quarter pixel right and one quarter pixel up. Since the upsampling factor in FIG. 10 is four, the result is that subimage W is deposited into array 1001 displaced one pixel right and one pixel up with respect to where subimage V is deposited. The corresponding elements of "Zsum" and "Zcount" are likewise respectfully increased and incremented as appropriate. The other subimages X, Y, and Z may be deposited into the array 1001 in the same manner.

In this example, some elements of the array 1001 may have been values corresponding to pixels from two or more subimages, for example location 1031. The value of "Zbase" at these locations will be the average of the two pixel values. Other locations may have one pixel value, for example location 1011. The value of "Zbase" at these locations will equal the pixel value. Yet other locations, for example location 1035, may not have any pixel value. The value of "Zbase" at these locations will equal zero, to denote that these locations are unfilled.

Part G of the exemplary algorithm implements step 961 and computes a filled version of "Zbase" and stores the result in matrix "Z." The purpose of this step is to estimate all values of "Zbase" that were not filled in above and hence are still equal to zero, using a value computed based on nearby known pixels. Many different algorithms may be used for this step. One possible method is to use a linear or other interpolation of neighboring known pixels. Another possible method is to use a simulated resistive grid, in which virtual resistors connect adjacent pixels and the filled pixels are set to a potential corresponding to the computed intensity. The resistive grid may then be simulated to compute potentials at other pixels. The resulting potentials at the other pixels would be the corresponding pixel values.

Instead of these two methods just described, the exemplary algorithm listed above implements a growing algorithm, where at each iteration unknown pixels adjacent to a known pixel are set to a weighted average of all adjacent known pixels. The domain of known pixels grows by one pixel per iteration until the array is filled. One may apply an optional smoothing step to smooth ridges between "plateaus" that may result. At this point, the matrix "Z" may be used as the resulting high resolution image and delivered by the processor 611 as the output 617.

Part H of the algorithm implements the optional step 963 of performing an image restoration step to further improve the sharpness of the image. In the exemplary algorithm listed, Part H is implemented using the Lucy-Richardson algorithm. In this case, the resulting matrix "Q" would form the output 617.

The exemplary algorithm may be modified depending on the specific implementation, including the number of openings, the pixel pitch of the image sensor, and the number of subimages generated by the opaque mask. Parameters may need to be changed accordingly, including but not limited to variables and matrices "bases," "upsampleamount," "G," "growits," "kssize," and "psfestimate." Generally, increasing the number of subimages may allow a higher upsamplingamount (e.g. variable "upsampleamount") to be practical.

Another modification to the exemplary algorithm may be made by considering expansion in addition to subpixel shifts between subimages. For example, suppose that the transparent material 607 has a varying thickness, so that the vertical distances from the mask openings to the image sensor 609 are slightly different for each opening. In this case, each subimage stored in "Y" may be different from the others by an expansion parameter in addition to a subpixel shifting. In this case, an "ofe" value corresponding to "expansion" may be computed for each subimage in addition to the "ofm" and "ofn" values computed in Part D. Then in Part E, the depositing of subimages into matrices "Zcount" and "Zsum", may similarly be performed in a manner that accounts for the "ofe" values in addition to the "ofm" and "ofn" values.

A process or algorithm for reconstructing a high resolution image from the raw image obtained by the image sensor 609 may be realized using other implementations known in the art. For example, other superresolution algorithms and resolution enhancement algorithms may be used such as those described or referenced in U.S. Pat. No. 7,248,751. The inversion method introduced in U.S. Pat. No. 7,009,652 and presented above in Equation (2) may also be used.

As a simplistically novel alternative to reconstructing a high resolution image, an image may be rendered by averaging the subimages together. The resolution will not be enhanced, but each pixel of the resulting image will be a mean of the corresponding pixels from the subimages. As a result, the average subimage may have less noise than any of the individual subimages. This may be performed using the MATLAB® code segment below, which can replace Parts C through H of the above exemplary algorithm, and with "Ymean" being the resulting output image.

```
% =====================================================
% Script to compute simple averages of subimages in "Y"
%
Ymean = Y(:,:,1);
for f = 2:yf
    Ymean = Ymean + Y(:,:,f);
end
Ymean = Ymean / yf;
% =====================================================
```

While the above MATLAB script computes an average of the subimages computationally, as a variation, it is also possible to compute the average electronically, by electrically connecting the corresponding pixel circuits. Although this may require more complicated electronic circuitry in the image sensor 609, this method has the advantage that the electrically connected pixel circuits may share the same readout circuit, which may reduce noise due to the need for only one analog to digital conversion per pixel. The reduced number of analog to digital conversions may allow an increased frame rate or the use of a slower analog to digital converter device. Such a configuration may also distribute the parasitic capacitance load of any readout amplifier circuits across multiple pixel circuits and hence improve operation in low light.

Figure 11:
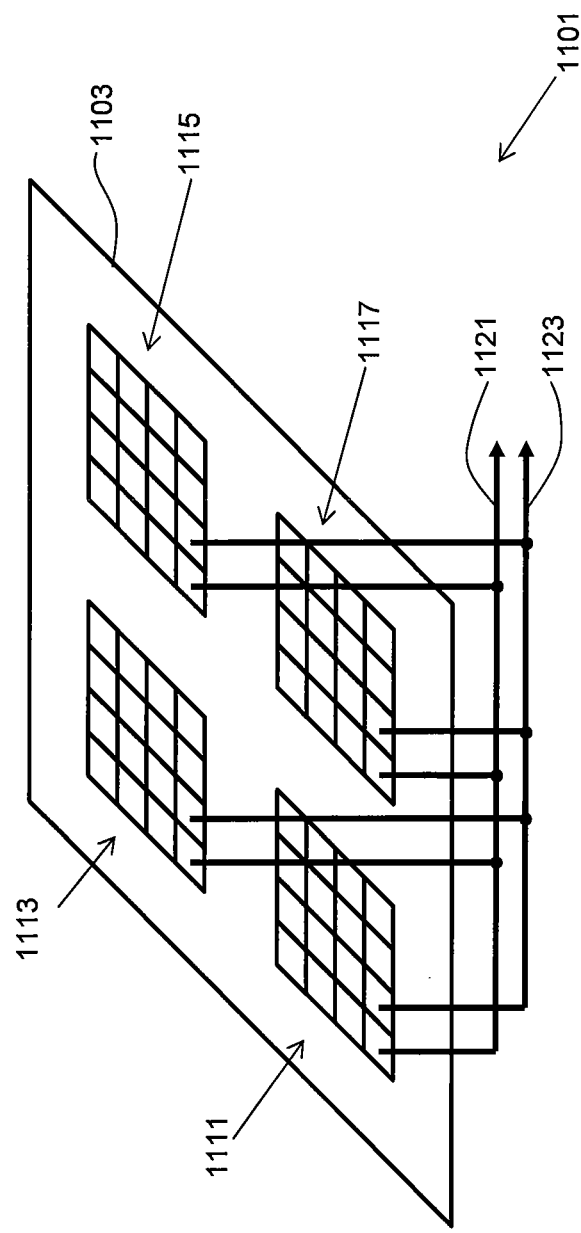
FIG. 11 depicts an exemplary array of electrically connected subpixel circuits.

As an example, FIG. 11 depicts an exemplary array of electrically connected subpixel circuits 1101. This figure shows a focal plane 1103, which may be the surface of an imaging chip, with circuits for four subimages (1111, 1113, 1115, and 1117). In this exemplary embodiment, each subimage is measured by a 4 by 4 array of light sensing circuits. The number of subimages and the resolution of each subimage may be varied from these numbers, which are presented for illustrative purposes only. The focal plane 1103 would be also associated with an optical structure having an opaque mask (not shown) having one opening for each subimage. Also shown are two signals 1121 and 1123. Signal 1121 connects to the bottom left pixel of each subimage circuit and thus may represent the average of these pixels. Signal 1121 may then be amplified or otherwise conditioned and then digitized. Signal 1123 likewise connects to the bottom row, second from the left pixel of each subimage. Fourteen other signals may likewise be defined, but are not shown in the figure for clarity. Each of these sixteen signals (e.g. 1121 and 1123 and the fourteen others) may then be amplified or otherwise conditioned and then digitized. Each of these signals will thus be generated from four times as much light as an individual pixel from just one subimage. The configuration depicted in FIG. 11 therefore allows more light to be collected per pixel while preserving the thickness of the optical structure.

Figure 12:
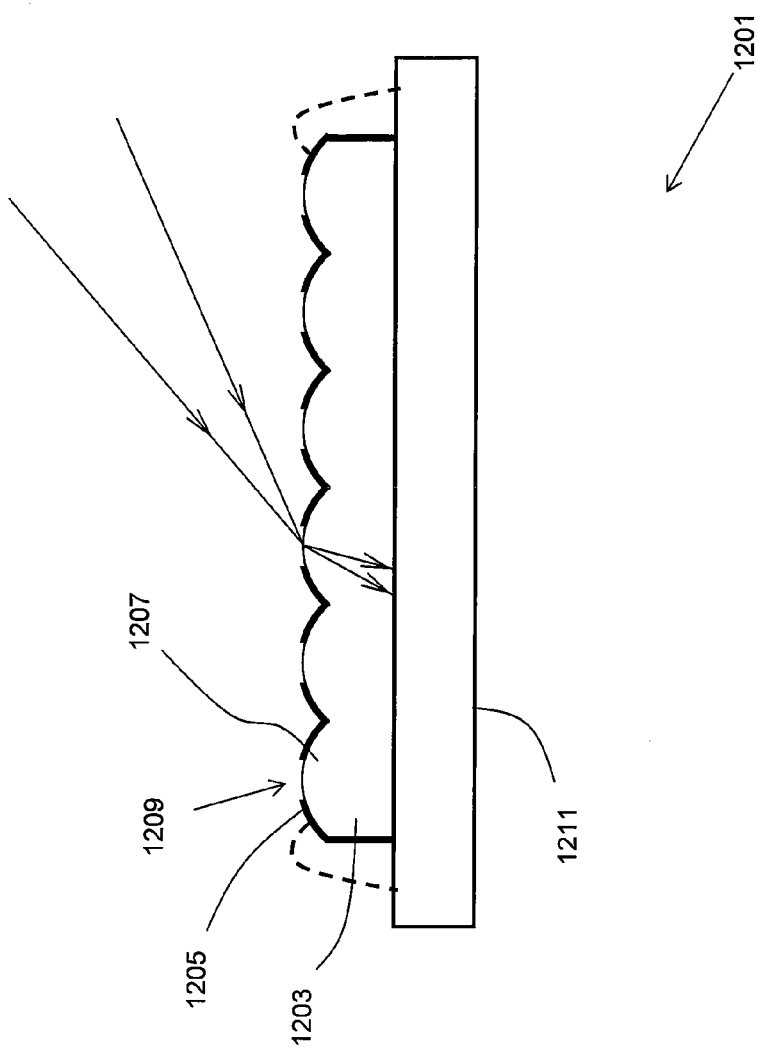
FIG. 12 depicts a cross section of an exemplary low profile camera with a lens bump array.

A number of variations may be made to the exemplary low profile camera 601 depicted in FIG. 6A. FIG. 12 depicts a cross section of an exemplary camera as before but with a lens bump array 1201. Similar to the exemplary camera 601, the exemplary low profile camera 1201 comprises transparent material 1203, an opaque mask 1205, and an image sensor 1211. A processor, not shown, acquires a raw image from the image sensor 1211, reconstructs a high resolution image, and provides the high resolution image as an output. The foregoing components are substantially the same as described above. However, the transparent material 1203 is substantially the same as transparent material 607 of FIG. 6A, except that the side of transparent material 1203 facing the visual field is patterned to have an array of convex surfaces each forming a lens bump or microlens. Each opening in the opaque mask 1205 is positioned relative to the apex of a corresponding lens bump. For example, lens bump 1207 is associated with opening 1209.

The term "lens bump" is used to describe a convex lens that is embedded within a larger piece of transparent material 1203. A "lens bump" may be formed by shaping that portion of the transparent material 1203 to have optical properties comparable to that of a convex lens. Alternatively, such lens bumps may be formed by embedding into or onto the transparent material 1203 small regions of secondary transparent material (not shown) having an even higher index of refraction than the transparent material 1203 that achieves the same effect. An array of such lens bumps may thus be patterned into the transparent material 1203. Alternatively, a lens bump array may be formed by disposing an array of lenses onto the image sensor 1211 in a manner that each lens may project a subimage onto the image sensor 1211. The term "lens element" may be used to refer to individual lens bumps or to individual lenses.

Camera 1201 may be operated similarly to that of the camera 601 of FIG. 6A, including using an algorithm similar to the novel algorithm listed above and shown in FIGS. 9A and 9B. Camera 1201 of FIG. 12 has several advantages. Each lens bump allows additional light to be collected, resulting in a brighter image on the image sensor. As is the case with the exemplary camera 601 of FIG. 6A, the spacing between openings may be balanced with the thickness of the transparent material 1203 and its refractive index to ensure that subimages from adjacent openings do not overlap. The distances between the openings in the opaque mask 1205, the size of the openings, and the thickness of the transparent material 1203 may vary with the specific implementation.

Figure 13:
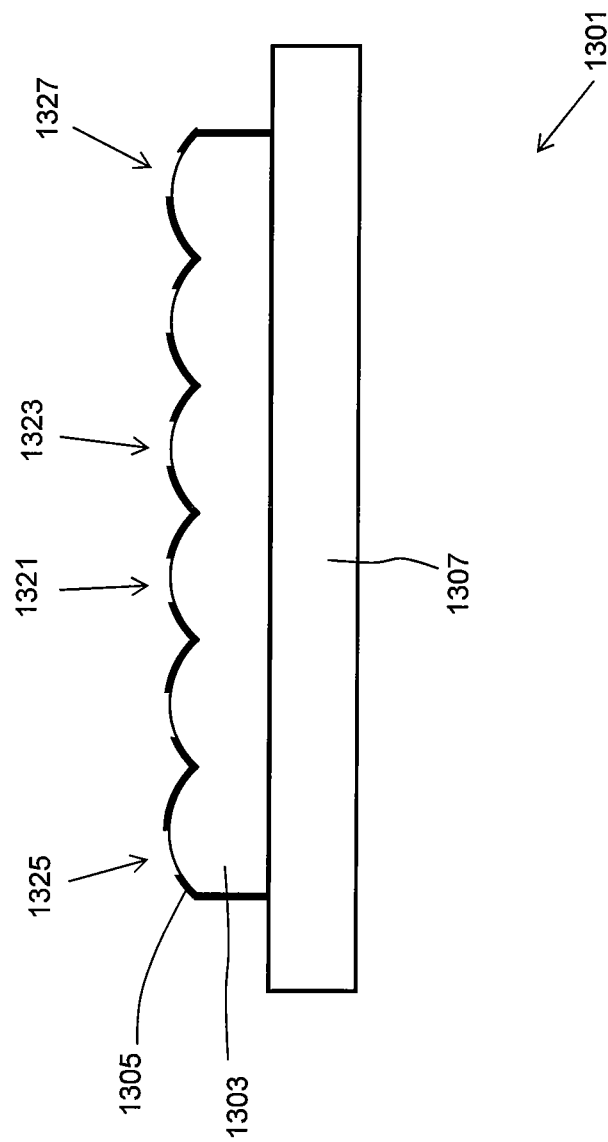
FIG. 13 depicts the cross section of an exemplary low profile camera with lens bumps and off-center openings.

In order to widen the field of view observable by the exemplary camera 1201 of FIG. 12, the locations of the openings in the opaque mask 1205 may be displaced laterally relative to the apex for each individual lens bump. FIG. 13 depicts the cross section of an exemplary low profile camera with a lens bump array and off-center openings 1301. Like the exemplary camera 1201, exemplary camera 1301 comprises transparent material 1303 with lens, an opaque mask 1305 with openings on the lens bumps, an image sensor 1307, and a processor (not shown). In this example, opening 1321 and opening 1323 are substantially centered relative to the apex of the corresponding lens bump on which each opening is formed, while opening 1325 and opening 1327 are off center to widen the total field of view. This arrangement may be configured to allow a full hemisphere field of view to be acquired.

The exemplary camera 1301 will require a modification to the above novel algorithm due to the fact that the individual subimages will sense slightly different portions of the visual field. Opening 1325, for example, may be used to image a portion of the field of view that is left of center. These changes may incorporate techniques including mosaicing algorithms used to stitch overlapping images into a single wide field of view image. The displacement between subimages will be substantially larger than one pixel and may need to be measured for example by using a calibration pattern and prior to the execution of algorithms 901 and 951. The depositing of subimages into the high resolution grid (e.g. 1001 and as performed in Part E) would need to account for these larger displacements between subimages. Image stitching and image mosaicing algorithms are a well known art. Sample algorithms may be found in the book "Image Alignment and Stitching: A Tutorial" by Richard Szeliski, ISBN 1-933019-04-2, originally published in Foundations and Trends in Computer Graphics and Vision Vol. 2 Issue 1 (2006).

Figure 14A:
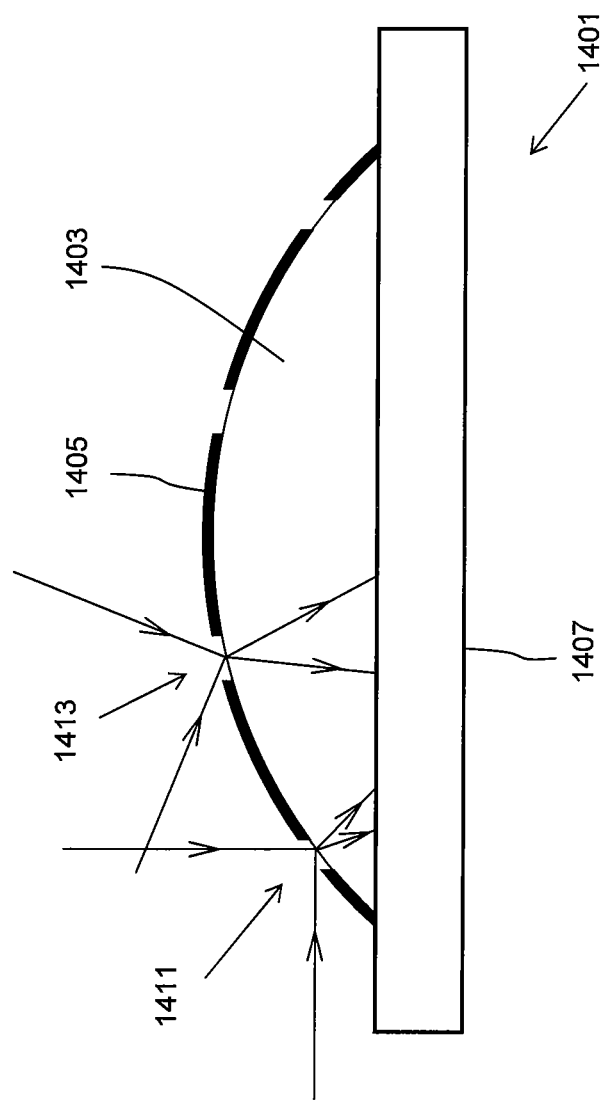
FIG. 14A depicts the cross section of an exemplary low profile camera with a single lens element and multiple openings in the opaque mask.

Another variation to the above teachings is to use a single lens for the entire side of transparent material. FIG. 14A depicts the cross section of an exemplary low profile camera 1401 with a single lens and multiple openings in the opaque mask. This is another variation of the exemplary camera 601 shown in FIG. 6A. The exemplary camera 1401 comprises a lens 1403, an opaque mask 1405 on the lens 1403, and an image sensor 1407. In the exemplary embodiment, the lens 1403 is transparent material shaped in the form of a lens or a similar shape, which is then be placed on the image sensor 1407. The lens 1403 may be formed from a plano convex (PCX) lens of glass or plastic or other transparent material. An opaque mask 1405 is placed onto the surface of the lens 1403 as shown in FIG. 14A. The opaque mask 1405 has several openings. Each opening may be used to image a different part of the visual field. For example, opening 1411 may be used to obtain an image from the leftward direction, while opening 1413 may be used to image a more forward portion of the visual field. The resulting subimages may be stitched together using a variation of the above exemplary algorithm or using one of many image mosaicing algorithms capable of generating a wide field of view image from a plurality of overlapping images.

Shapes other than curves may be used for the lens. For example, the lens may be multifaceted or polyhedral, where the boundary of the lens 1403 is flat at each opening, but oriented at a different angle to image a slightly different portion of the visual field. FIGS. 14B and 14C depict cross sections of alternative lens structures. FIG. 14B illustrates camera 1451 where the transparent material 1453 and an opaque mask 1455 have a cross section in the shape of a triangle. The cross section shows two openings associated with the two flat facets covered by the opaque mask 1455. Camera 1471 of FIG. 14C is similar except that the cross section of the transparent material 1473 and the opaque mask 1475 is trapezoidal shaped, and there are three openings in the cross section of opaque mask 1475. In a three dimensional view, the transparent material 1453 and 1473 may be respectively shaped like a pyramid and a truncated pyramid.

It is also possible to widen the field of view of exemplary multiple opening low profile camera 601 using the same technique as shown in FIG. 5D. A lens may be placed directly on top of the opaque mask 605. Different openings in the opaque mask 605 will then image slightly different portions of the field of view. All of the subimages may then be stitched together to reconstruct a single image with a wider field of view.

Figure 15:
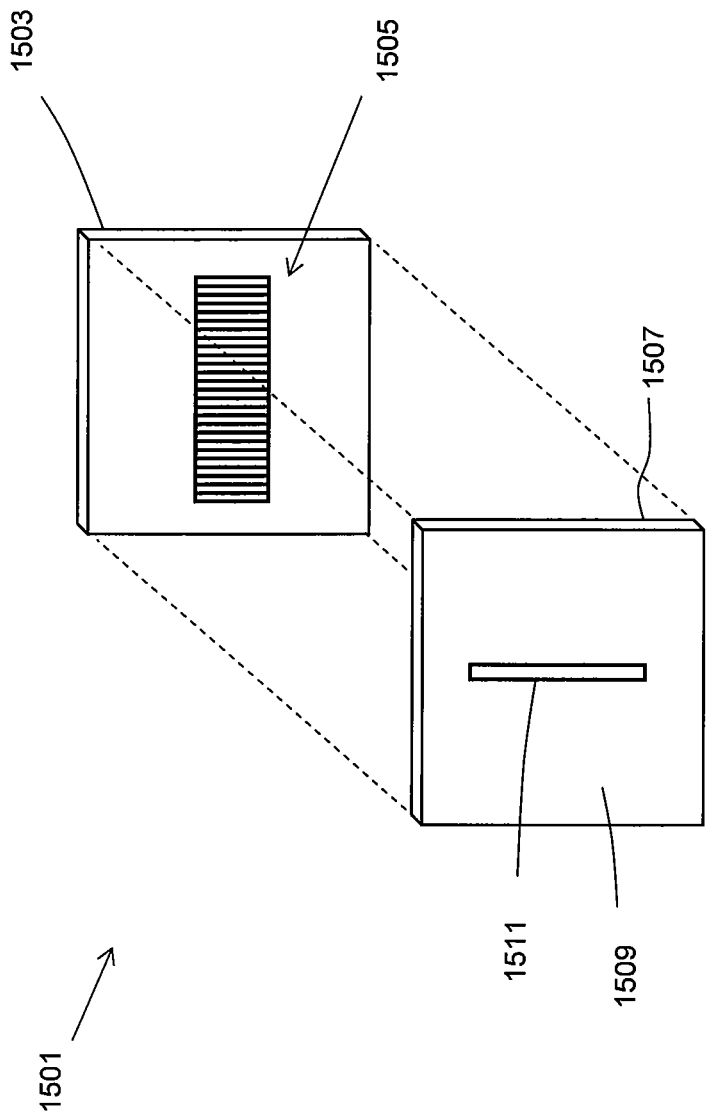
FIG. 15 depicts an exploded view of an exemplary low profile linear camera.

FIG. 15 depicts an exploded view of an exemplary low profile linear camera 1501. Camera 1501 combines the benefits of the camera 501 of FIG. 5A above with that of U.S. Pat. No. 6,194,695 entitled "Photoreceptor array for linear optical flow measurement" and incorporated herein by reference in its entirety. The camera 1501 comprises an image sensor 1503 having a linear pixel array 1505, transparent material 1507, and an opaque mask 1509, much like the exemplary cameras described above. The camera 1501 may also include a processor (not shown) to operate the image sensor 1503 and acquire image data from the linear pixel array 1505. In the exemplary camera 1501, the opaque mask 1509 has a rectangular shaped opening 1511. In the exemplary camera 1501, transparent material 1507 may be flush against the image sensor 1503 and produce a cross section view similar to that shown in FIG. 5A above. In FIG. 15, the opening 1511 is rectangular so as to blur the acquired image in the vertical direction but preserve information in the horizontal direction. The rectangular opening 1511 may optionally extend vertically all the way to the top and the bottom of the opaque mask 1509, since due to Snell's law light reaching one pixel circuit will have traveled through only the section of the opening within critical angle $\theta_c$.

The linear pixel array 1505 may comprise an array of rectangular pixel circuits as shown, or may comprise a linear array of point shaped pixel circuits, as discussed in U.S. Pat. No. 6,194,695. The camera 1501 of FIG. 15 is capable of acquiring substantially one dimensional images, such as those that may be used to measure visual motion or optical flow along one axis. One dimensional optical flow may then be computed using a substantially slower processor than is possible computing two dimensional optical flow on a two dimensional pixel array. This is due to the fact that one dimensional optical flow algorithms often require fewer arithmetic operations per pixel than two dimensional algorithms, and due to the fact that there are fewer pixels to be processed. The processor may include such an optical flow algorithm to generate a linear optical flow measurement based on the image acquired by the linear pixel array 1505.

Camera 1501 has the substantial advantage that both the opening 1511 and the light sensing circuits in the pixel array 1505 may be larger than their corresponding parts in FIG. 5A. This configuration allows each pixel circuit to acquire more light. The linear camera 1501 is therefore potentially more useful in lower light environments. For example, suppose the opening 1511 is rectangular shaped with the dimensions of 10 microns wide by 100 microns long. Suppose also that the shape of a pixel circuit in the pixel array 1505 is also 10 microns wide by 100 microns long. Such a rectangular pixel placed underneath such a rectangular opening will receive one hundred times as much light as a camera of the type shown in FIG. 5A having a 10 micron by 10 micron opening and a 10 micron by 10 micron individual pixel circuit.

Figure 16:
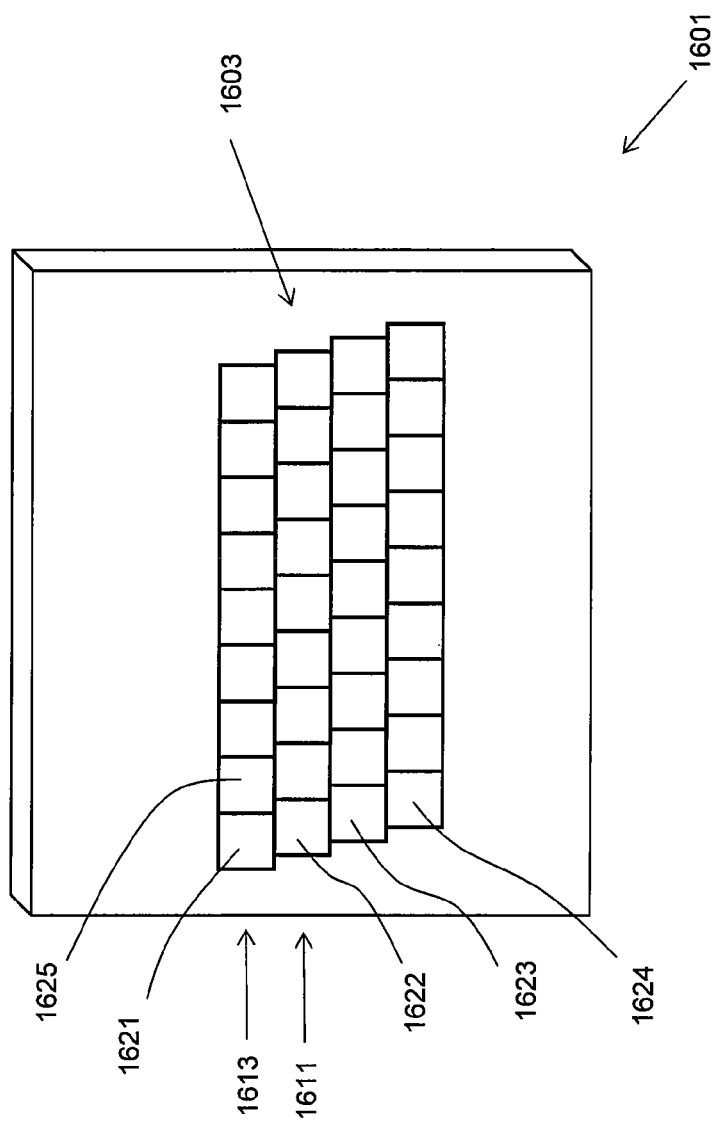
FIG. 16 depicts an exemplary image sensor with shifted pixel rows.

In order to increase the number of pixels in the horizontal direction, alternative pixel layouts may be used. FIG. 16 depicts an exemplary image sensor with shifted pixel rows 1601. This image sensor 1601 may be used in place of the image sensor 1503 of FIG. 15. The pixel array 1603 is similar to a conventional two dimensional pixel array, except that one row of pixels may be shifted horizontally with respect to another row. In FIG. 16, pixel row 1611 is shifted a quarter of a pixel to the right of pixel row 1613. The four rows of pixels shown may be used to achieve four times the pixel resolution as a single row. For example, the first five pixels of the resulting image may be formed respectively from pixels 1621, 1622, 1623, 1624, and 1625. The one dimensional image constructed as such from the pixel array 1603 may optionally be sharpened with an image restoration algorithm such as the Lucy-Richardson algorithm mentioned above.

Figure 17:
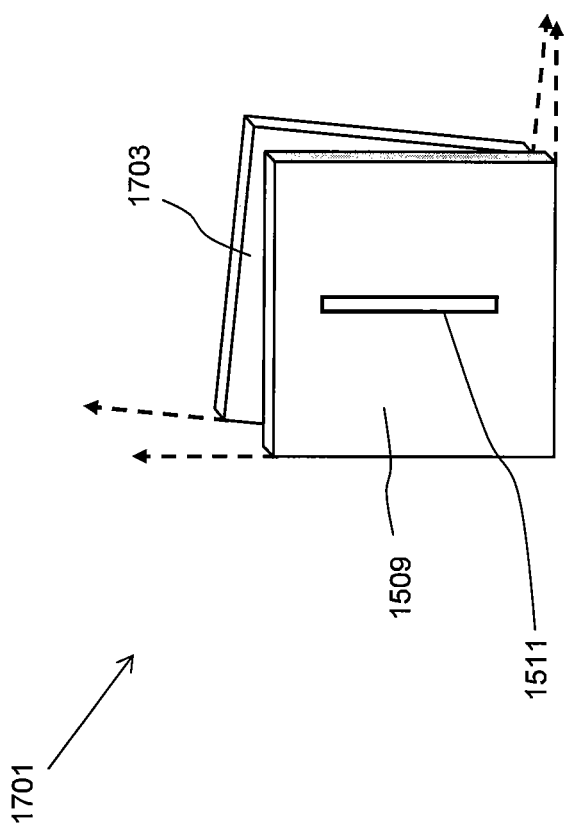
FIG. 17 illustrates the opaque mask of FIG. 15 and an image sensor rotated with respect to each other.

Alternatively, an effect similar to that of FIG. 16 may be obtained by using a standard two dimensional image sensor that has a standard square pixel geometry. FIG. 17 illustrates the opaque mask 1509 of FIG. 15 and an image sensor 1703 rotated with respect to one another. An effect of this rotation is that from the perspective of the opening 1511, one row of pixels will appear shifted with respect to an adjacent row. Note that this approach may also be applied to the exemplary camera 601 of FIG. 6A to implement spatial dithering in the locations of openings in the opaque mask 605.

Figure 18:
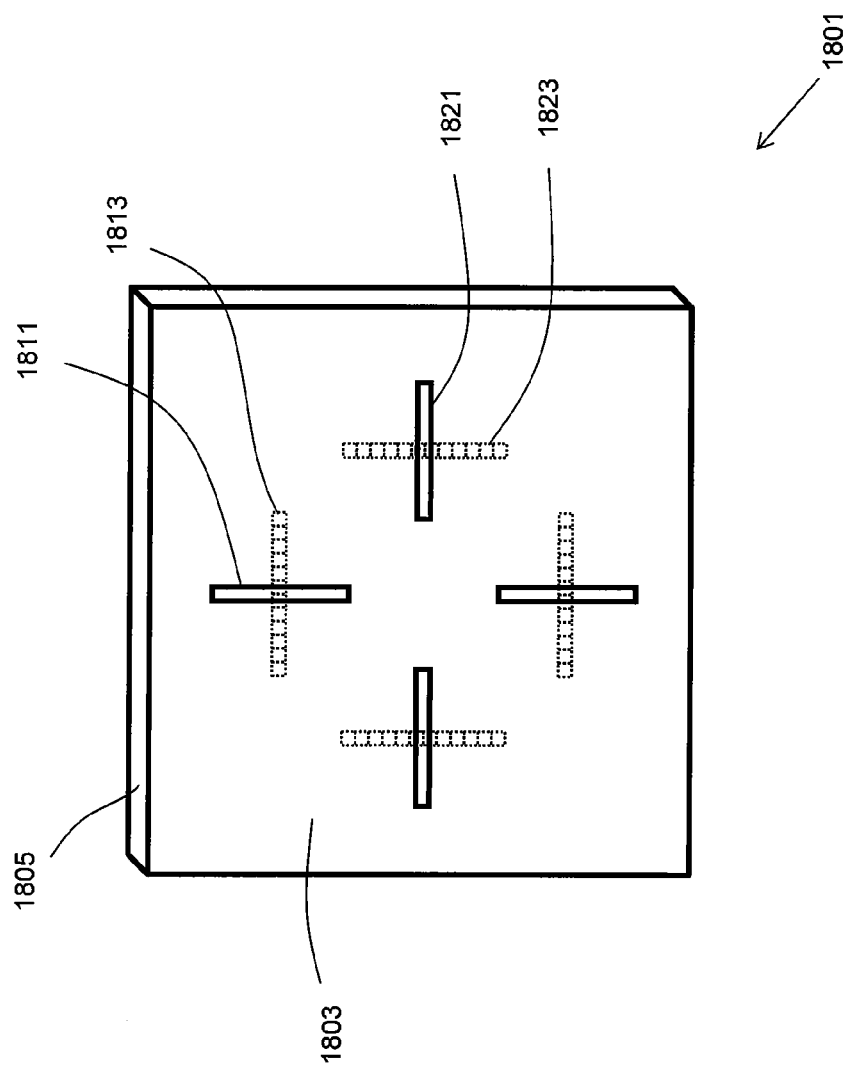
FIG. 18 illustrates an exemplary optical structure with both horizontal rectangular openings and vertical rectangular openings.

The concept of linear camera 1501 of FIG. 15 can be expanded. For example, FIG. 18 illustrates an exemplary optical structure 1801 with both horizontal rectangular openings and vertical rectangular openings. This optical structure contains an opaque mask 1803 on transparent material 1805, much like optical structures discussed above. However the opaque mask 1803 contains multiple openings oriented in different directions. This includes, for example, vertical opening 1811 and horizontal opening 1821 which are respectively placed above a horizontal array of pixels 1813 and a vertical array of pixels 1823. These openings may be similar to the opening 1511 of FIG. 15 in that they are rectangular shaped. If an image sensor is placed underneath the piece of transparent material 1805, arrays of pixels may be oriented underneath the openings to implement linear pixel arrays having the same function and capabilities as pixel array 1505 of FIG. 15. For example, underneath each vertical opening (for example opening 1811) could be an array of horizontal pixel circuits (for example the horizontal array of pixels 1813). These horizontal pixel circuits would output pixel values that could be used to sense the visual field in the horizontal direction, for example to compute optical flow in the horizontal direction. Likewise a vertical array of pixels (for example the vertical array of pixels 1823) could be placed underneath the horizontal opening (for example opening 1821) to sense visual information in the vertical direction including, for example, measuring optical flow in the vertical direction.

The exemplary optical structure 1801 of FIG. 18 may therefore allow two dimensional optical flow to be measured in components. The vertical opening 1811 may be used to compute the horizontal component of optical flow, while the horizontal opening 1821 may be used to compute the vertical component. These two components may then be combined to form a two dimensional optical flow measurement. Depending on the algorithm used, the number of arithmetic operations required to compute the one dimensional optical flow measurements may be substantially less than that required to compute a direct two dimensional optical flow measurement from a two dimensional grid of pixels. Processor memory requirements and analog to digital conversion (ADC) rates may be similarly reduced.

Alternatively, dedicated circuitry may be embedded on the image sensor to acquire the pixel values from the arrays of pixels and generate these optical flow measurements, or any other measurements that may be needed. Such measurements may then be output from the image sensor in analog or digital or whatever form is needed by an application. The combination of such an optical structure and an image sensor having these additional circuits would produce an extremely compact sensor.

A camera using the exemplary optical structure 1801 of FIG. 18 is essentially an array version of the exemplary camera 1501 of FIG. 15, except with some portions arranged to sense vertical information and other portions arranged to sense horizontal information. The image sensor may be constructed specifically for optical structure 1805, with configurations for pixel circuits and openings chosen together. Such an image sensor may have empty spaces between pixel arrays that may be filled with other circuits. Alternatively a standard two dimensional image sensor may be used, and only those pixels that are needed may be acquired and processed.

Figure 19:
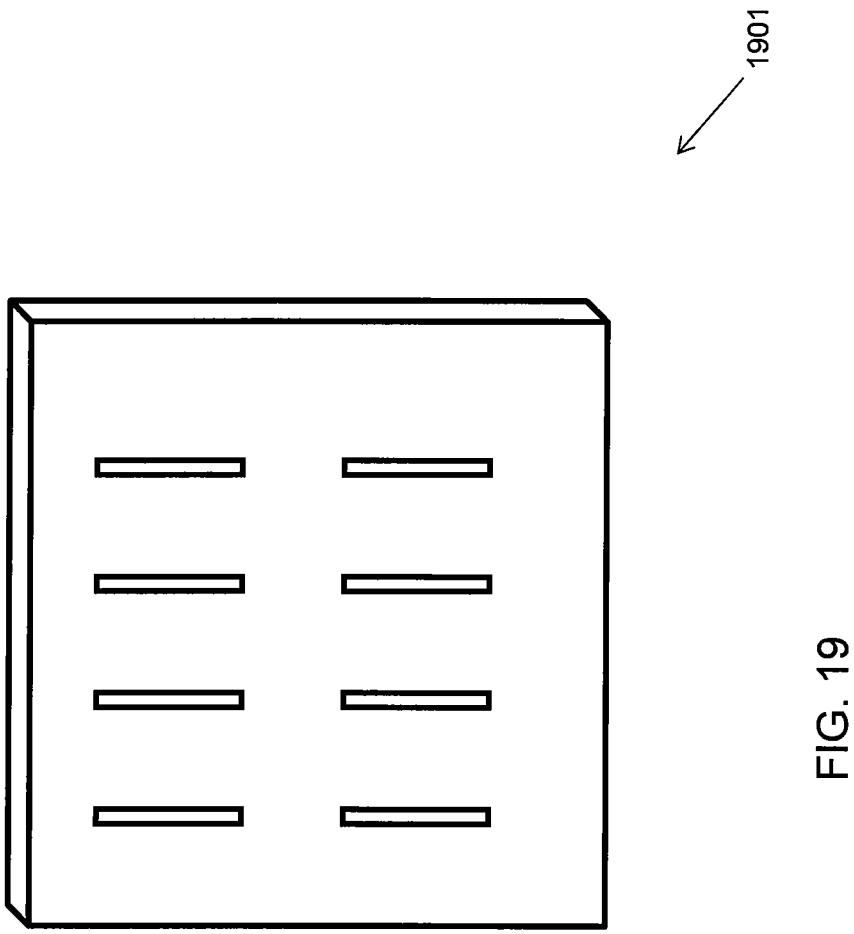
FIG. 19 depicts an exemplary optical structure having an array of rectangular openings in the opaque mask.

Another variation of the exemplary camera 1501 of FIG. 15 combines the benefits of the linear camera of FIG. 15 with the multiple opening opaque mask 605 depicted in FIG. 6A. FIG. 19 depicts an exemplary optical structure 1901 having an array of rectangular openings in the opaque mask. An image sensor with an array of pixel circuits (not shown) may be designed to be placed underneath the opaque mask 1901 to acquire a raw image. Spatial dither may be applied to the locations of rectangular openings in mask 1901 in a manner similar to that depicted above in FIG. 7B. A one dimensional version of the algorithms 901 and 951 shown in FIGS. 9A and 9B may then be used to reconstruct a high resolution linear image from the raw image.

Alternatively, the rectangular openings in exemplary optical structure 1901 may be located close together so that their respective subimages overlap. A single pixel located at the intersection of these subimages would receive light from all of the rectangular openings. Equivalently, the amount of light striking the pixel would be an inner product of the visual field and a receptive function corresponding to the multiple rectangles. Different pixels underneath the exemplary optical structure 1901 would sense the inner product between the visual field and a similar receptive function projected in a different direction.

A low profile linear flat camera may be realized using any other implementations known in the art and the description presented herein is for illustration purposes and does not limit the scope of the present teaching. For example, the openings in the opaque mask may be an elongated shape other than a rectangle. Sample elongated shapes include an ellipse that is substantially longer than it is wide, or a diamond or another polygon that is substantially longer than it is wide.

A variation of the above teachings is to use a multiple opening camera as a stereo ranging device to measure the distance to a nearby object. Consider the following example using the exemplary multiple opening camera 601 of FIG. 6A. Suppose that through either a calibration step or through repeated imaging of distant objects, the subimage displacements "ofm" and "ofn" become known and reliable. Suppose next the exemplary camera 601 images a nearby object. The measured subimage displacements "ofm" and "ofn" will change, and do so in a manner dependent on the distance between the exemplary camera 601 and the nearby object being imaged. Measurement of the resulting disparity between the original subimage displacements and the subimage displacements due to the nearby object may be used to measure the distance between the camera 601 and the nearby object. The measured distance would be a function of the thickness of the transparent material 607, the pitch between pixels on the image sensor 609, the distance between the openings on the opaque mask 605, and the difference between the "ofm" and "ofn" values obtained imaging a far away object and these values obtained when imaging a nearby object. Using the new measured subimage disparities, in some cases a high resolution image may be reconstructed using essentially the same algorithms 901 and 951 above. For example, suppose that s is the distance between two openings in the opaque mask 605, t is the thickness of the transparent material 607, p is the pitch between adjacent pixels on the image sensor 609, $n_1$ is the index of refraction of the surrounding environment, and $n_2$ is the index of refraction of the transparent material 607. Suppose $ofm_1$ and $ofn_1$ are the disparities between the subimages associated with the two openings when viewing an infinitely far background. Suppose $ofm_2$ and $ofn_2$ are the disparities between the subimages associated with the same two openings measured when viewing a nearby object. Then the total change in disparity ΔOF in pixels is:

$$\Delta OF = \sqrt{(ofm_1 - ofm_2)^2 + (ofn_1 - ofn_2)^2}. \quad (6)$$

A first order approximation of the distance d to the nearby object may be obtained with:

$$d \approx \frac{stn_1}{(\Delta OF)pn_2}. \quad (7)$$

Equations (6) and (7) are written for pixel arrays arranged in a square grid and assume that ΔOF accounts for both whole and fractional changes in disparity, including when the object is close enough for the disparity to change by more than one pixel. When measuring the four disparities $ofm_1$, $ofn_1$, $ofm_2$, and $ofn_2$, it may be beneficial to use only the center of the field of view and/or only the region of the field of view occupied by the nearby object. This may minimize the effects of distortion and/or any pixel information not associated with the nearby object.

A related variation is to use a multiple opening camera as a miniature light field camera or a plenoptic camera. The subimage of each opening in the opaque mask would be a two dimensional image of the environment as seen from the perspective of the respective opening.

The above teachings may be used to fabricate inexpensive cameras for use in a variety of applications. As described above, the optical structure including the opaque mask may be fabricated inexpensively and in bulk using photoplotter printers, a mature existing technology. These optical assemblies may be printed in bulk, physically cut, and mounted onto image sensors. Using clear adhesive between the optical structure and the image sensor, or using adhesive at the edge of the optical structure, the optical structure may be mounted to the imager using standard manufacturing equipment or even by hand. Because in some embodiments the optical apparatus need not be precisely placed, this method is appropriate for use in manufacturing inexpensive camera sensors for mass consumer applications.

Figure 20:
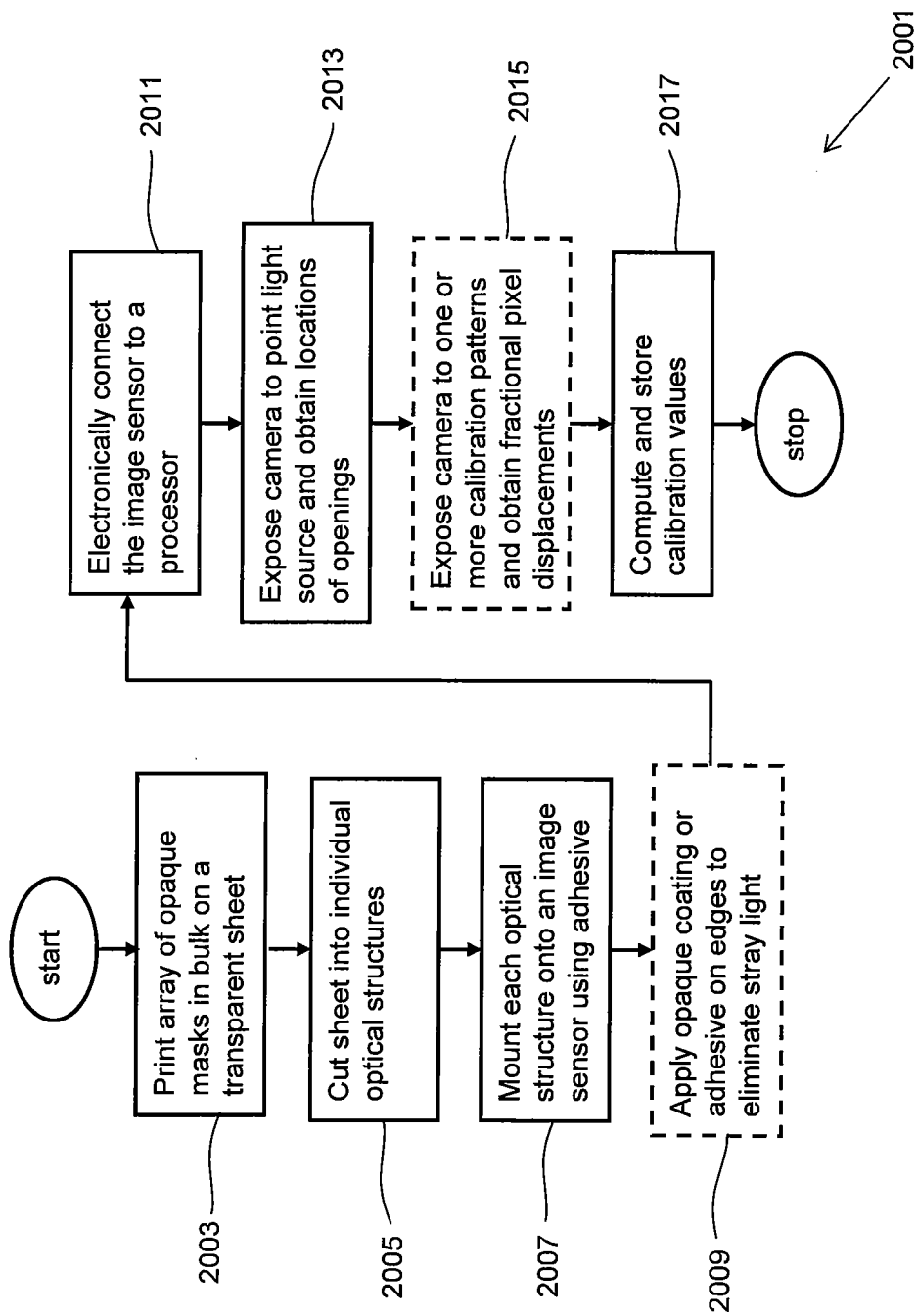
FIG. 20 depicts a method for manufacturing low profile cameras.

FIG. 20 depicts a method 2001 for manufacturing low profile cameras using the above teachings. This process assumes that a large number of image sensors has already been manufactured using well known and established techniques. The steps have already been described above; they will be described again below.

Figure 21A:
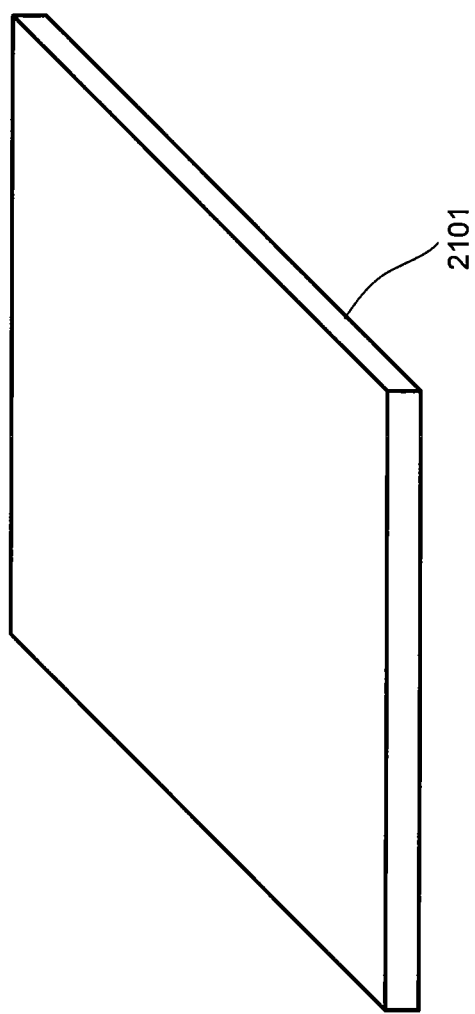
FIG. 21A shows a transparent sheet.
Figure 21B:
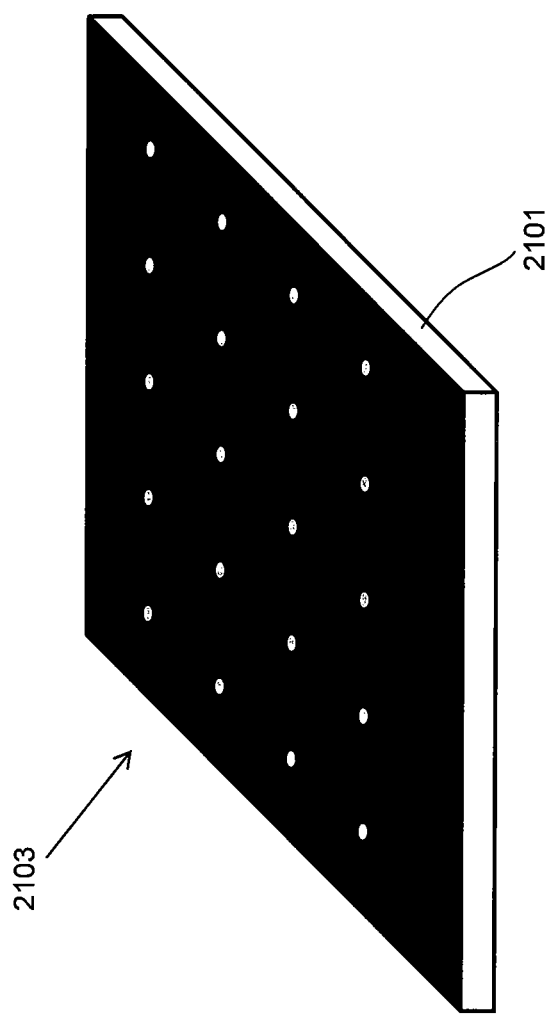
FIG. 21B shows an array of opaque masks printed onto the transparent sheet.

The first step 2003 is to print an array of opaque masks onto a transparent sheet. FIG. 21A shows a transparent sheet 2101. This sheet may be any transparent material, but the flexible nature of plastic makes it a suitable choice. FIG. 21B shows an array of opaque masks 2103 printed onto the transparent sheet 2101. In the example shown in FIG. 21B, each mask has a single opening and is suitable for making a camera such as the camera 501 of FIG. 5A. If method 2001 is being used to manufacture low profile cameras with multiple openings such as camera 601 of FIG. 6A, then each single opening of the array 2103 would be replaced with an array of openings in a manner depicted in FIG. 6B.

Figure 21C:
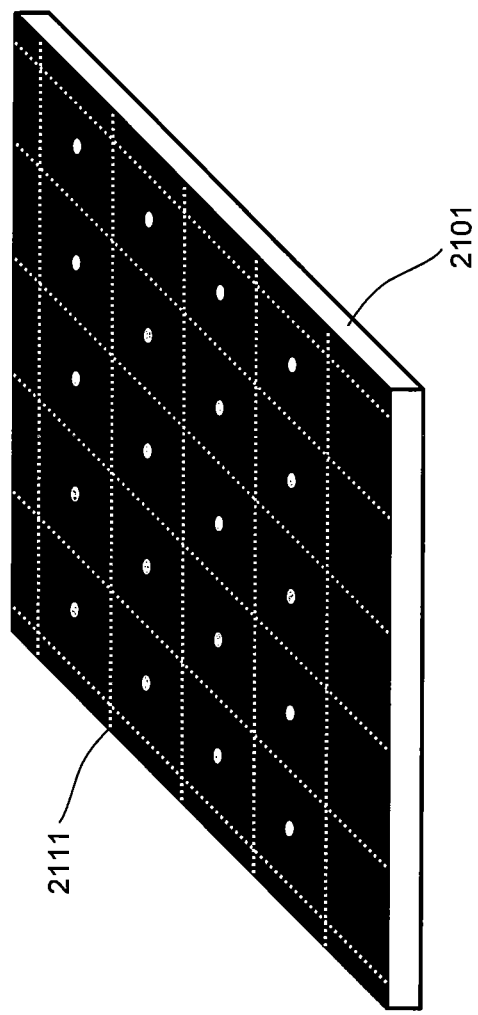
FIG. 21C shows a grid of scribe lines that may be used to guide where the sheet is cut.
Figure 21D:
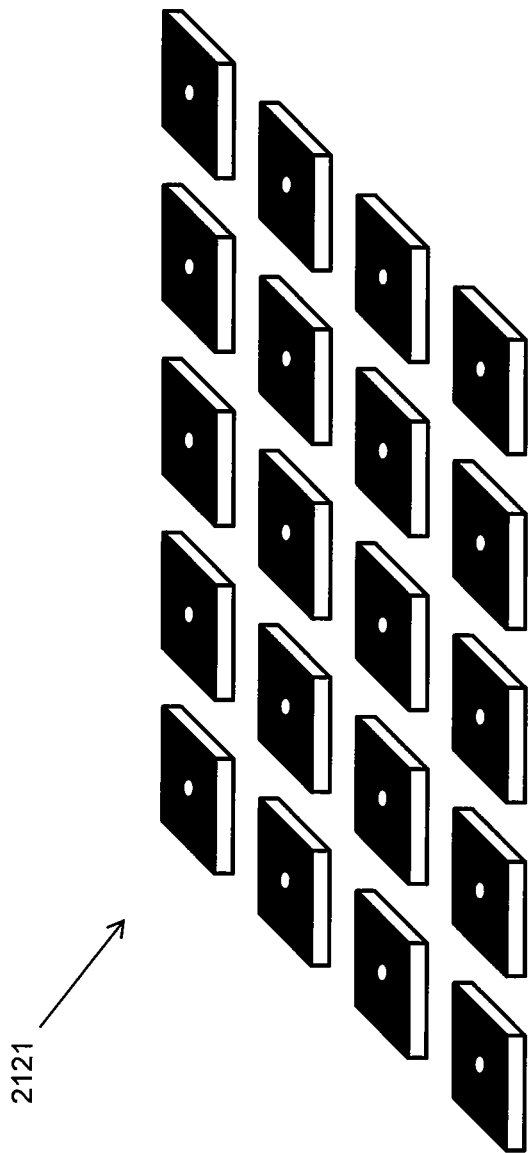
FIG. 21D shows the plurality of optical structures that results from cutting the sheet.

The second step 2005 is to cut up the sheet 2101 into individual optical structures. FIG. 21C shows a grid of scribe lines that may be used to guide where the sheet 2101 is cut. The scribe lines are shown as dotted white lines in the figure, for example scribe line 2111 that defines a cut between two rows of masks. FIG. 21D shows the plurality optical structures 2121 that results from cutting the sheet 2101, with each optical structure comprising transparent material and an opaque mask with an opening. Each of these optical structures is equivalent to optical structure 503 of FIG. 5A (or optical structure 603 of FIG. 6A, in the case where method 2001 is being used to manufacture low profile cameras with multiple openings). Portions of the sheet 2101 at the edges and not having any openings in the opaque mask are waste material and may be discarded.

Figure 21E:
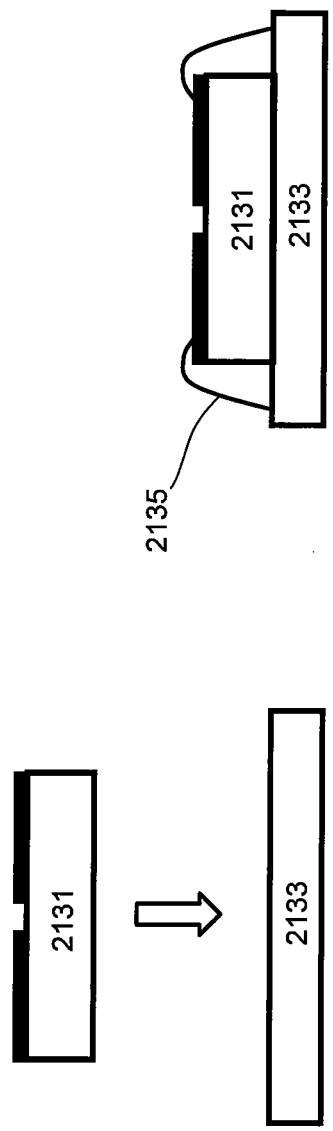
FIG. 21E shows an optical structure being mounted onto an image sensor using edge adhesive.

The third step 2007 is to mount each optical structure onto an image sensor using adhesive. Two possible methods of implementing step 2007 are discussed, one using edge adhesive and one using transparent adhesive between the two parts. FIG. 21E shows an optical structure 2131 being mounted onto an image sensor 2133 using edge adhesive. Optical structure 2131 may be taken from the plurality of optical structures 2121 and then placed directly on top of the image sensor 2133. Adhesive 2135 is then deposited at the edges of the optical structure 2131 to hold it to the image sensor 2133. As described above, it is beneficial for the adhesive 2135 to be opaque so that is prevents light from entering the optical structure 2131 from the side.

Figure 21F:
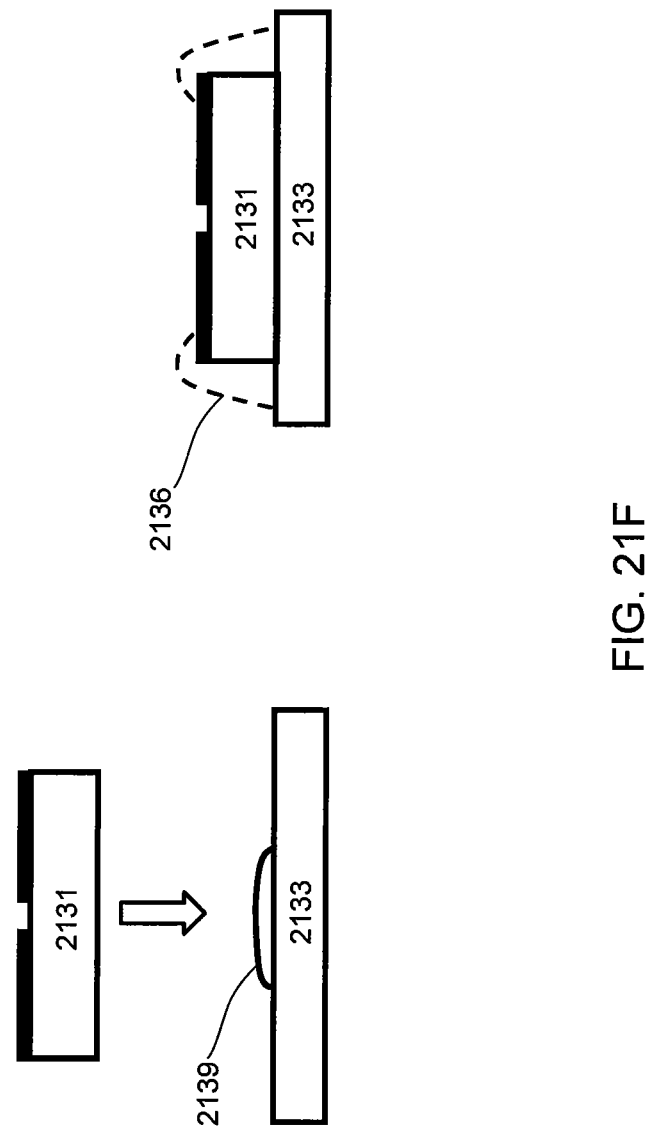
FIG. 21F shows the optical structure being mounted onto the image sensor using transparent adhesive.

Alternatively, FIG. 21F shows the optical structure 2131 being mounted onto the image sensor 2133 using transparent adhesive 2139. First a drop of transparent adhesive 2139 is deposited on the image sensor 2133. Next the optical structure 2131 is pressed down onto the image sensor 2133 with enough force to spread the adhesive across the entire contact surface. The adhesive is then cured or allowed to cure.

The fourth step 2009 is optional and depends on the application and the method of mounting the optical structure to the image sensor. If needed, opaque material may be applied to the edges of the transparent material to prevent light from entering the optical structure from the side, as depicted initially in FIG. 5A. This is also depicted as opaque material 2136 shown in FIG. 21F. Step 2009 is generally beneficial if the method of implementing previous step 2007 allows light to enter the optical structure from the side. However if the resulting camera will be further enclosed in an opaque housing (such as shown in FIG. 5F) that prevents such stray light from entering the optical structure from the side, step 2009 may be skipped.

Figure 21G:
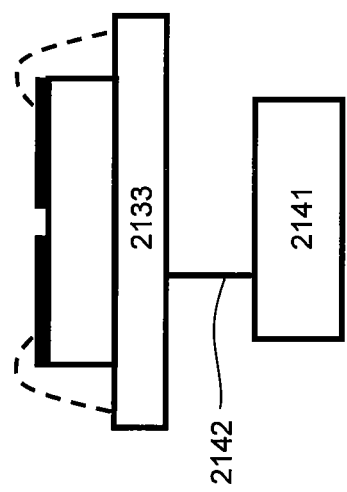
FIG. 21G shows the image sensor electrically connected to a processor via an electronic connection.

The fifth step 2011 is to electronically connect the image sensor to a processor. FIG. 21G shows the image sensor 2133 electrically connected to a processor 2141 via an electronic connection 2142. Depending on the specific implementation, the electronic connection 2142 may be formed from a combination of wire bonds, bump bonds, and/or conductive traces on a circuit board.

The sixth step 2013 is to expose the camera to a point light source to obtain the locations of openings in the opaque mask to whole pixel accuracy. This may be performed as described above with FIG. 8B. This step is beneficial if the opaque mask has multiple openings, such as in any variations of the exemplary multiple opening low profile camera 601 of FIG. 6A. An exception is if step 2007 is performed with enough precision to reliably place the openings in known locations. If the opaque mask has just one opening, for example to implement a variation of the camera 501 of FIG. 5A, then step 2013 is not required but may still be beneficial so that the location of the image formed through the opening is known accurately.

The seventh step 2015 is to expose the camera to one or more calibration patterns, and then use an optical flow algorithm (or similar algorithm) to measure subpixel displacements. This step may be performed as a manufacturing step. It may optionally be omitted if this step will be performed during program execution, such as described in Part D of the above exemplary algorithm.

The final step 2017 is to store all computed calibration values, including those of step 2013 and optional step 2015, into the processor's memory. These values may then be used later on during runtime. Other calibration values, for example fixed pattern noise masks, may be computed and stored as well at this time.

In some implementations, the image sensor and the processor may be mounted on a circuit board or similar substrate. In this case, it may be beneficial to mount these two components to the circuit board before the optical structure is mounted on the image sensor. In this case, step 2011 may be performed before step 2007 instead of before step 2013.

The above exemplary embodiments generally describe optical structures constructed from transparent material and an opaque mask that is then placed onto an imaging chip. Alternatively, one may instead print the opaque mask directly onto an image sensor. This variation may be applied if the image sensor or its light sensing circuitry is already enclosed or encapsulated within a transparent material. This variation would be an inexpensive additional step to existing processes to manufacture and package image sensors. For example, if the image sensors are packaged at the wafer level before cutting into individual image sensor devices, the additional step of printing the opaque mask on the wafer may be performed before the wafer is cut.

Note that a method for manufacturing low profile cameras may be realized using any other implementations known in the art and the description presented herein is for illustration purposes and does not limit the scope of the present teaching.

Figure 22:
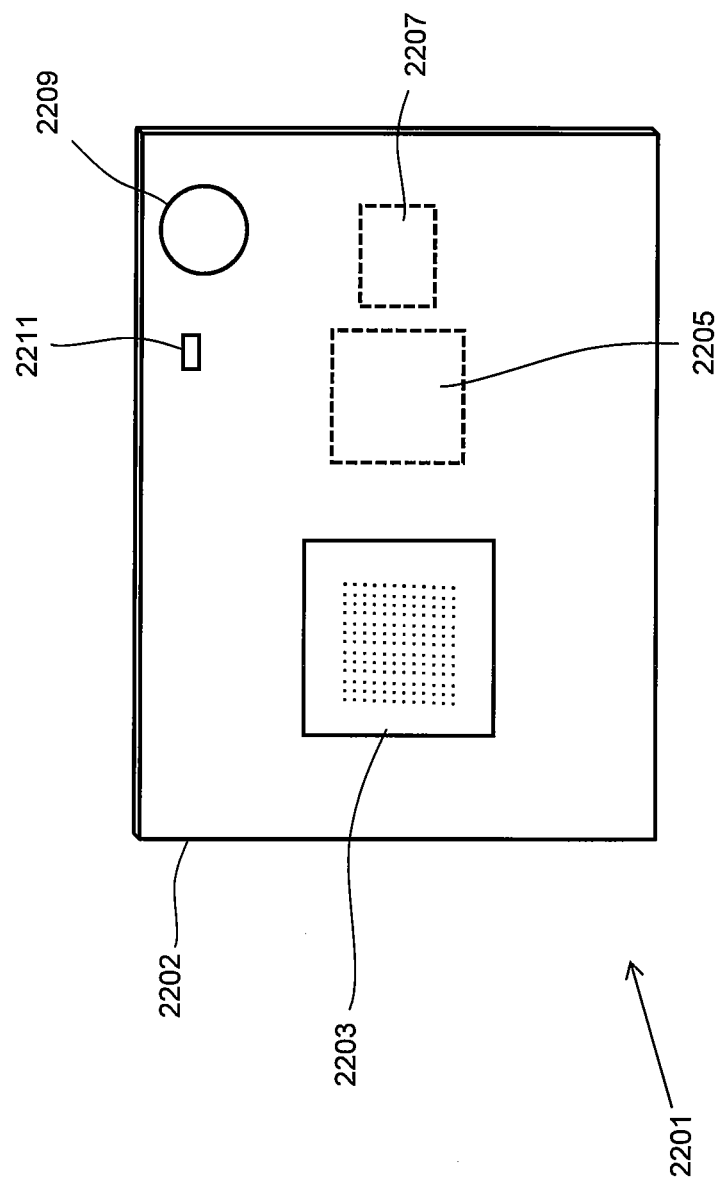
FIG. 22 shows a credit card sized digital camera.

The above teachings may be used to implement a digital camera for consumer use. FIG. 22 shows a credit card sized digital camera 2201 that may be implemented using the above teachings, in particular those associated with the exemplary multiple opening low profile camera 601 of FIG. 6A. Camera 2201 comprises a camera body 2202, an optical structure 2203 having an opaque mask having multiple openings, an image sensor (not shown) located directly underneath the optical structure 2203, a processor 2205, non-volatile memory 2207, a trigger button 2209, and an LED flash 2211. The processor 2205 and the non-volatile memory 2207 may be embedded inside the camera body 2202 and not visible from the outside. Trigger button 2209 and LED flash 2211 may be implemented substantially flush with the camera body 2202. When trigger button 2209 is pressed, LED flash 2211 may light up if necessary to provide light and then the image sensor underneath the optical structure 2203 may then acquire a raw image. The raw image would be formed from light passing through the opaque mask in the optical structure 2203 and may be similar to image 801 depicted in FIG. 8A. The processor 2205 would then extract subimages from the raw image and reconstruct a high resolution image from the subimages using any appropriate algorithm, for example algorithm 901 of FIG. 9A. The reconstructed image may then be stored on the non-volatile memory 2207 for later retrieval. Optionally the processor 2205 may just acquire the raw image taken by the image sensor and record it directly to the non-volatile memory 2207, and a high resolution image may be reconstructed at a later time with a separate personal computer (not shown). An optional liquid crystal or other display (not shown), located on the reverse side of camera 2201, may be used to help the user aim the camera and select when to press the trigger button 2209. Using the above teachings, it would be possible to implement the digital camera 2201 in a package similar in size to a credit card, for example 85 mm wide, 54 mm high, and less than a millimeter thick. The digital camera 2201 may be implemented in other form factors as well, for example in the size of a button to implement a spy camera.

The above exemplary cameras may be configured to sense and extract information from the environment in a real-time manner. For example, the cameras may acquire imagery, including one dimensional images, that may then be processed by optical flow algorithms or stereo algorithms or other algorithms. Such cameras may also be referred to as "visual sensors." The outputs of these algorithms may be used for a wide variety of applications, for example including but not limited to: providing inexpensive vision sensing to toys or consumer robots such as robotic vacuum cleaners, monitoring an area for moving people or vehicles, counting the number of people, vehicles, or other objects passing by a location, and so forth. The low profile of such cameras would make then suitable for various robotic platforms, and may, for example, provide peripheral visual sensing in addition to "primary sensing." Such peripheral sensors may be used, for example, to image the area underneath a ground robot or outside close to the ground. Such sensors may be placed in the hands, feet, or legs of moving or walking robots. The low mass afforded by such sensors makes them particularly useful for air vehicles, including so-called "micro" air vehicles and "nano" air vehicles, the latter similar in size to an insect. A camera manufactured using the above teachings may be fabricated such that the image sensor and the optics together weigh no more than several milligrams.

To achieve an omnidirectional field of view, several of the above cameras may be used together, with their respective images stitched together using image stitching and image mosaicing algorithms. For example, two of the exemplary cameras 1401 of FIG. 14A may be used to obtain an omnidirectional image, with one camera looking in each direction. Both image sensors and their corresponding lenses may be mounted on opposite sides of a circuit board. Four linear profile cameras (for example camera 501 of FIG. 5A or camera 601 of FIG. 6A) may be likewise used, if they are mounted so that their respective fields of view cover the whole sphere field of view. This may be obtained by mounting the cameras on a regular tetrahedron shape. Likewise six such cameras may be mounted on a cube. If more cameras are desired, multiple cameras may be mounted on a flexible circuit board, in a manner taught by U.S. Patent Application No. 2008/0225420 entitled "Multiple Aperture Optical System" and incorporated by reference in its entirety. For example, an EyeStrip (FIG. 11 reference 1001 of the aforementioned U.S. patent application) may comprise an array of image sensors mounted to a flexible circuit board, with an optical structure placed onto each image sensor, with the optical structure constructed from a piece of transparent material and an opaque mask using any of the above teachings. Once this EyeStrip is fabricated, it may be bent to form an omnidirectional camera.

Other variations to the above exemplary embodiments may be considered. For example, in the exemplary multiple opening camera 601 of FIG. 6A and in variations of this camera, it was taught that the subimages produced by individual openings in the opaque mask 605 do not overlap on the pixel array 613. This makes it easier to isolate one subimage from another. To obtain a more compact sensor, it is possible to consider variations wherein the subimages do overlap. However this may require additional processing to isolate the subimages from each other. As such, this is a variation that would be appropriate in implementations where adequate processing power is available. Such a variation may be more suitable for linear implementations, for example in the exemplary linear camera 1501 of FIG. 15, due to the fewer number of pixels involved.

Another variation that may be made to the exemplary multiple opening camera 601 is to reduce both the size of the openings in the opaque mask 605 and the fill factor of the pixel circuits in the pixel array 613. For example, suppose the pixel pitch in pixel array 613 is 20 microns. The openings in the opaque mask 605 may be reduced to a size such as 4 microns square, and the light sensitive area of each pixel circuit may be reduced to a similar size. This will cause each pixel circuit in pixel array 613 to have a narrower field of view, such that adjacent pixels in a subimage may not overlap. The filled image e.g. "Z" computed above in Part G of the above exemplary algorithm may as a result be sharper. However a flat camera implemented with this approach will be less sensitive to light due to the smaller openings and smaller light sensing circuits. Also the effects of diffraction of light through the openings may become more significant. Furthermore the fractional pixel displacements of variables "ofm" and "ofn" may need to be computed beforehand, in a calibration step, and using a texture pattern that facilitates the measurement of these values.

Another variation that may be made to the exemplary multiple opening camera 601 or to the exemplary low profile linear camera 1501 is for the different openings to have different sizes. In this case, the resulting subimages will have varying intensities, with larger openings producing brighter images. The collection of subimages may then be used to produce an output image having a higher dynamic range than what is directly possible with the image sensor using a single opening size. The subimages produced from large openings may be used to image dim areas of the visual field while the subimages from small openings may be used to image bright areas of the visual field.

While the inventions have been described with reference to the certain illustrated embodiments, the words that have been used herein are words of description, rather than words of limitation. Changes may be made, within the purview of the appended claims, without departing from the scope and spirit of the invention in its aspects. Although the inventions have been described herein with reference to particular structures, acts, and materials, the invention is not to be limited to the particulars disclosed, but rather can be embodied in a wide variety of forms, some of which may be quite different from those of the disclosed embodiments, and extends to all equivalent structures, acts, and, materials, such as are within the scope of the appended claims.

We will now discuss methods of implementing a low profile camera, including optics and pixel sensing, within a single package, such as an integrated circuit. In the corresponding teachings below, cross sectional figures will be used to show the structure of exemplary low profile cameras. The thickness of the structures may be exaggerated for illustrative purposes. It will be understood that the thicknesses of the different layers, as well as ratios of widths to thicknesses, will depend on the specific implementation and the semiconductor process used and that the drawn dimensions shown in the following figures should not necessarily be taken in a literal manner.

Figure 23:
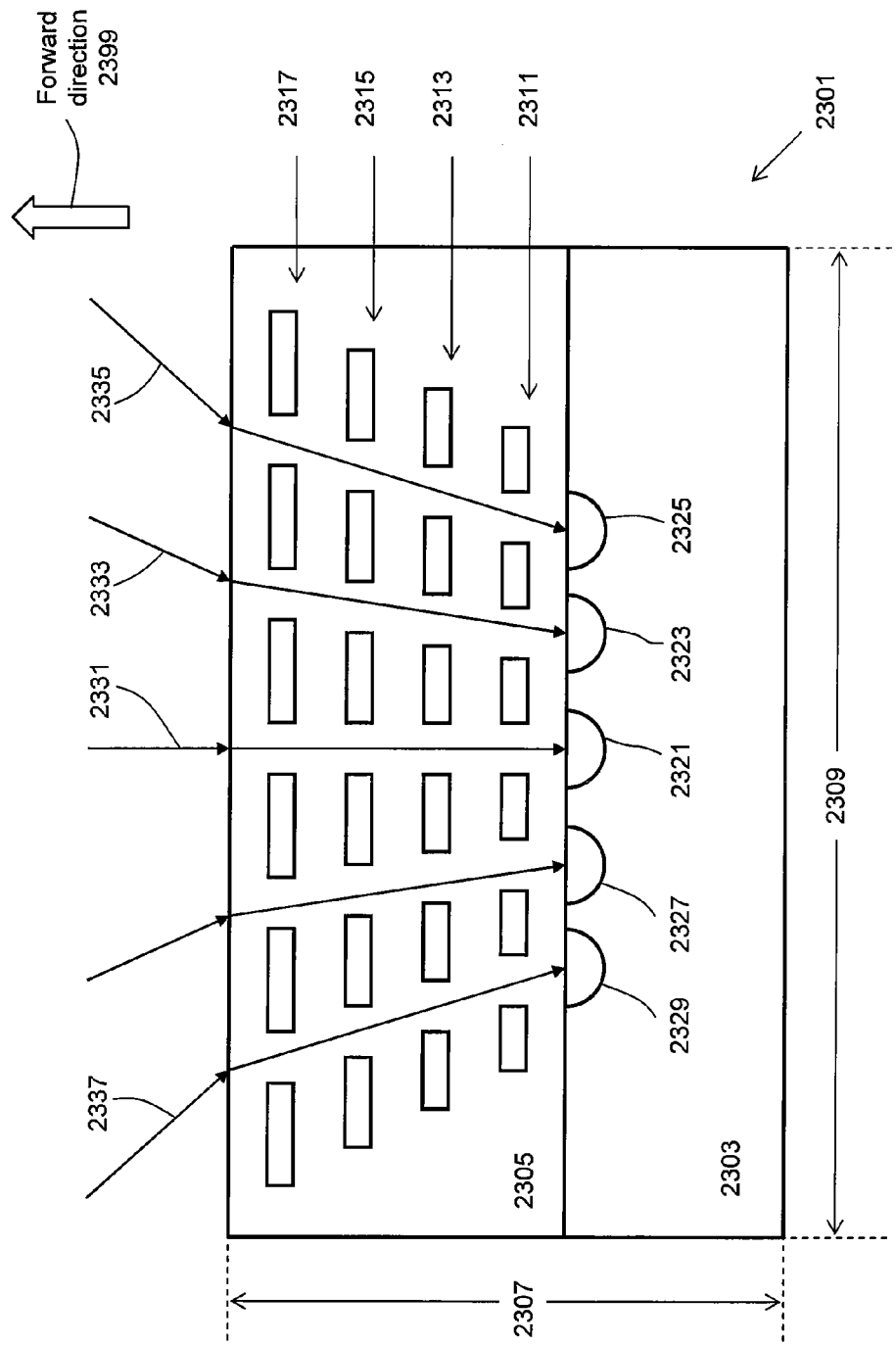
FIG. 23 depicts the cross section of a first exemplary monolithic low profile camera.

Refer to FIG. 23, which depicts the cross section of a first exemplary monolithic low profile camera 2301. Exemplary camera 2301 may be implemented in a standard integrated circuit process used to fabricate CMOS or CCD imagers or other analog or digital integrated circuits. Camera 2301 has a substrate layer 2303 and an oxide layer 2305. The substrate layer 2303 is the wafer substrate onto which circuits may be fabricated using standard integrated circuit manufacturing techniques. The oxide layer 2305 may be the oxide layer that is typically grown onto the wafer using the same manufacturing process. Typically such oxide layers contain polysilicon and metal routing layers allowing circuits on different parts of the chip to be electrically connected in a low resistance manner. In the case of silicon-based integrated circuits, the oxide layer may be $SiO_2$ or quartz, which is optically transparent at visible light wavelengths.

The thickness of the camera, e.g. dimension 2307, is greatly exaggerated relative to the width of the camera, e.g. dimension 2309, for purposes of illustration. In many semiconductor fabrication processes, the thickness 2307 may be on the order of a few tenths of a millimeter to about a millimeter, while the width 2309 depends on the cut size of a single chip and may be a similar value or may be substantially larger including several millimeters or even tens of millimeters. Likewise, the thickness of the oxide layer 2505 is exaggerated relative to the thickness of the substrate layer 2303 for illustrative purposes, and may be as thin as microns to tens of microns when fabricated using current semiconductor processes.

In the exemplary camera 2301 shown in FIG. 23, there are five light sensing regions (2321, 2323, 2325, 2327, 2329) fabricated in the substrate 2303. These light sensing regions may be formed using any light sensitive or pixel circuit typically used in semiconductor processes, for example but not limited to well-to-substrate PN junctions or diffusion-to-substrate PN junctions or any other applicable device. Pixel readout circuits (not shown) measure the current that flows through these light sensing regions as a result of light striking them and generates pixel signals that may be read out for any purpose. For purposes of discussion, the term "light sensing region" is used to refer to the areas of a circuit that directly respond to light. The term "pixel circuit" or just "pixel" may refer to a light sensing region and it may include any additional circuitry required to generate a signal that indicates light intensity, while the term "pixel signal" or "pixel value" may refer to the actual signal or value generated by the pixel circuit. It will be understood that more or fewer pixels may be made than the five pixels shown in FIG. 23.

In the exemplary embodiment, the oxide layer 2305 contains a set of metal layers, which are commonly used for routing in integrated circuits. In the exemplary camera 2301 shown, there are four metal layers 2311, 2313, 2315, and 2317. These metal layers have openings in them that are lined up so that light may enter the oxide layer 2305, pass through it and the four metal layers, and strike one of the light sensing regions. For example, light ray 2331 passes through openings in the four metal layers and reaches light sensing region 2321. The pixel signal associated with light sensing region 2321 is thus dependent on the intensity of ray 2331. Other light sensing regions may similarly be illuminated through a different set of openings as shown in the figure. For example light ray 2333 illuminates light sensing region 2323 and light ray 2335 illuminates light sensing region 2325. It will be understood that the term "light paths" may be used to refer to the paths taken by these light rays through their respective openings in the metal layers and to their respective light sensing regions.

For purposes of discussion, the four metal layers 2311, 2313, 2315, and 2317 may be described as substantially opaque, while the openings in these layers may be described as substantially transparent. Note however that opaqueness and transparency are relative terms: The four metal layers need not be perfectly opaque, and may let through a percent, ten percent, or some other fraction of light rather than completely blocking it. Similarly the openings in the four metal layers need not be perfectly transparent, and may attenuate the light passing through it by a percent, ten percent, or some other fraction. It will thus be understood that when an "opaque mask" or "opaque layer" is described as having an "opening", what is meant is that the amount of light that passes through the opening is substantially greater, per unit area, than the amount of light that passes through the opaque mask or layer. It may be similarly said that the opaque mask or layer attenuates light substantially more than the opening. This clarification of the terms "opaque mask", "opaque layer", and "transparent opening" applies throughout the entire teachings of this document. Note also, however, that it is beneficial for the opaque mask or layer to allow through as little light as possible, and for the opening to allow through as much light as possible.

In the exemplary camera 2301, the openings in the metal layers 2311, 2313, 2315, and 2317 are positioned so that each light sensing region is illuminated primarily through one path of openings. By positioning the openings in the appropriate positions, for example as shown in FIG. 23, it is possible to make each light sensing region sensitive to light coming from a different one direction. For example, light sensing region 2321 senses light primarily from the forward direction 2399, while light sensing region 2325 senses light from a direction to the right of forward and light sensing region 2329 senses light from a direction to the left of forward. In this manner, the exemplary camera 2301 may obtain a five pixel image of the environment. The geometry of the openings in the metal layers may be varied to alter the field of view of each resulting pixel so that adjacent pixels may have overlapping fields of view or nonoverlapping fields of view. For purposes of discussion, the "field of view" of a pixel is the set of directions from which the pixel primarily responds to light. In general, increasing the size of the openings and/or decreasing the distance between the outermost metal layer (e.g. metal layer 2317 in FIG. 23) and the light sensing regions on the substrate layer 2303 will increase the field of view of each pixel. Likewise horizontally shifting the locations of openings associated with a pixel so that the openings are lined up but the corresponding openings of two adjacent metal layers will be offset horizontally (for example as shown in FIG. 23 for pixels 2323, 2325, 2327, and 2329) causes the field of view of the pixel to be correspondingly pointed in a direction other than forward.

Figure 4:
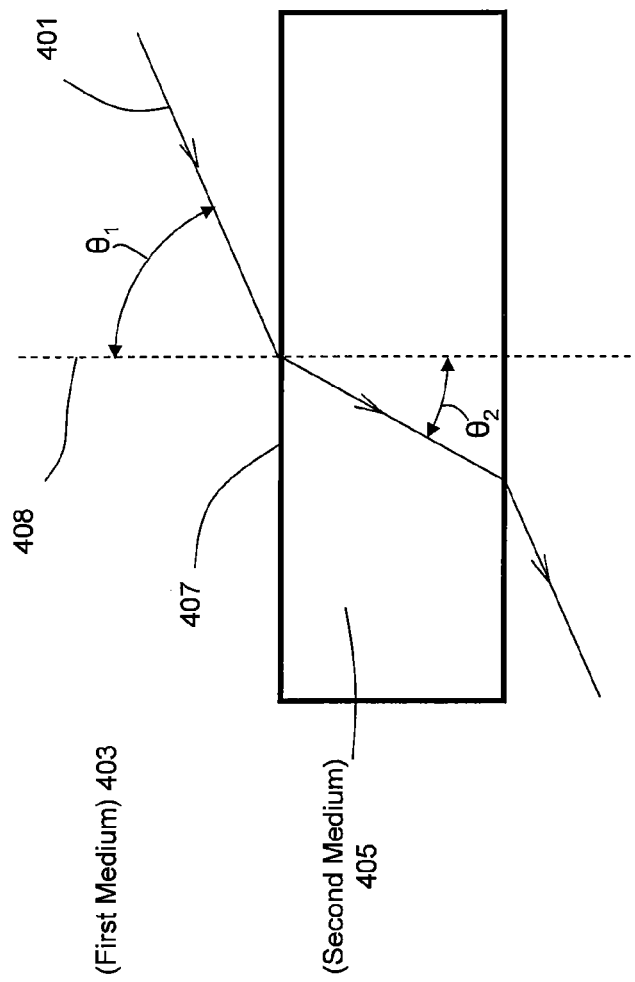
FIG. 4 illustrates Snell's Law.

Note that the oxide layer 2305 may have a different index of refraction than the surrounding environment, thus light may be refracted as it crosses into the oxide layer 2305 in accordance with Snell's law, as described in FIG. 4. Therefore, if the index of refraction of the oxide layer 2305 is greater than that of the surrounding environment, it is possible to design a low profile camera like that shown in FIG. 23 to have a field of view approaching 180 degrees.

Figure 24:
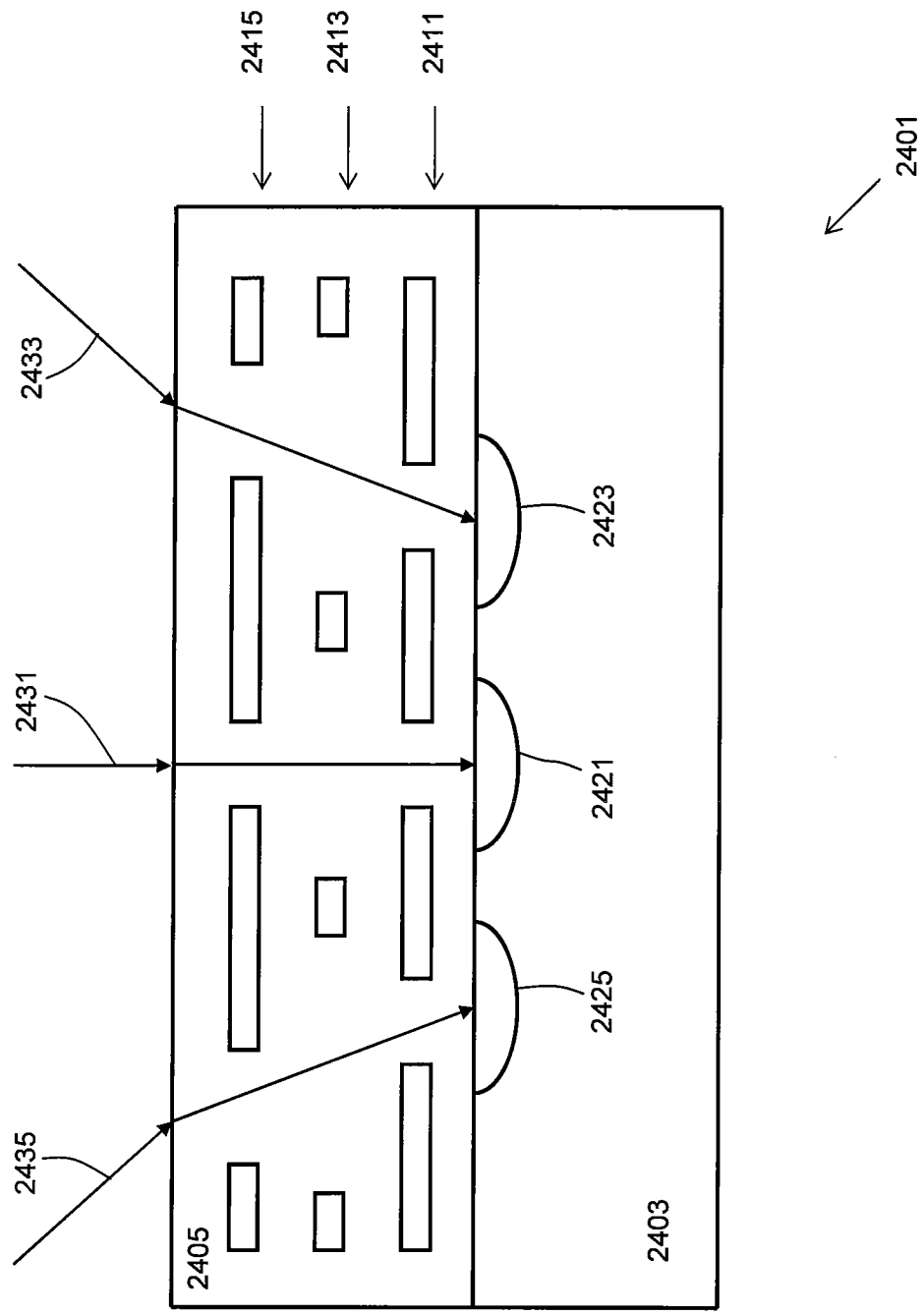
FIG. 24 depicts the cross section of a second exemplary monolithic low profile camera.

Refer to FIG. 24, which shows the cross section of a second exemplary monolithic low profile camera 2401. Exemplary camera 2401 is similar to exemplary camera 2301 in that it may be fabricated in an integrated circuit having a substrate layer 2403 and an oxide layer 2405. Exemplary camera 2401, as shown in FIG. 24, has three metal layers 2411, 2413, and 2415 in the oxide layer 2405 and three light sensing regions 2421, 2423, and 2425 in the substrate layer 2403. Therefore camera 2401 as shown has a resolution of three pixels. It will be understood that more or fewer pixels may be made than the three pixels shown in FIG. 24. Exemplary camera 2401 is similar to exemplary camera 2301 in that openings in the metal layers are used to determine the field of view of each pixel. For example light sensing region 2421 responds to light ray 2431 and is thus sensitive primarily in the forward direction, while light sensing region 2423 responds to light ray 2433 and is thus sensitive primarily in the right direction. The difference is that in the case of FIG. 24 the middle layer 2413 has larger openings than layers 2411 or 2415. In this case the fields of view of the pixels are determined by the two layers 2411 and 2415. Layers 2411 and 2415 may be referred to as "constricting layers" since they may be used to constrict the field of view of each pixel to a desired value. Rather than containing larger openings, the layers in between, e.g., layer 2413 in the case of FIG. 24, may be used for other purposes such as signal routing. The metal layers between the two constricting layers may be referred to as "middle layers". It is beneficial for these middle layers to be arranged to prevent interference between adjacent or nearby pixels by blocking light. The openings in the lower constricting layer may be less wide than the light sensing regions, as shown in FIG. 24. This enables the fields of view of the individual pixels to be further narrowed, which may thus be used to increase the resolving capabilities of the camera 2401. Designing the openings in the middle layers to be wider than the openings in the constricting layers may have the advantage of limiting the amount of light that reflects off the sides of openings in the middle layers. Such reflected light may originate from directions outside the pixel's intended field of view and thus be considered spurious.

Figure 25:
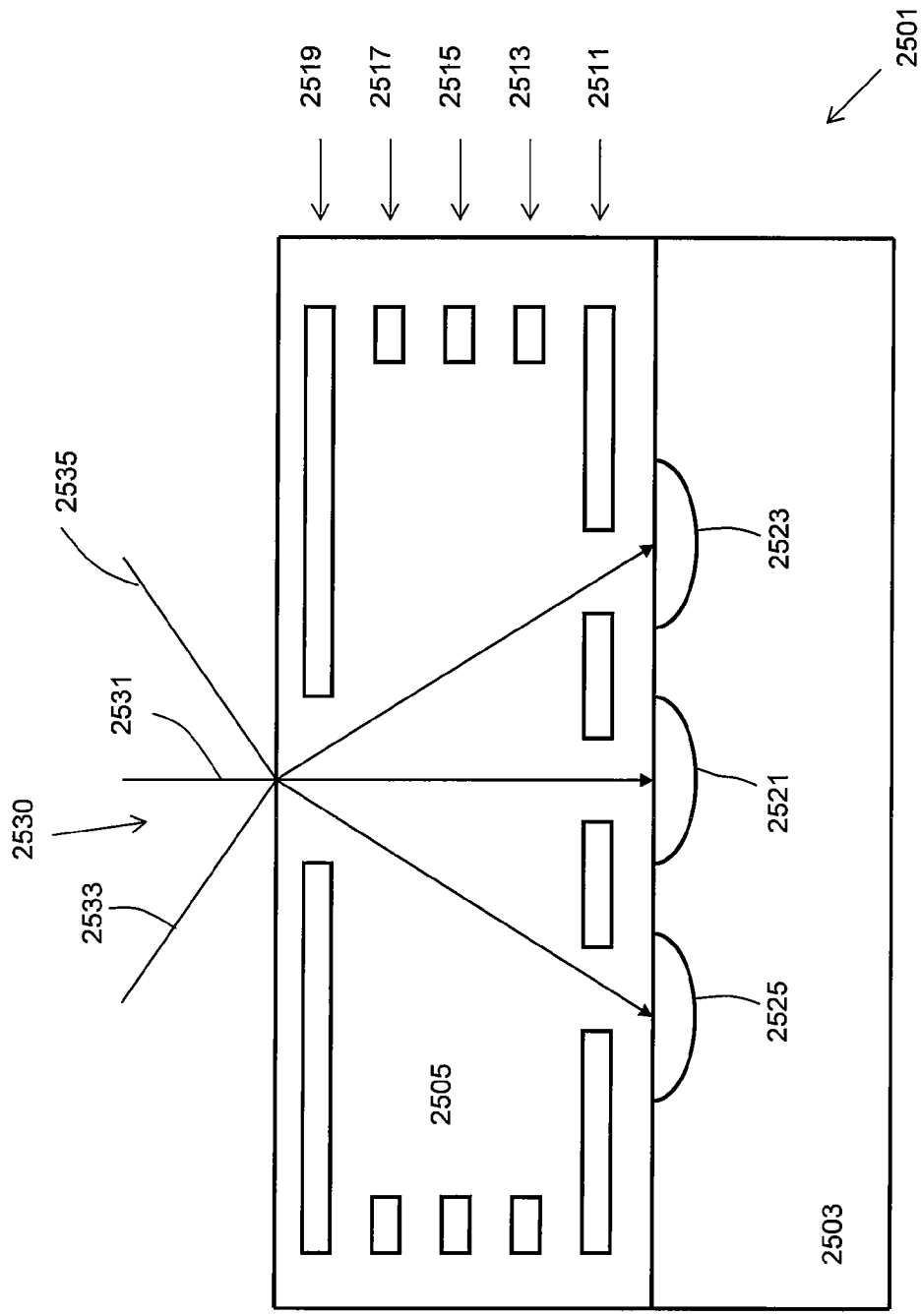
FIG. 25 depicts the cross section of a third exemplary monolithic low profile camera.

Refer to FIG. 25, which depicts the cross section of a third exemplary monolithic low profile camera 2501. Camera 2501 is a combination of the exemplary flat camera 501 of FIGS. 5A and 5B and the camera of FIGS. 23 and 24. Exemplary camera 2501 has three light sensing regions 2521, 2523, and 2525 in a substrate layer 2503 and five metal layers 2511, 2513, 2515, 2517, and 2519 in an oxide layer 2505. Therefore camera 2501 as shown has a resolution of three pixels. It will be understood that more or fewer pixels may be made than the three pixels shown in FIG. 25. In exemplary camera 2501, the topmost metal layer 2519 has a opening 2530 through which light can pass. Opening 2530 is analogous to opening 509 in FIG. 5A. Layer 2511 has a opening for each light sensing region. In this manner, each light sensing region senses light from one direction. For example, light sensing region 2521 may be illuminated by light ray 2531 and thus is responsive to the forward direction, while light sensing region 2523 may be illuminated by ray 2533 and thus is responsive in a direction left of forward. The openings in layers 2511 and 2519 may be shaped and positioned to determine the fields of view of the individual light sensing regions of the camera 2501. Note that due to Snell's law, camera 2501, like cameras 2401 and 2301, may be designed to have a total field of view approaching 180 degrees if the index of refraction of the oxide 2505 is larger than that of the surrounding environment.

It will be apparent to the reader that a variation of this camera may be made by using only the topmost metal layer 2519. Metal layers 2511, 2513, 2515, and 2517 are optional and may be removed. In this case, camera 2501 would be similar to camera 501 of FIGS. 5A and 5B except that metal layer 2519 serves the function of opaque mask 507, opening 2530 corresponds to opening 509, the oxide layer 2505 serves as a piece of transparent material 505, and the metal layer 2519 is fabricated inside the oxide layer 2505 rather than on top of it. Depending on the application and in order to prevent light from leaking in through the side, such a camera may benefit from additional opaque material (not shown) deposited on top of the integrated circuit to serve a similar light blocking function as opaque material 517 of FIG. 5A, or the camera may benefit from a case similar to case 568 of FIG. 5F, or the camera may benefit from an opaque encapsulating material similar to material 581 of FIG. 5G.

Figure 26:
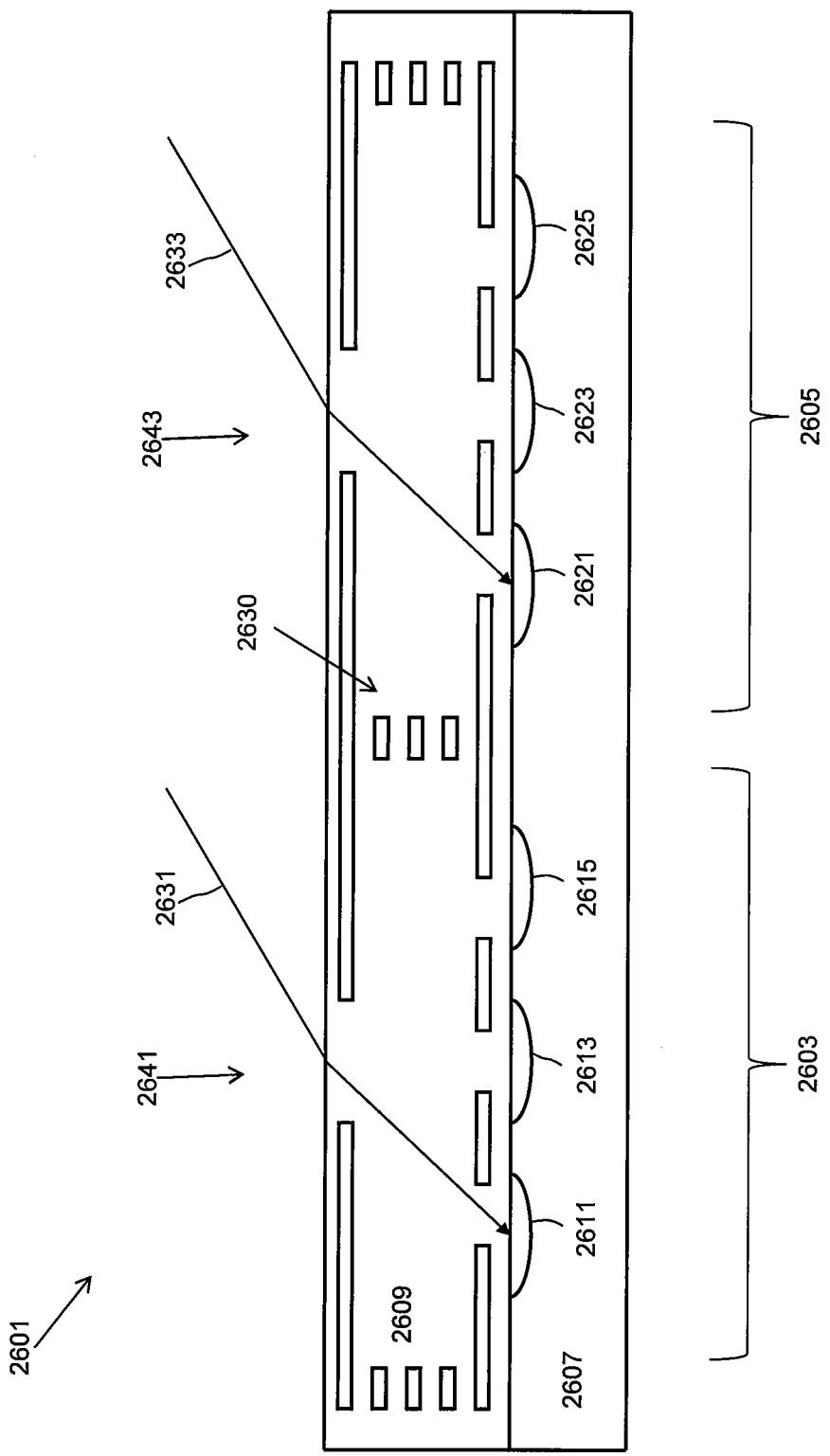
FIG. 26 depicts the cross section of a camera formed from an array of the exemplary cameras of FIG. 25.

Refer to FIG. 26, which depicts the cross section of a camera 2601 formed from an array of the exemplary cameras of FIG. 25. Exemplary camera 2601, as shown in FIG. 26, has two subcameras 2603 and 2605. Each of the subcameras 2603 and 2605 may be constructed in the same manner as exemplary camera 2501 of FIG. 25 with light sensing regions in the substrate layer 2607 and metal layers in the oxide layer 2609. It will be understood that exemplary camera 2601 may be constructed with an array of more than two subcameras. The reader will note the similarity between exemplary camera 2601 of FIG. 26 and camera 601 of FIGS. 6A and 6B and the TOMBO camera 301 of FIG. 3. For example, the topmost metal layer serves as the opaque mask 605, the oxide layer serves as the transparent material 607, and openings 2641 and 2643 correspond to openings in the opaque mask 605. Optional structures in the middle metal layers (e.g. 2630) between the constricting layers may be used to help optically isolate adjacent subcameras and may be beneficial if there is significant reflection of light off the bottom restricting layer. Otherwise the adjacent subcameras may be spaced far enough apart to achieve optical isolation using Snell's law in a manner similar to that shown in FIG. 6C. The pixel values grabbed by the light sensing regions of each subcamera forms a subimage analogous to the subimages 621, 622, 623, and 624. The basic structure of exemplary camera 2601 may be combined with the above teachings to implement a variety of different but related cameras. These variations shall be described next:

In a first variation, each of the subcameras (e.g. subcameras 2603, 2605, and any others that may be added) may be constructed substantially identical, a characteristic that may be readily obtained using modern semiconductor fabrication processes. The resulting subimages therefore form a light field image. Therefore exemplary camera 2601 may be used to form a light field camera as described above. Likewise, exemplary camera 2601 may be used as a range sensor by measuring subpixel displacements between the subimages produced by different subcameras, also as described above.

In a second variation, corresponding light sensing regions of the different subcameras may be electrically connected in a manner depicted in FIG. 11. For example, light sensing region 2611 may be electrically connected with light sensing region 2621 since these light sensing regions are responsive to light from substantially the same direction, e.g. from respective light rays 2631 and 2633. This allows charge or current from more photons to be collected, and thus can be used to increase the light sensitivity of the camera 2601 and therefore achieve a lower effective f-stop in the same manner as described above.

In a third variation, the different subcameras (e.g. 2603, 2605, and any other subcameras that may be included) may be substantially identical except that the positions of the openings 2641 and 2643 in the top and/or bottom metal layers may be shifted slightly to implement spatial dithering as shown in FIG. 7B. For example, suppose the pitch between adjacent light sensing regions is 10 microns. Then hole 2643 may be shifted left or right by 5 microns to achieve an effective spatial dithering of a half pixel. Each of the resulting subimages obtained from the subcameras may then be displaced from each other by subpixel amounts. A high resolution image may then be reconstructed using the techniques taught in FIGS. 8A, 8B, 9A, 9B, and 10 and described above. This algorithm would run on a processor (not shown) that is connected to the camera 2601.

Above the camera 2601 was taught as being constructed by forming an array of cameras constructed using the principles shown in FIG. 25. It will be understood that instead of the camera 2501 of FIG. 25, the camera structures 2301 of FIG. 23 and 2401 of FIG. 24 may instead be used. The three variations and their benefits discussed in the above three paragraphs would still be applicable if camera 2601 were formed from an array of cameras 2301 or 2401 instead of camera 2501.

Figure 2:
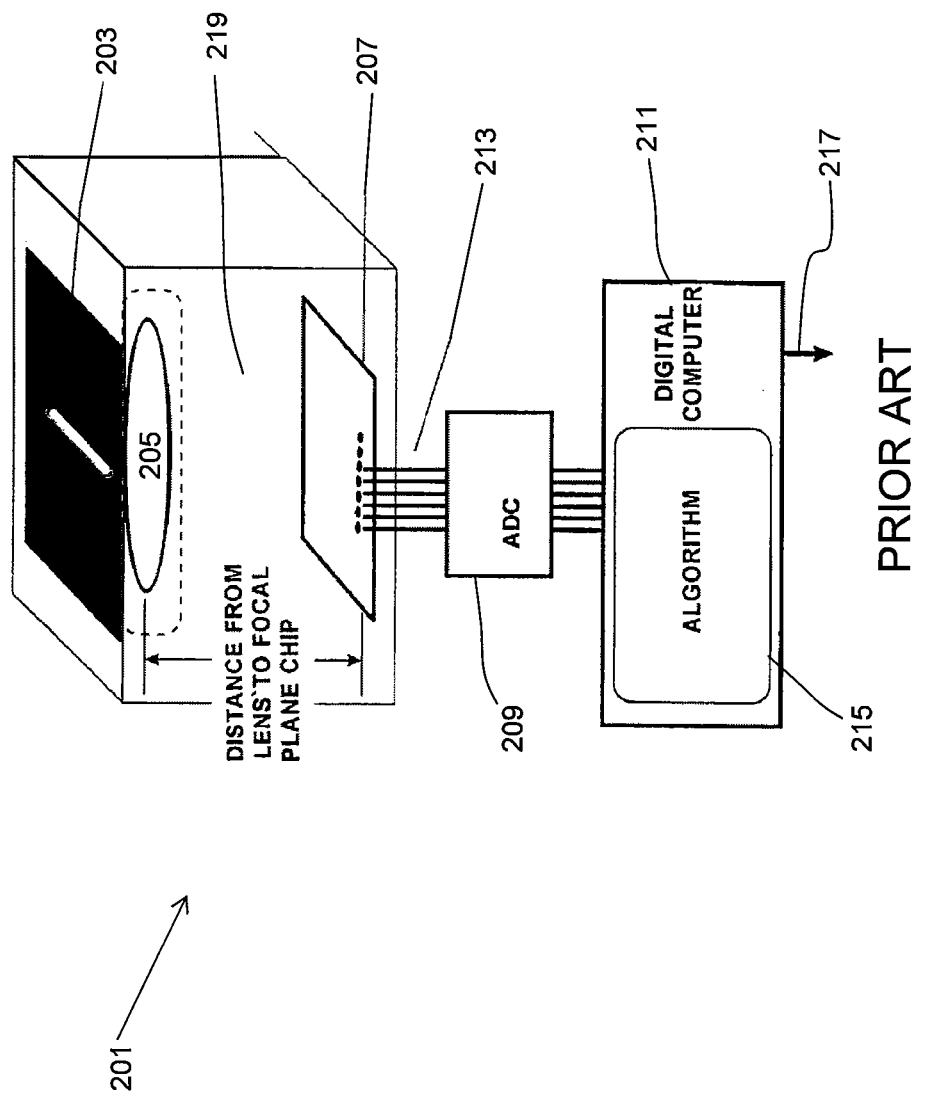
FIG. 2 depicts a prior art camera optimized for sensing visual motion or optical flow in one direction.

FIGS. 23, 24, 25, and 26 above all depict cross sectional views of exemplary low profile cameras. It will be understood that the above teachings may be used to form both one-dimensional and two-dimensional cameras. One dimensional versions may be made by using FIGS. 23, 24, 25, and 26 as a guide to the cross section of the cameras to be fabricated. In this case, the light sensing regions and the openings in the metal layers may be shaped like elongated rectangles to increase light sensitivity and/or preserve sensitivity to texture along a preferred axis. This may be performed using the methods taught in FIGS. 2, 15, 18, and/or 19 as desired. Likewise, two dimensional versions of the above exemplary monolithic cameras may be fabricated by applying the above teachings in two dimensions. For example, the five pixel array of FIG. 23 may be replaced by a five-by-five pixel array, and metal layers 2311, 2313, 2315, and 2317 may each have a five-by-five array of openings arranged so that each pixel looks in a different direction.

Another variation to any of the above cameras may be made to increase the effective resolution. As discussed above, the field of view of each pixel may be determined by the shape and placement of the openings in the metal layers located in the oxide layer. This includes controlling the width of the field of view as well the angle between the center of the field of view and the forward direction e.g. 2399. An advantage of using multiple layers of metal, for example the four layers 2311, 2313, 2315, and 2317 in FIG. 23, the two constricting layers 2411 and 2415 of FIG. 24, or the two constricting layers 2511 and 2519 in FIG. 25, is that the field of view of each pixel may be controlled according to the manufacturing tolerances of the metal layers. It is also possible to fabricate an array of pixels having overlapping fields of view. For example, suppose camera 2401 were fabricated such that the openings in metal layers 2411 and 2415 were each one micron wide. Pixel 2421 may be fabricated so that the field of view is directly forward as shown in FIG. 24. For this pixel the openings are directly on top of each other as shown in FIG. 24. Pixel 2423 may be fabricated to have a field of view that is slightly to the right of pixel 2421, for example by having the opening in the upper layer be, for example, 0.2 microns to the right of the opening in the lower layer. Further pixels to the right (not shown) may be fabricated with shifts of 0.4 microns, 0.6 microns, and so on. The fields of view of these pixels would substantially overlap. Therefore the image acquired would appear to have significant blurring. However a deblurring algorithm or an image restoration algorithm, such as the Lucy-Richardson deblurring algorithm mentioned above and implemented with the MATLAB function "deconvlucy", may be used to remove the blur and reconstruct a higher resolution image. This algorithm may run on a processor (not shown) connected to the camera.

The exemplary cameras of FIGS. 23, 24, 25, and 26 may also be combined with the other above teachings. For example, a lens or prism may be placed on top of these exemplary cameras to widen their field of view beyond 180 degrees, as shown in FIG. 5D and discussed above.

Figure 27:
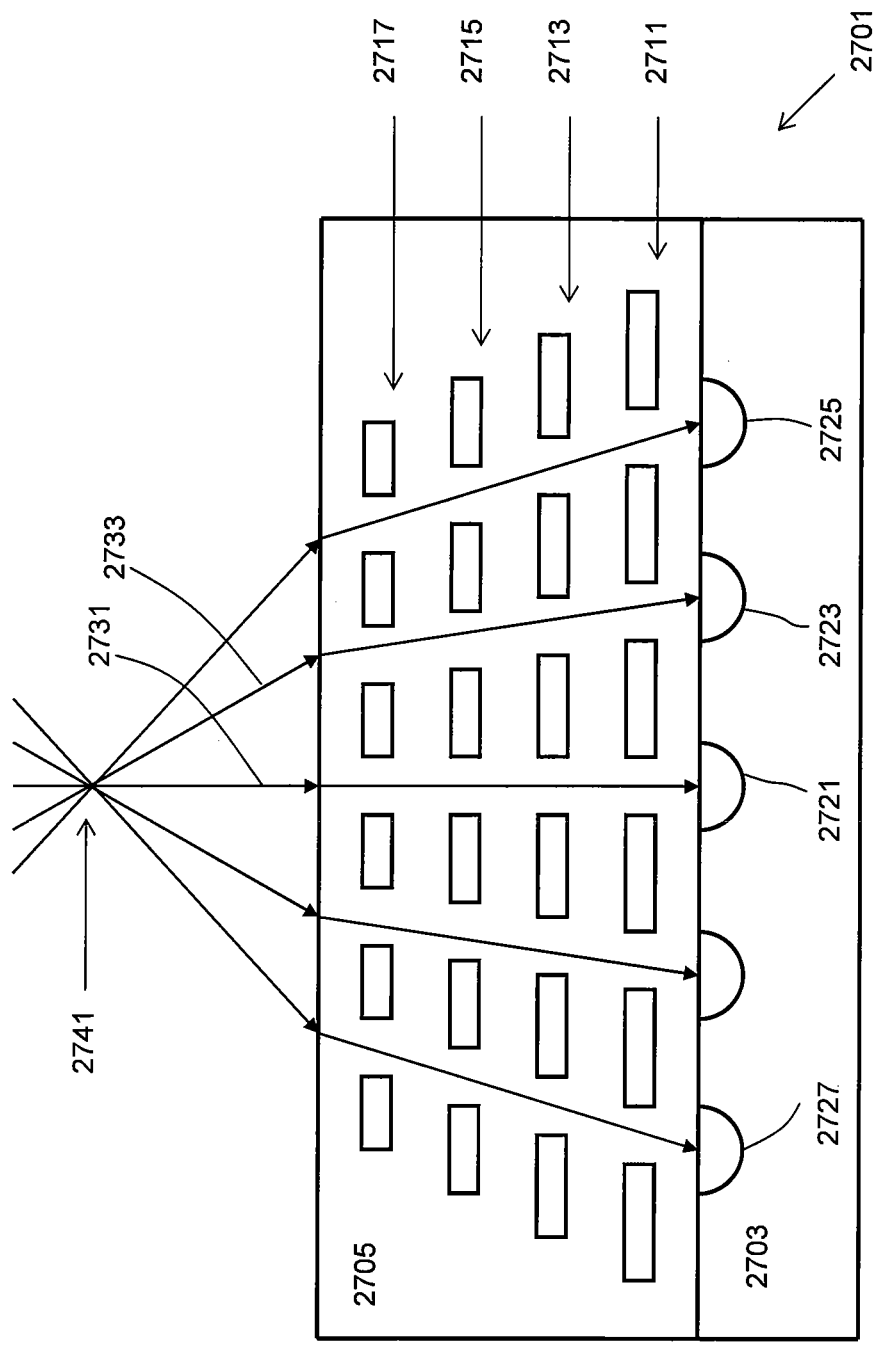
FIG. 27 depicts the cross section of an exemplary monolithic low profile camera whose pixels have converging fields of view.

Refer to FIG. 27, which depicts the cross section of an exemplary monolithic low profile camera 2701 whose pixels have converging fields of view. Exemplary camera 2701 has a substrate layer 2703 with light sensing regions and an oxide layer 2705 with metal layers 2711, 2713, 2715, and 2717. Exemplary camera 2701 may be constructed in the same manner as exemplary camera 2301 except for the locations of the openings in the metal layers 2711, 2713, 2715, and 2717, which are arranged so that the fields of view of the individual pixels substantially converge at point 2741. It may be similarly said that the light paths associated with these pixels and their respective openings converge at point 2741. Camera 2701 has the benefit that a small object placed approximately at point 2741 may be imaged from different angles simultaneously. At larger distances, the image produced by camera 2701 is similar to the image produced by camera 2301 but flipped.

Figure 28:
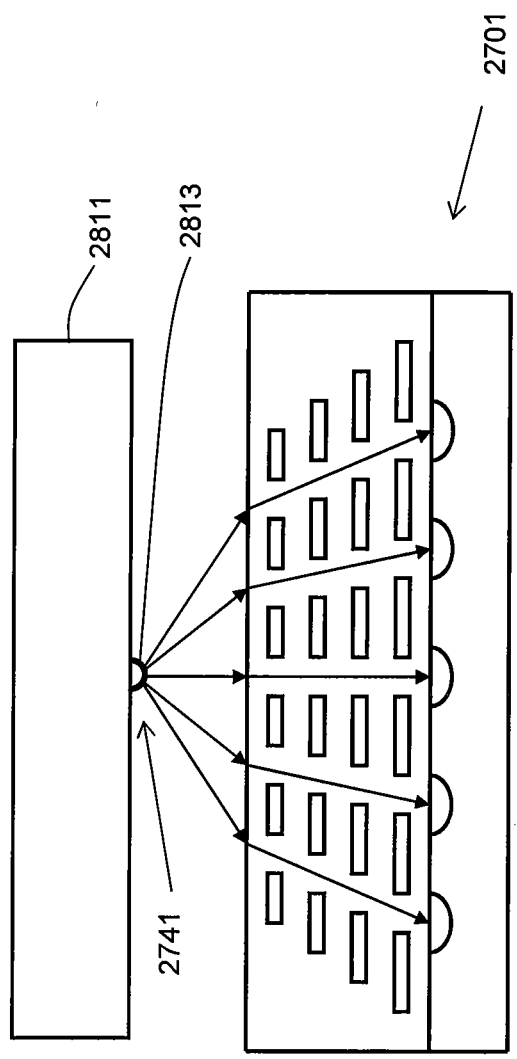
FIG. 28 shows how the exemplary monolithic low profile camera of FIG. 27 may be used to form a position sensor.

Refer to FIG. 28, which shows how the exemplary monolithic low profile camera 2701 of FIG. 27 may be used to form a position sensor. An object 2811 may have a light emitting diode 2813 or other light emitting or bright object on it. When the light emitting diode is at point 2741, all pixels will be illuminated. In this manner, the camera 2701 may be used to detect when object 2811 is in a desired location by detecting when all pixels are illuminated. If the object 2811 is in a different location, then some of the pixels may still be illuminated which may help guide the position of the object 2811 to a desired location.

It will be understood that since the above teachings may be implemented on an integrated circuit, the exemplary cameras taught in FIGS. 23 to 28 may be implemented on an integrated circuit containing other standard digital components such as a processor core or an FPGA (field programmable gate array) core. Such an integrated circuit having both such digital circuitry and the above camera structures may be used to implement an extremely compact machine vision system in a single chip, without the need for additional optics. Such a chip may comprise, for example, any of the exemplary cameras of FIGS. 23 to 28, analog to digital conversion circuitry, a processor core and/or an FPGA core, memory circuitry including non-volatile or flash memory circuitry, oscillator circuitry, interface circuitry, and any other required circuitry that may be desired for a given application.

Consider now another variation of the above teachings of FIGS. 23 to 28. In these figures, it was taught that metal layers may be fabricated in an oxide layer of an integrated circuit, with these oxide layers performing the same function as the opaque masks taught above. Instead of fabricating metal layers in a transparent oxide, it is possible to form the above layers using photomasks printed on transparent material as taught above in FIGS. 5A through 19. In this case, a stack of optical structures, each optical structure comprising a flat piece of transparent material and an opaque mask deposited onto it, may be used to achieve the same optical functions as shown in FIGS. 23 to 28. This variation would allow the exemplary cameras of FIGS. 23 to 28 to be implemented with a wide variety of already manufactured image sensors, but would require careful stacking of the optical structures to ensure that the opaque mask openings line up.

A number of additional uses for the above teachings will now be described. The low profile afforded by camera systems and machine vision systems implemented using these teachings can allow them to be used in new applications not typically associated with camera systems. For purposes of discussion, a "camera system" may be any of the exemplary embodiments discussed above, including but not limited to FIGS. 1-3, 5A, 5D, 6A, 12-15, 18, 21G, and 22-27, and in particular when the optical structure and image sensing circuitry are connected to a processor.

Such camera systems are appropriate for use in traffic monitoring systems. One or more of such sensors may be installed in an area to detect vehicles moving by, based on the generated optical flow or even changes in measured pixel intensity. When multiple such camera systems are installed, and their outputs collectively monitored, it may be possible to obtain the three dimensional position and direction of motion of such vehicles. This principle may be applied to the monitoring of airborne or ground vehicles, and may be applied to the monitoring of other moving objects such as people. Such a system may, in fact, be incorporated in a security system.

Figures 29, 30:
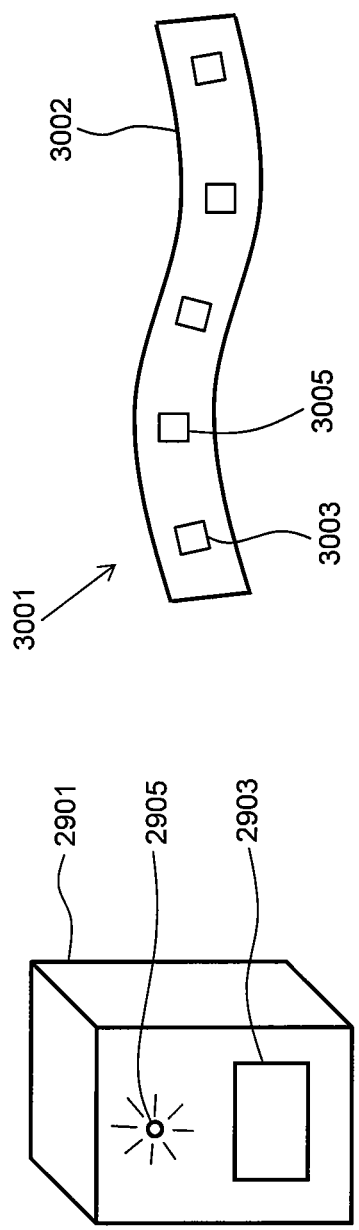
FIG. 29 shows an exemplary product package outfitted with a low profile camera.
FIG. 30 depicts an exemplary vision sensing skin.

Another use of such camera systems is in product packaging. Refer to FIG. 29, which shows an exemplary product package 2901 outfitted with a low profile camera 2903. This product package may hold any retail or other package that a consumer might desire, and may sit on a shelf in a store. A processor (not shown) may be configured to detect people moving by the product, perhaps by measuring the optical flow as a result of the person walking by. The processor may be connected to an LED (light emitting diode) 2905 or other device. When the processor detects a person moving by, the processor may flash the LED to get the attention of the person moving by, perhaps to encourage the person to buy the product. Rather than an LED, the processor may instead trigger a sound in a speaker embedded with the package (not shown) or even trigger a motor or other electromechanical device to cause something to move, again to attract the attention of the person. Such a camera system may be fabricated using just tens of pixels, in particular if the pixels have a rectangular field of view for example by using the exemplary structure of FIG. 15. The processor may be embedded in the same integrated circuit that contains the pixel circuitry, thus reducing system cost. The integrated circuit may also include optical structures such as that shown in FIGS. 23-26. Thus one may implement the optics, image sensing, and processing in one monolithic integrated circuit which may then be connected to a battery and the LED or other device.

The aforementioned teachings may also be used to implement a vision sensor skin. Refer to FIG. 30, which depicts an exemplary vision sensing skin 3001. Sensing skin 3001 comprises a flexible substrate 3002 and a set of camera systems including camera system 3003 and camera system 3005 and others shown. Each camera system may comprise an image sensor and an optical structure constructed using the aforementioned techniques. These camera systems may be connected together via circuitry in the flexible substrate. A processor may be connected to the same flexible substrate 3002 or may reside on a circuit board to which the sensing skin 3001 is connected. LEDs (not shown) may be added to provide illumination. This sensing skin may then be wrapped around an underlying structure. Image processing algorithms in the processor may then visually perceive the environment and detect objects moving around the underlying structure. Similarly, the sensing skin may be mounted on a robotic arm and used to visually monitor anything in proximity to the robotic arm. As the robotic arm moves around, the camera systems in the vision sensing skin may detect if the robot is about to collide with objects in the environment. Alternatively, the sensing skin may be used to allow the robot to interact with people in the immediate vicinity.

The vision sensor skin system may be modified to provide an artistic device by adding LEDs to the sensor skin and configured to light up in a pattern in response to visual motion. For example, if a person moves their hand near the sensing skin, the LEDs may light up in a pattern that responds to the person's hand motion. Individual LEDs may be illuminated simultaneously or according to a sequence, including a sequence computed based on the perceived visual environment, depending on the desired artistic effect. This may be used as an artistic display or otherwise allow the person to interact with the object. The vision sensor skin may additionally or alternatively be configured to operate another bank of panel of LEDs located separate from the vision sensor skin, so that the motion of a person can be used to control the lighting of LEDs in this second panel.

Another variation of the teachings is to embed a camera system into clothing. For example, a single camera system may be mounted in the button of an article of clothing, or a vision sensing skin such as that shown in FIG. 30 may be sewn into the fabric of an article of clothing. A processor may then grab and process imagery from the camera systems to detect other objects in the environment, whether by visual motion or by other image processing techniques. The processor may then light up LEDs also sewn into the article of clothing, in a manner based on the visual information detected by the camera systems and the clothing. By this method, an interactive article of clothing may be fabricated. The low profile of the camera systems fabricated using the aforementioned techniques would allow them to be embedded within the clothing and almost invisible to the casual observer, if not completely invisible.

Figure 31:
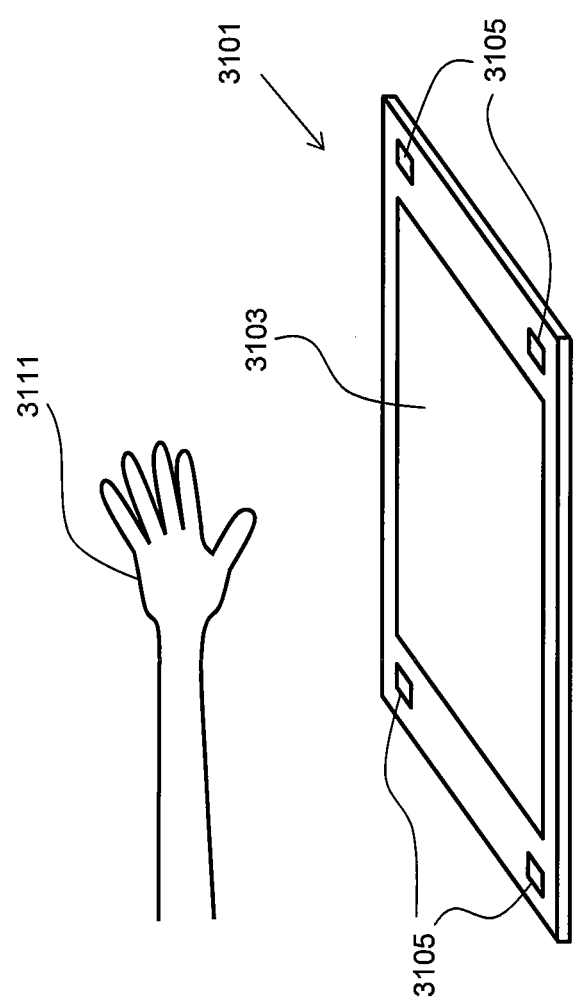
FIG. 31 depicts an exemplary interactive display using embedded camera systems.

Another variation is to utilize one or more camera systems into an interactive display. Refer to FIG. 31, which depicts an exemplary interactive display 3101 using embedded camera systems. Exemplary interactive display 3101 comprises a display 3103 and four embedded cameras 3105. The cameras 3105 may be connected to a processor (not shown) which monitors the area above the display 3103. This information may be used to change what is displayed on the display 3103. For example, if a hand 3111 moves in front of the display, the processor may interpret the hand motion, or even hand gestures, and use that as a means of obtaining human input. The use of multiple camera systems may allow the three dimensional position of the hand to be monitored in real time using stereo and/or triangulation and/or other algorithms. This exemplary interactive display 3101 may provide functionality similar to but substantially more sophisticated than that realizable by an "optical mouse" device. Such an interactive display may be used as the basis of an interactive display such as that depicted in the science fiction movie "The Minority Report". Variations of this basic concept are possible. For example the camera systems may be embedded within the display 3103 rather than in the periphery.

Figure 32:
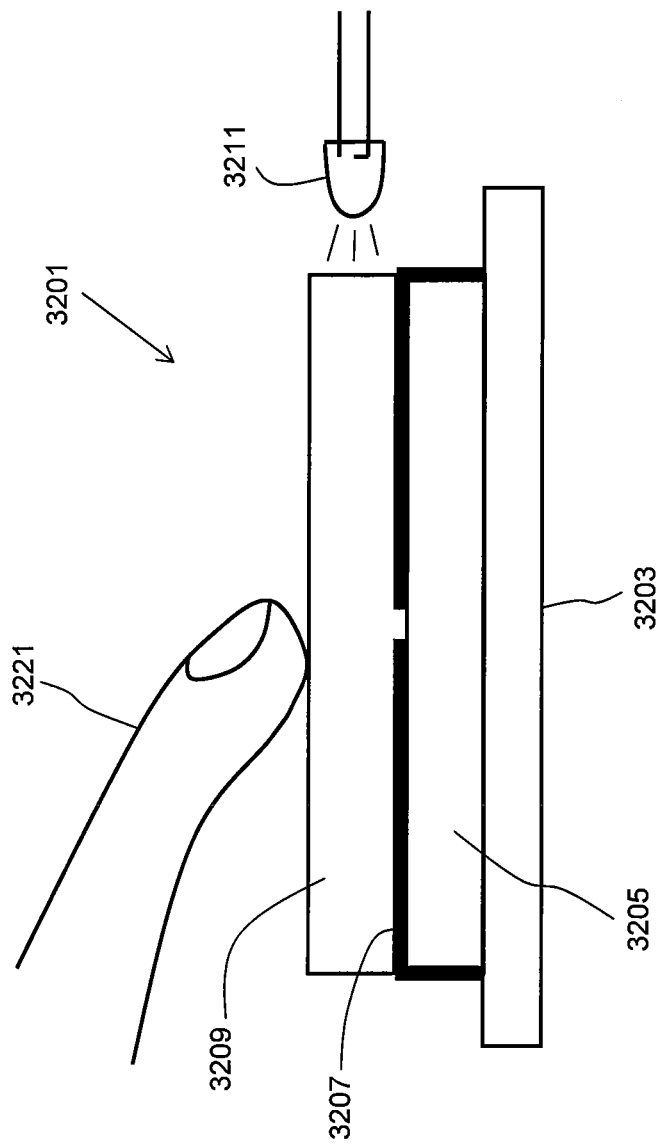
FIG. 32 shows an exemplary optical mouse input device.

Low profile camera systems, as discussed in the aforementioned teachings, may thus be used as a human input device to a computer. One or more of such camera systems may be used as a video game controller. A single camera system may be used as a replacement for an optical mouse. Refer to FIG. 32, which shows an exemplary optical mouse input device 3201 using the aforementioned teachings. The exemplary optical mouse input device 3201 comprises an image sensor chip 3203, a first piece of transparent material 3205, an opaque mask 3207 with a pinhole, a second piece of transparent material 3209, an LED 3211, and a processor (not shown). Image sensor chip 3203, opaque mask 3207, and the two pieces of transparent material 3205 and 3209 may be constructed in a manner similar to that of the exemplary cameras shown in FIG. 5C or 5E, except that the opaque material covers only the first piece of transparent material 3205. LED 3211 illuminates the second piece of transparent material 3209 from the side. The processor acquires the image obtained by the image sensor chip 3203, and may be configured to measure visual motion or optical flow. A human may then place a finger 3221 on the optical mouse device 3201 and slide the finger around. The measured optical flow may then be used in the same manner as the mouse motion signal of any standard personal computer. Alternatively the two pieces of transparent material 3205 and 3209 may be formed from a single piece, with the opaque mask 3207 embedded within. Other variations of this optical mouse device may be fabricated using the teachings of FIGS. 23-28, in particular FIG. 25.

What is claimed is:

1. A camera, comprising:
at least one light sensitive region formed in a substrate;
substantially transparent material disposed on the substrate over the at least one light sensitive region;
a first substantially opaque mask layer disposed in the substantially transparent material and covering the at least one light sensitive region;
a second substantially opaque mask layer disposed in the substantially transparent material over the first substantially opaque mask layer;
at least one first opening formed in the first substantially opaque mask layer; and
at least one second opening formed in the second substantially opaque mask layer,
wherein,
the at least one first opening and the at least one second opening are substantially transparent to light, and
a light sensitive region of the at least one light sensitive region is configured to sense light transmitted through the at least one first opening and the at least one second opening in accordance with the alignment of the at least one first opening and the at least one second opening.

2. The camera according to claim 1, wherein the substantially transparent material has an index of refraction greater than one.

3. The camera according to claim 2, wherein the substantially transparent material is a semiconductor oxide.

4. The camera according to claim 1, wherein the first substantially opaque mask layer and the second substantially opaque mask layer are formed from metal.

5. The camera according to claim 1, wherein the substrate, the substantially transparent material, the first substantially opaque mask layer, and the second substantially opaque mask layer form a monolithic integrated circuit.

6. The camera according to claim 5, wherein the at least one light sensitive region, the first substantially opaque mask layer, and the second substantially opaque mask layer are formed using a photolithography manufacturing process.

7. The camera according to claim 1, further comprising a processor capable of receiving at least one signal from the at least one light sensitive region.

8. The camera according to claim 7, further comprising a plurality of light sensitive regions formed in the substrate, the plurality of light sensitive regions including the at least one light sensitive region, wherein:
the processor is capable of receiving a plurality of signals from the plurality of light sensitive regions, the plurality of signals including the at least one signal, and
the processor is capable of generating an output based on the plurality of signals.

9. The camera according to claim 8, wherein:
each light sensitive region of the plurality of light sensitive regions corresponds to a pixel that is configured to output a pixel signal.

10. The camera according to claim 8, wherein the output corresponds to a measurement of visual motion.

11. The camera according to claim 7, wherein the processor is capable of generating an image based on the at least one signal.

12. The camera according to claim 1, further comprising:
   a plurality of first openings formed in the first substantially opaque mask layer, the plurality of first openings including the at least one first opening, and
   a plurality of light sensitive regions formed in the substrate, the plurality of light sensitive regions including the at least one light sensitive region.

13. The camera according to claim 12, further comprising a first light sensitive region and a second light sensitive region included in the plurality of light sensitive regions, wherein:
   the first light sensitive region is configured to sense light transmitted through a first set of openings in accordance with an alignment of the first set of openings,
   the second light sensitive region is configured to sense light transmitted through a second set of openings in accordance with an alignment of the second set of openings, and
   the first set of openings and the second set of openings comprise openings included in the plurality of first openings.

14. The camera according to claim 13, wherein the first set of openings are different from the second set of openings.

15. The camera according to claim 13, wherein the first set of openings and the second set of openings comprise an opening that is common to both the first set of openings and the second set of openings.

16. The camera according to claim 15, wherein the opening that is common to both the first set of openings and the second set of openings is included in the at least one second opening.

17. The camera according to claim 13, wherein each the first set of openings and the second set of openings are aligned relative to a forward direction.

18. The camera according to claim 17, wherein the first set of openings are aligned in the forward direction.

19. The camera according to claim 17, wherein the second set of openings are aligned at an angle relative to the forward direction.

20. The camera according to claim 13, wherein:
   the alignment of the first set of openings is configured for light at a first predetermined direction, and
   the alignment of the second set of openings is configured for light at a second predetermined direction.

21. The camera according to claim 20, wherein the alignment of the first set of openings and the alignment of the second set of openings are configured such that the light path corresponding to the first predetermined direction and the light path corresponding to the second predetermined direction converge at a point relative to the forward direction beyond the second substantially opaque mask layer.

22. The camera according to claim 20, wherein the alignment of the first set of openings and the alignment of the second set of openings are configured such that the light path corresponding to the first predetermined direction and the light path corresponding to the second predetermined direction diverge relative to the forward direction beyond the second substantially opaque mask layer.

23. The camera according to claim 1, further comprising:
   a third substantially opaque mask layer disposed in the substantially transparent material over the first substantially opaque mask layer; and
   at least one third opening formed in the third substantially opaque mask layer, wherein:
      the at least one third opening is substantially transparent to light; and
      the light sensitive region of the at least one light sensitive region is configured to sense light transmitted through the at least one first opening, the at least one second opening, and the at least one third opening in accordance with the alignment of the at least one first opening, the at least one second opening, and the at least one third opening.

24. A camera, comprising:
   a pixel array comprising a plurality of pixels formed in a substrate;
   substantially transparent material disposed on the substrate over the plurality of pixels;
   a first substantially opaque mask layer disposed in the substantially transparent material and covering the plurality of pixels;
   a second substantially opaque mask layer disposed in the substantially transparent material over the first substantially opaque mask layer; and
   a plurality of sets of openings formed in the first substantially opaque mask layer and the second substantially opaque mask layer,
   wherein,
      the plurality of sets of openings are substantially transparent to light, and
      the plurality of pixels are each configured with a field of view to light transmitted through a corresponding set of openings of the plurality of sets of openings in accordance with an alignment of the set of openings.

25. The camera according to claim 24, wherein the substantially transparent material has an index of refraction greater than one.

26. The camera according to claim 25, wherein the substantially transparent material is a semiconductor oxide.

27. The camera according to claim 24, wherein the first substantially opaque mask layer and the second substantially opaque mask layer are formed from metal.

28. The camera according to claim 24, wherein the substrate, the substantially transparent material, the first substantially opaque mask layer, and the second substantially opaque mask layer form a monolithic integrated circuit.

29. The camera according to claim 24, wherein the at least one light sensitive region, the first substantially opaque mask layer, and the second substantially opaque mask layer are formed using a photolithography manufacturing process.

30. The camera according to claim 24, further comprising a processor capable of receiving a plurality of signals from the plurality of pixels.

31. The camera according to claim 30, wherein the processor is capable of generating an output based on the plurality of signals.

32. The camera according to claim 31, wherein the output corresponds to a measurement of visual motion.

33. The camera according to claim 30, wherein the processor is capable of generating an image based on the plurality of signals.

34. The camera according to claim 24, further comprising a first pixel and a second pixel included in the plurality of pixels, wherein
   the first pixel is configured with a first field of view to light transmitted through a first set of openings of the plurality of sets of openings in accordance with an alignment of the first set of openings, and
   the second pixel is configured with a second field of view to light transmitted through a second set of openings of the plurality of sets of openings in accordance with an alignment of the second set of openings.

35. The camera according to claim 34, wherein the first field of view is different from the second field of view.

36. The camera according to claim 34, wherein the first field of view is the same as the second field of view.

37. The camera according to claim 34, wherein the first pixel is adjacent to the second pixel.

38. The camera according to claim 37, wherein the first field of view overlaps with the second field of view.

39. The camera according to claim 37, wherein the first field of view does not overlap with the second field of view.

40. The camera according to claim 34, wherein the first set of openings are different from the second set of openings.

41. The camera according to claim 34, wherein the first substantially opaque layer comprises a first opening and a second opening, the first opening included in the first set of openings and the second opening included in the second set of openings.

42. The camera according to claim 34, wherein the second substantially opaque layer comprises an opening that is common to both the first set of openings and the second set of openings.

43. The camera according to claim 34, wherein:
the alignment of the first set of openings is configured for light at a first predetermined direction, and
the alignment of the second set of openings is configured for light at a second predetermined direction.

44. The camera according to claim 43, wherein the alignment of the first set of openings and the alignment of the second set of openings are configured such that the light path corresponding to the first predetermined direction and the light path corresponding to the second predetermined direction converge at a point relative to the forward direction beyond the second substantially opaque mask layer.

45. The camera according to claim 43, wherein the alignment of the first set of openings and the alignment of the second set of openings are configured such that the light path corresponding to the first predetermined direction and the light path corresponding to the second predetermined direction diverge relative to the forward direction beyond the second substantially opaque mask layer.

46. The camera according to claim 24, wherein each of the plurality of sets of openings are aligned relative to a forward direction.

47. The camera according to claim 46, wherein a set of openings of the plurality of sets of openings comprises a first opening formed in the first substantially opaque mask layer and a second opening formed in the second substantially transparent mask layer.

48. The camera according to claim 47, wherein the first opening and the second opening are aligned in the forward direction.

49. The camera according to claim 47, wherein the first opening and the second opening are aligned an angle relative to the forward direction.

50. The camera according to claim 47, wherein the first opening is offset in a horizontal direction relative to the second opening.

51. The camera according to claim 24, further comprising:
a third substantially opaque mask layer disposed in the substantially transparent material over the first substantially opaque mask layer; and
at least one third opening formed in the third substantially opaque mask layer, wherein:
the at least one third opening is substantially transparent to light, and
the plurality of pixels are each configured with a field of view to light transmitted through a corresponding set of openings including openings from the plurality of sets of openings and the at least one third opening in accordance with the alignment the set of openings.

52. A camera configured for a predetermined environment, comprising:
a plurality of pixels that is configured to sense light from the predetermined environment and generate a plurality of pixel signals based on the light;
a substantially transparent material disposed on the plurality of pixels;
a substantially opaque mask disposed in the substantially transparent material and above the plurality of pixels and having an opening through which the plurality of pixels sense the light, wherein:
the plurality of pixels, the substantially transparent material, and the substantially opaque mask are formed in a monolithic integrated circuit;
the plurality of pixels and the substantially opaque mask are formed using a photolithography process; and
the substantially transparent material has an index of refraction greater than one.

53. The camera according to claim 52, where the perimeter of the opening has a polygonal shape.

54. The camera according to claim 52, wherein the perimeter of the opening has an elongated shape.

55. The camera according to claim 52, further comprising a plurality of openings, the plurality of openings including the opening, wherein each opening of the plurality of openings is positioned relative to a respective portion of the plurality of pixels that senses light through the corresponding opening.

56. The camera according to claim 55, wherein each opening of the plurality of openings is spaced apart from an adjacent opening of the plurality of openings such that light sensed for a respective opening does not substantially overlap with light sensed from the adjacent opening.

57. The camera according to claim 55, wherein the plurality of openings comprise a plurality of shapes or sizes.

58. The camera according to claim 55, further comprising a processor capable of acquiring a plurality of subimages based on the plurality of pixel signals, wherein each subimage corresponds to an opening of the plurality of openings.

59. The camera according to claim 58, wherein the processor is capable of generating an image based on the plurality of subimages.

60. The camera according to claim 58, wherein the processor is capable of generating a light field image based on the plurality of subimages.

61. The camera according to claim 58, wherein the processor is capable of generating range information based on the plurality of subimages.

* * * * *